(12) United States Patent
Yang et al.

(10) Patent No.: US 11,930,639 B2
(45) Date of Patent: Mar. 12, 2024

(54) THREE-DIMENSIONAL SEMICONDUCTOR MEMORY DEVICE AND METHOD OF FABRICATING THE SAME

(71) Applicant: Samsung Electronics Co., Ltd., Suwon-si (KR)

(72) Inventors: Woosung Yang, Gwangmyeong-si (KR); Dong-Sik Lee, Hwaseong-si (KR); Sung-Min Hwang, Hwaseong-si (KR); Joon-Sung Lim, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/706,426

(22) Filed: Mar. 28, 2022

(65) Prior Publication Data
US 2022/0223619 A1    Jul. 14, 2022

Related U.S. Application Data

(62) Division of application No. 16/777,776, filed on Jan. 30, 2020, now Pat. No. 11,289,504.

(30) Foreign Application Priority Data

Jun. 25, 2019 (KR) .......................... 10-2019-0075814

(51) Int. Cl.
*H01L 23/522*    (2006.01)
*H01L 21/28*     (2006.01)
(Continued)

(52) U.S. Cl.
CPC ......... *H10B 43/27* (2023.02); *H01L 23/5226* (2013.01); *H01L 23/528* (2013.01);
(Continued)

(58) Field of Classification Search
CPC ......... H01L 23/5226; H01L 29/430114; H01L 29/40117; H01L 29/66545; H01L 29/792;
(Continued)

(56) References Cited

U.S. PATENT DOCUMENTS 6,596,640 B1 * 7/2003 Fishcer ............... H01L 21/3212
                                                    438/692
9,666,289 B2    5/2017 Lee et al.
(Continued)

FOREIGN PATENT DOCUMENTS

KR    10-2017-0019541 A    2/2017
KR    10-2019-0020876 A    3/2019

*Primary Examiner* — Galina G Yushina
(74) *Attorney, Agent, or Firm* — Muir Patent Law, PLLC

(57) ABSTRACT

A three-dimensional semiconductor memory device may include horizontal patterns disposed on a peripheral circuit structure and spaced apart from each other, memory structures provided on the horizontal patterns, respectively, each of the memory structures including a three-dimensional arrangement of memory cells. Penetrating insulating patterns and separation structures may isolate the horizontal patterns from one another. Through vias may extend through the penetrating insulating patterns to connect logic circuits of the peripheral circuit structure to the memory structure.

18 Claims, 49 Drawing Sheets

(51) Int. Cl.
  *H01L 23/528* (2006.01)
  *H01L 29/66* (2006.01)
  *H10B 41/10* (2023.01)
  *H10B 41/27* (2023.01)
  *H10B 41/40* (2023.01)
  *H10B 43/10* (2023.01)
  *H10B 43/27* (2023.01)
  *H10B 43/40* (2023.01)

(52) U.S. Cl.
  CPC .. *H01L 29/40114* (2019.08); *H01L 29/40117* (2019.08); *H01L 29/66545* (2013.01); *H10B 41/10* (2023.02); *H10B 41/27* (2023.02); *H10B 41/40* (2023.02); *H10B 43/10* (2023.02); *H10B 43/40* (2023.02)

(58) Field of Classification Search
  CPC ........ H10B 41/10; H10B 41/27; H10B 41/40; H10B 43/10; H10B 43/40; H10B 41/50; H10B 43/50; H10B 41/00; H10B 41/20; H10B 41/30; H10B 43/35
  See application file for complete search history.

(56) References Cited

U.S. PATENT DOCUMENTS

| | | |
|---|---|---|
| 9,721,663 B1 | 8/2017 | Ogawa et al. |
| 9,818,759 B2 | 11/2017 | Kai et al. |
| 9,953,992 B1 | 4/2018 | Ogawa et al. |
| 2010/0032808 A1 | 2/2010 | Ding et al. |
| 2016/0071877 A1 | 3/2016 | Kim et al. |
| 2016/0079259 A1* | 3/2016 | Son ............... H10B 43/27 257/401 |
| 2016/0163635 A1* | 6/2016 | Yun ............... H01L 23/3192 257/659 |
| 2018/0102364 A1* | 4/2018 | Rastogi ............ H01L 29/4966 |
| 2018/0268902 A1* | 9/2018 | Tanaka ............ H10B 43/35 |
| 2018/0277499 A1 | 9/2018 | Oshiki |
| 2018/0366386 A1 | 12/2018 | Petz et al. |
| 2019/0057898 A1* | 2/2019 | Shim ............... H10B 43/50 |
| 2022/0028731 A1* | 1/2022 | Shim ............... H10B 43/50 |

* cited by examiner

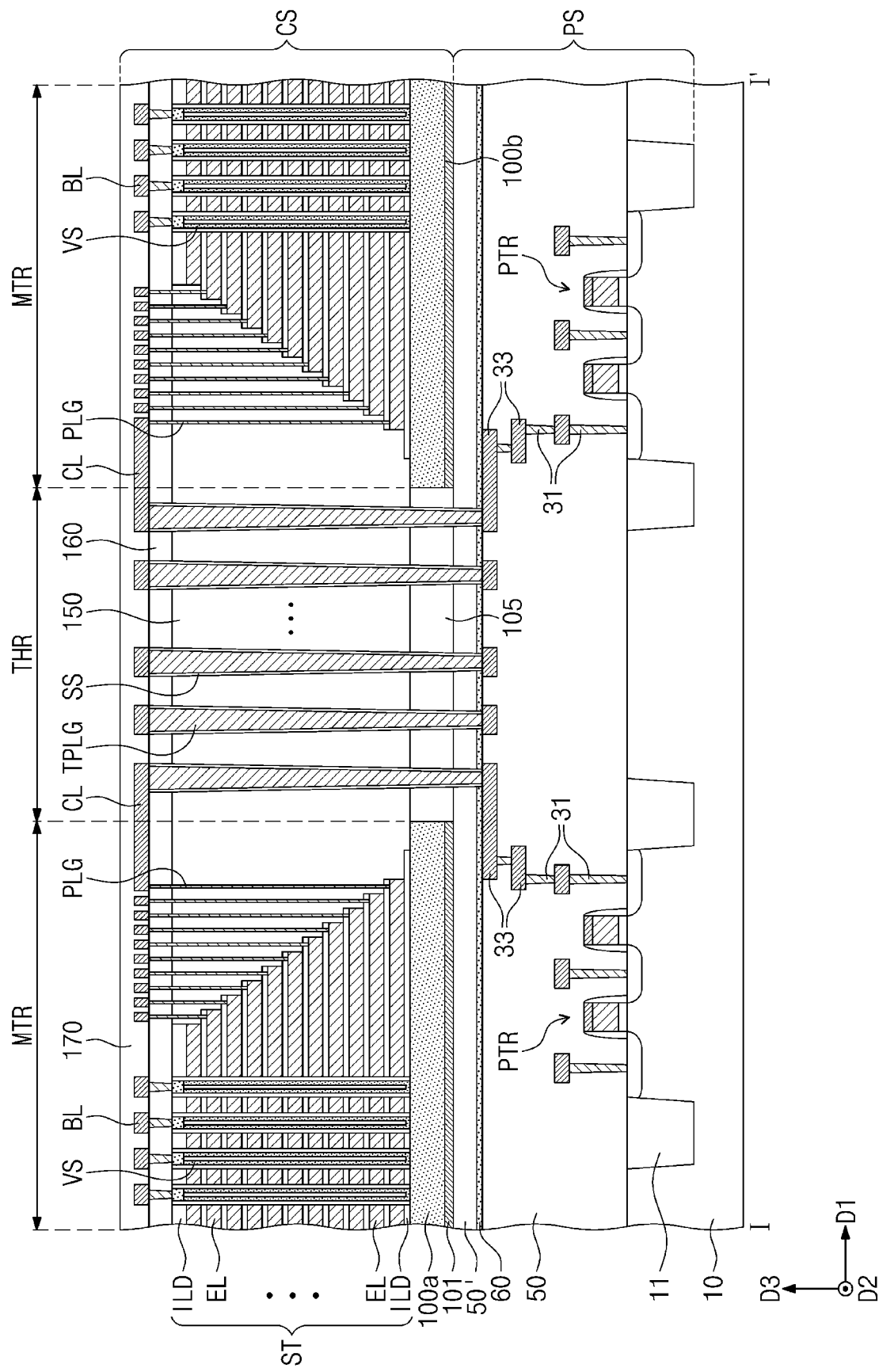

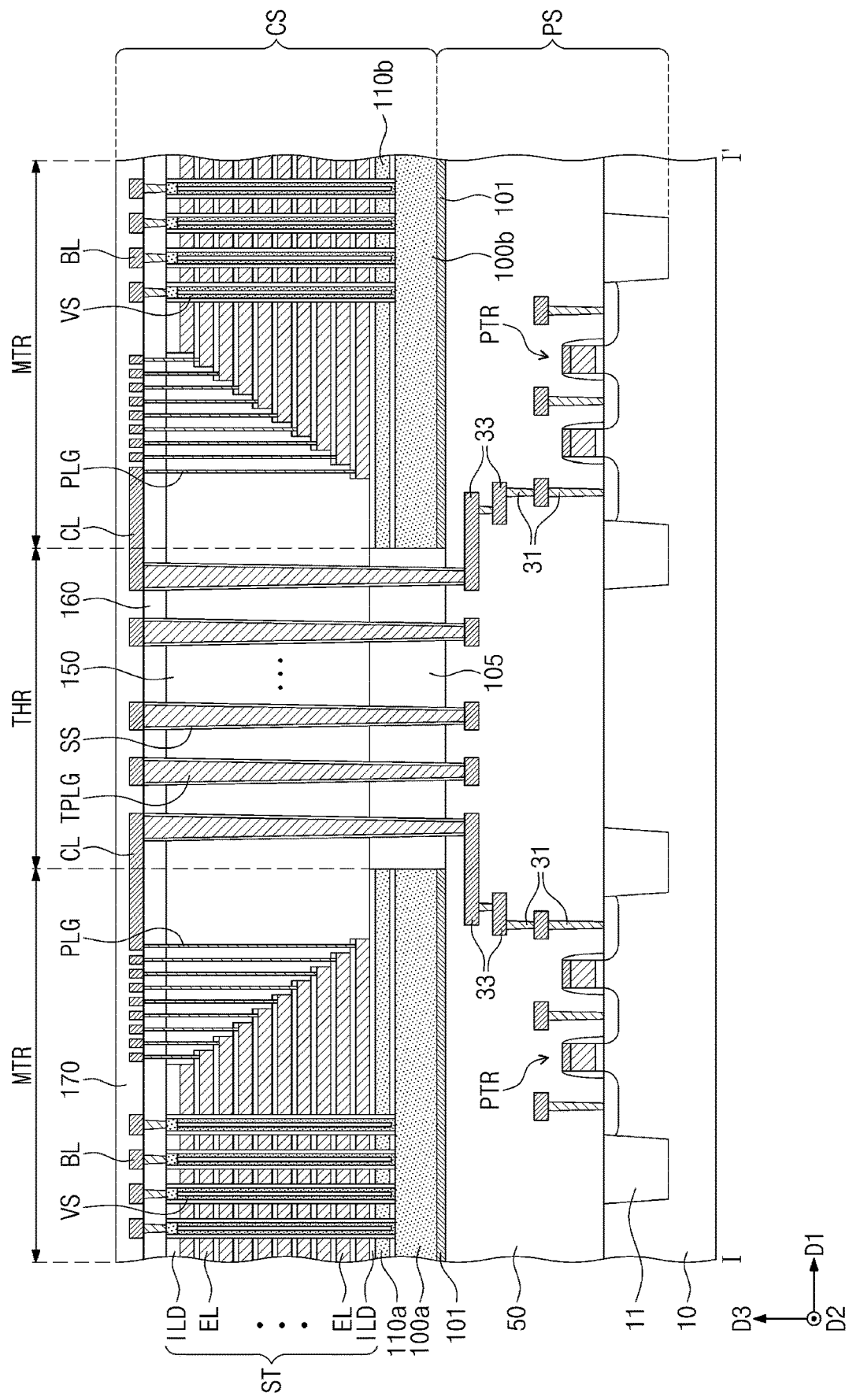

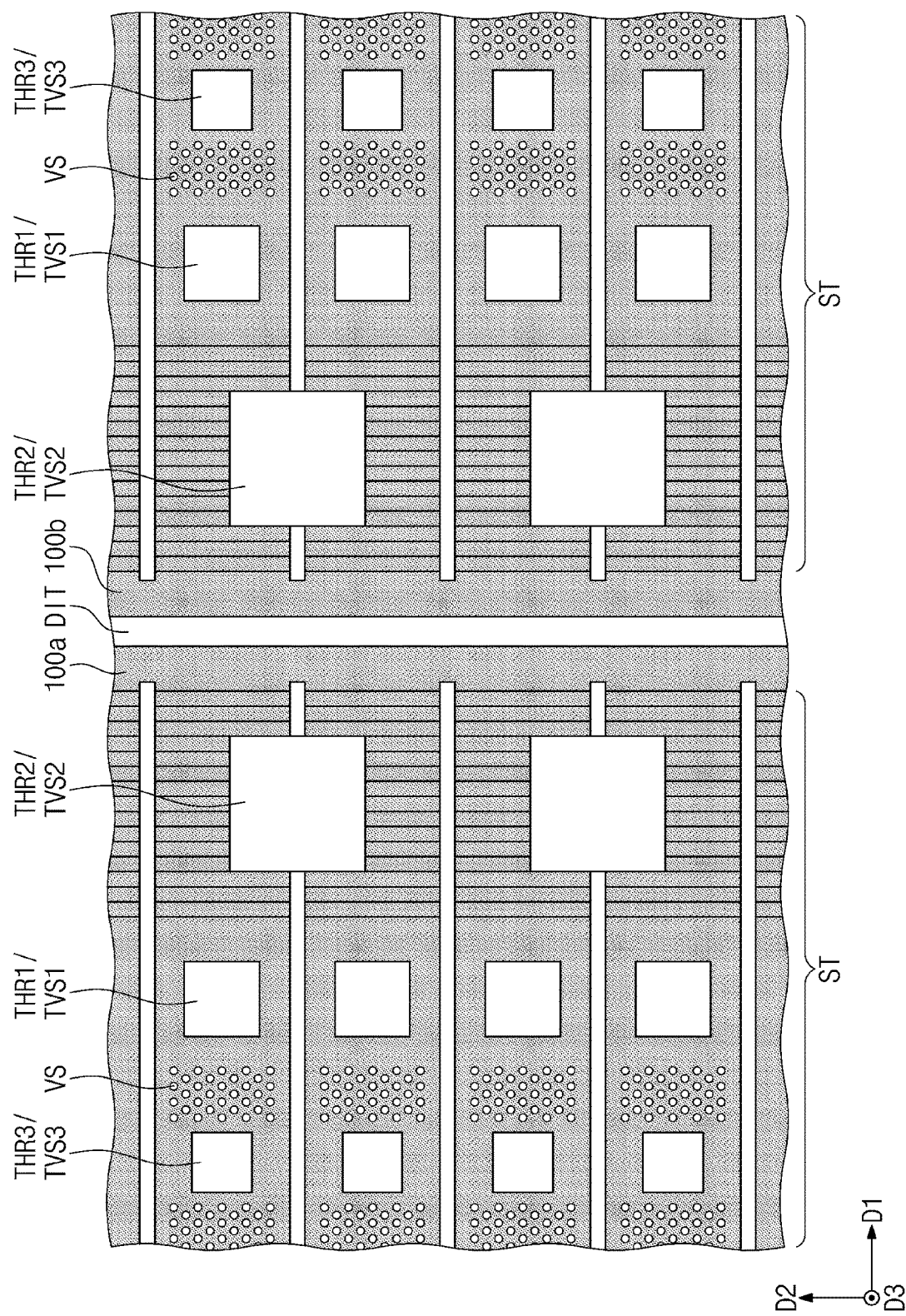

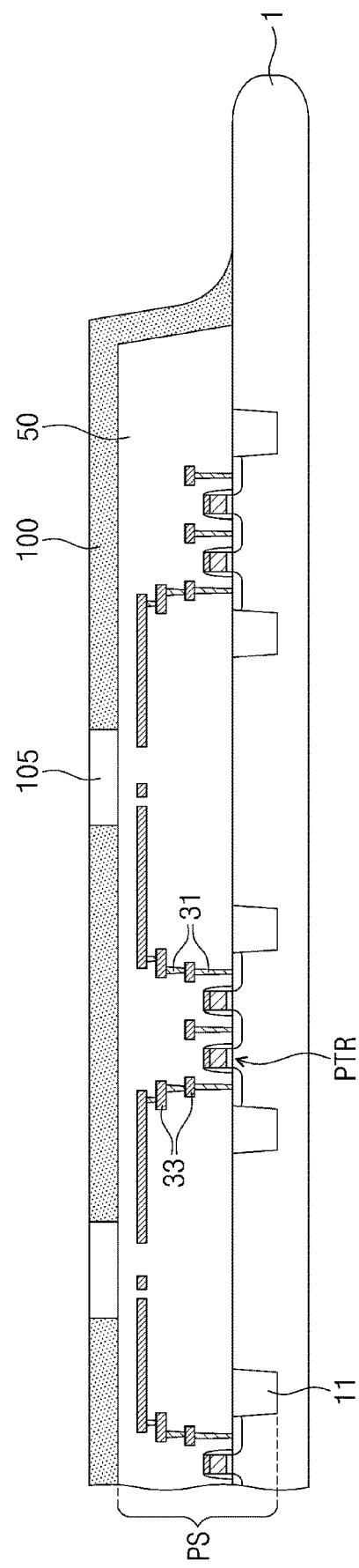
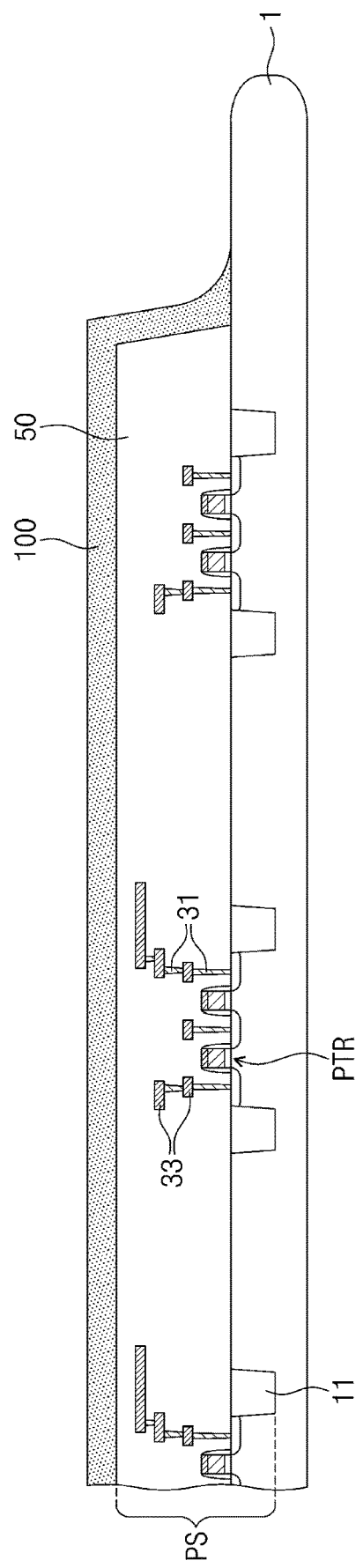
FIG. 16A
FIG. 16B

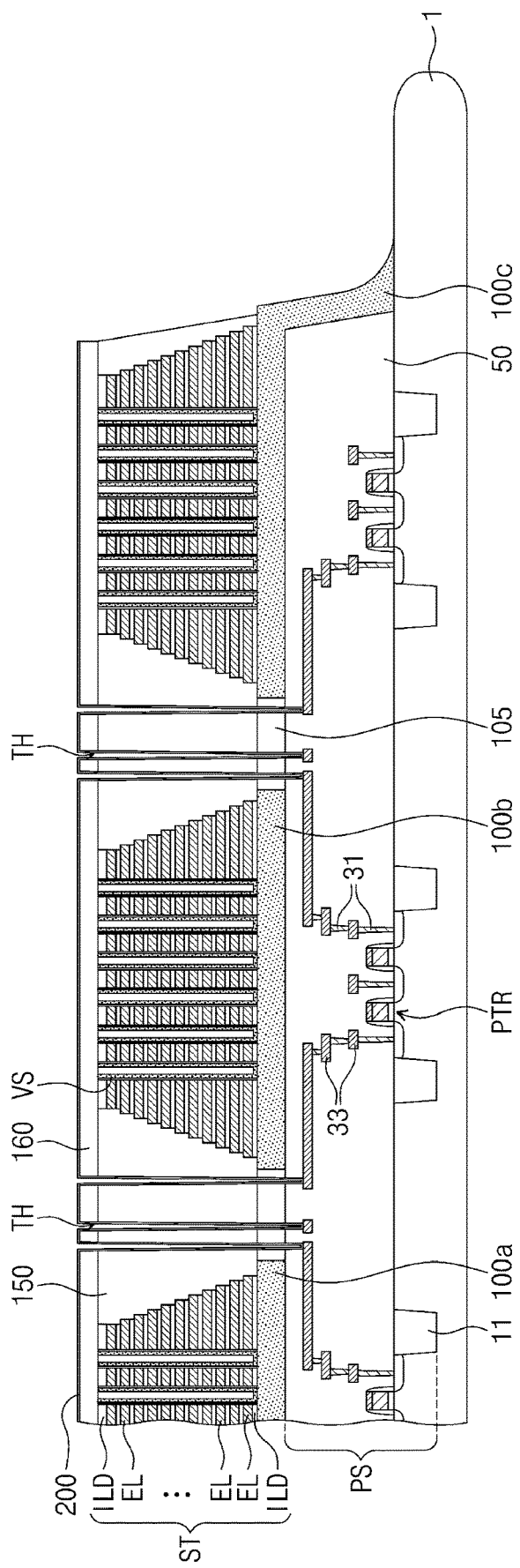

THREE-DIMENSIONAL SEMICONDUCTOR MEMORY DEVICE AND METHOD OF FABRICATING THE SAME

CROSS-REFERENCE TO RELATED APPLICATIONS

This U.S. non-provisional patent application is a divisional of U.S. application Ser. No. 16/777,776 filed Jan. 30, 2020, which claims priority under 35 U.S.C. § 119 to Korean Patent Application No. 10-2019-0075814, filed on Jun. 25, 2019, in the Korean Intellectual Property Office, the entire contents of each of which are hereby incorporated by reference.

BACKGROUND OF THE INVENTION

The present disclosure relates to a three-dimensional semiconductor memory device and a method of fabricating the same, and in particular, to a highly-integrated three-dimensional semiconductor memory device and a method of fabricating the same.

Higher integration of semiconductor devices is required to satisfy consumer demands for superior performance and inexpensive prices. In the case of semiconductor devices, since their integration is an important factor in determining product prices, increased integration is especially required. Integration of two-dimensional or planar semiconductor devices is often highly dependent on the area occupied by a unit memory cell and therefore greatly influenced by the level of a fine pattern forming technology. However, expensive process equipment needed to increase pattern fineness sets a practical limitation on increasing integration for two-dimensional or planar semiconductor devices. Thus, three-dimensional semiconductor memory devices including three-dimensionally arranged memory cells have recently been proposed.

SUMMARY

Embodiments of the inventive concept are directed to a three-dimensional semiconductor memory device with an increased integration density.

Embodiments of the inventive concept are also directed to methods of fabricating a three-dimensional semiconductor memory device.

According to some embodiments, a three-dimensional semiconductor memory device includes horizontal patterns disposed on a peripheral circuit structure and spaced apart from each other, memory structures provided on the horizontal patterns, respectively, each of the memory structures including a three-dimensional arrangement of memory cells. Penetrating insulating patterns and separation structures may isolate the horizontal patterns from one another. The horizontal patterns may be horizontal semiconductor patterns. Through vias may extend through the penetrating insulating patterns to connect logic circuits of the peripheral circuit structure to the memory structure.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIGS. 7A and 7B are sectional views, which are taken along lines I-I' and respectively, of FIG. 5A to illustrate a three-dimensional semiconductor memory device according to an embodiment of the inventive concept.

FIGS. 8A, 8B, and 8C are sectional views, which are taken along lines I-I', and IV-IV', respectively, of FIG. 5A to illustrate a three-dimensional semiconductor memory device according to an embodiment of the inventive concept.

FIG. 14 is a plan view schematically illustrating a three-dimensional semiconductor memory device according to an embodiment of the inventive concept.

FIGS. 16A to 23A and 16B to 23B are diagrams illustrating a method of fabricating a three-dimensional semiconductor memory device, according to an embodiment of the inventive concept.

It should be noted that these figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of layers, regions and/or structural elements may be reduced or exaggerated for clarity. The use of similar or identical reference numbers in the various drawings is intended to indicate the presence of a similar or identical element or feature.

DETAILED DESCRIPTION

A three-dimensional semiconductor memory device according to an embodiment of the inventive concept and a method of fabricating the same will be described in more detail below with reference to the accompanying drawings.

Figure 1:
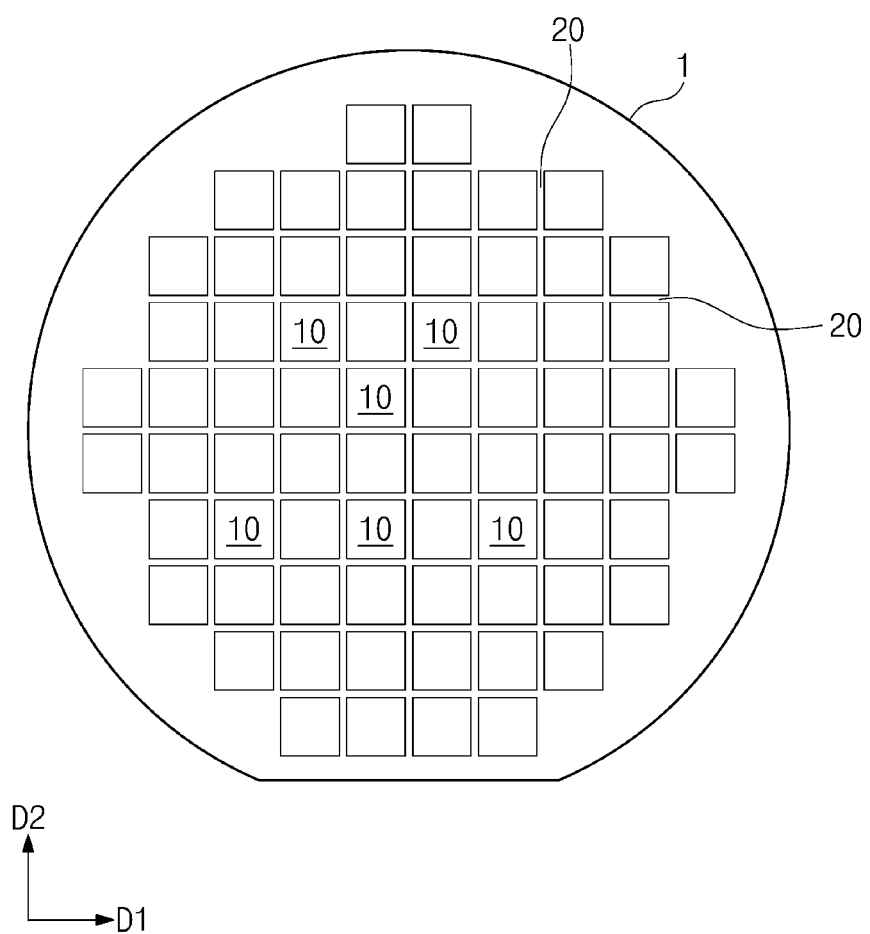
FIG. 1 is a diagram illustrating a substrate, on which three-dimensional semiconductor memory devices according to an embodiment of the inventive concept are integrated.

FIG. 1 is a diagram illustrating a substrate, on which three-dimensional semiconductor memory devices are integrated according to an embodiment of the inventive concept.

Referring to FIG. 1, a semiconductor substrate 1 (e.g., a wafer) may include chip regions 10, from which semiconductor chips are respectively formed, and a scribe line regions, respective ones which are located between the chip regions 10. The chip regions 10 may be two-dimensionally arranged in two different directions (e.g., the first direction D1 and a second direction D2 shown in FIG. 1). Each of the chip regions 10 may be surrounded by scribe line regions 20. A corresponding scribe line region 20 may be disposed between each adjacent pair of the chip regions 10, which are adjacent to each other in both of the first and second directions D1 and D2. The scribe lines 20 may be linearly extending regions denoting where the wafer 1 (after formation of the semiconductor devices in the chip regions 10) may be cut to separate the resulting semiconductor devices from each other (i.e., to form semiconductor chips corresponding to the semiconductor devices formed in the chip regions 10). In some examples, the scribe lanes 20 may have no circuitry (e.g., no transistors) formed that at necessary for the operation of the resulting semiconductor devices) (such as no transistors, wires, etc. at all, or only dummy structures, such as one or more of dummy transistors, wires, etc.).

The semiconductor substrate 1 may be a bulk silicon wafer, a silicon-on-insulator (SOI) wafer, a germanium wafer, a germanium-on-insulator (GOI) wafer, a silicon-germanium wafer, or a thin wafer including an epitaxial layer formed by a selective epitaxial growth (SEG) process. A top portion (and/or the entirety) of the semiconductor substrate 1 may comprise a crystalline semiconductor material (such as those semiconductor materials noted herein).

According to an embodiment of the inventive concept, a three-dimensional semiconductor memory device including memory cells, that are three-dimensionally arranged, may be formed on each of the chip regions 10 of the semiconductor substrate 1.

Figure 2:
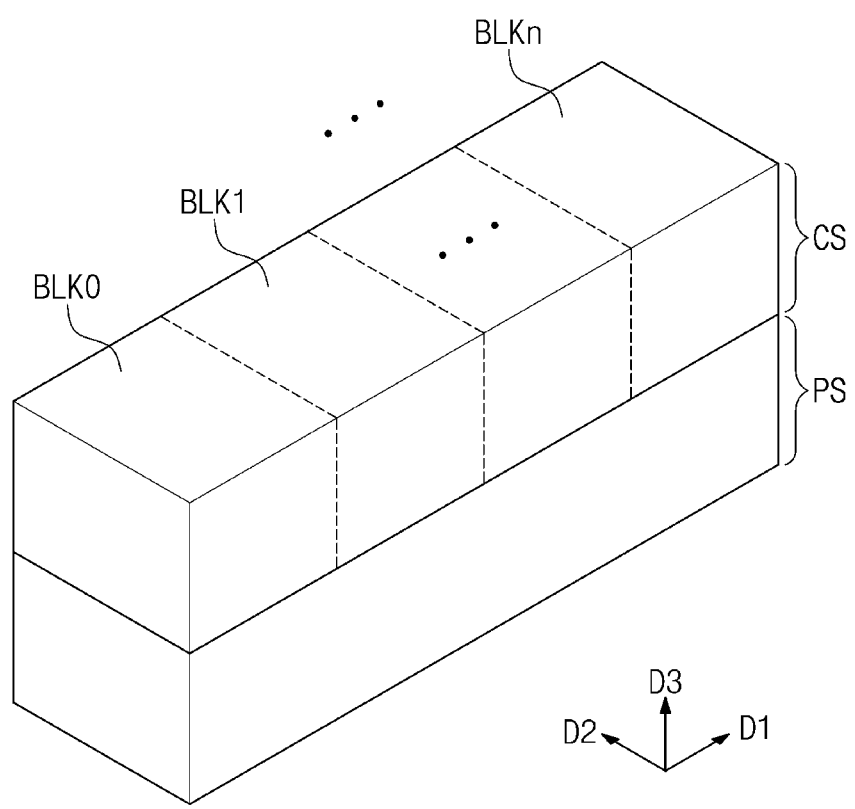
FIG. 2 is a perspective view schematically illustrating a three-dimensional semiconductor memory device according to an embodiment of the inventive concept.

FIG. 2 is a perspective view schematically illustrating a three-dimensional semiconductor memory device according to an embodiment of the inventive concept.

Referring to FIGS. 2, 3, 4A, 4B and 4C, a three-dimensional semiconductor memory device according to an embodiment of the inventive concept may include a peripheral circuit structure PS, a cell array structure CS on the peripheral circuit structure PS. Through vias TVS of the cell array structure CS may connect the cell array structure CS to the peripheral circuit structure PS. The cell array structure CS, including a through hole regions THR having penetrating insulating patterns 105 with the through vias TVS formed therein, may overlie the peripheral circuit structure PS, when viewed in a plan view.

In some embodiments, the peripheral circuit structure PS may have formed therein various peripheral logic circuits, such as row and column decoders, page buffers, control circuits, and other peripheral logic circuits (e.g., formed of interconnected peripheral transistors). The peripheral transistors of the peripheral circuit structure PS may be integrated on the semiconductor substrate 1. For example, source/drain regions of the peripheral logic circuits may be formed of portions of the semiconductor substrate 1 doped with charge carrier impurities (e.g., acceptor and/or donor dopants).

The cell array structure CS may include a cell array including a plurality of memory cells, which are three-dimensionally arranged. The cell array structure CS may include one or more mats MT each formed in a corresponding mat region MTR. Each mat MT may be controlled separately from other mats MT in the corresponding semiconductor device so that concurrent access operations may be concurrently performed on several mats MT. Each mat MT may include a plurality of memory blocks BLKO-BLKn. Each of the memory blocks BLKO-BLKn may include a plurality of memory cells, which are three-dimensionally arranged.

For example, each of the memory blocks BLKO-BLKn may include a plurality of horizontal patterns, which are sequentially stacked, a plurality of vertical patterns, which are provided to cross the horizontal patterns in a vertical direction, and memory elements, which are interposed between side surfaces of the horizontal and vertical patterns. Each of the horizontal patterns may be formed of or include at least one of conductive materials (e.g., doped silicon or metals) and may be provided in the form of line or plate.

Figure 3:
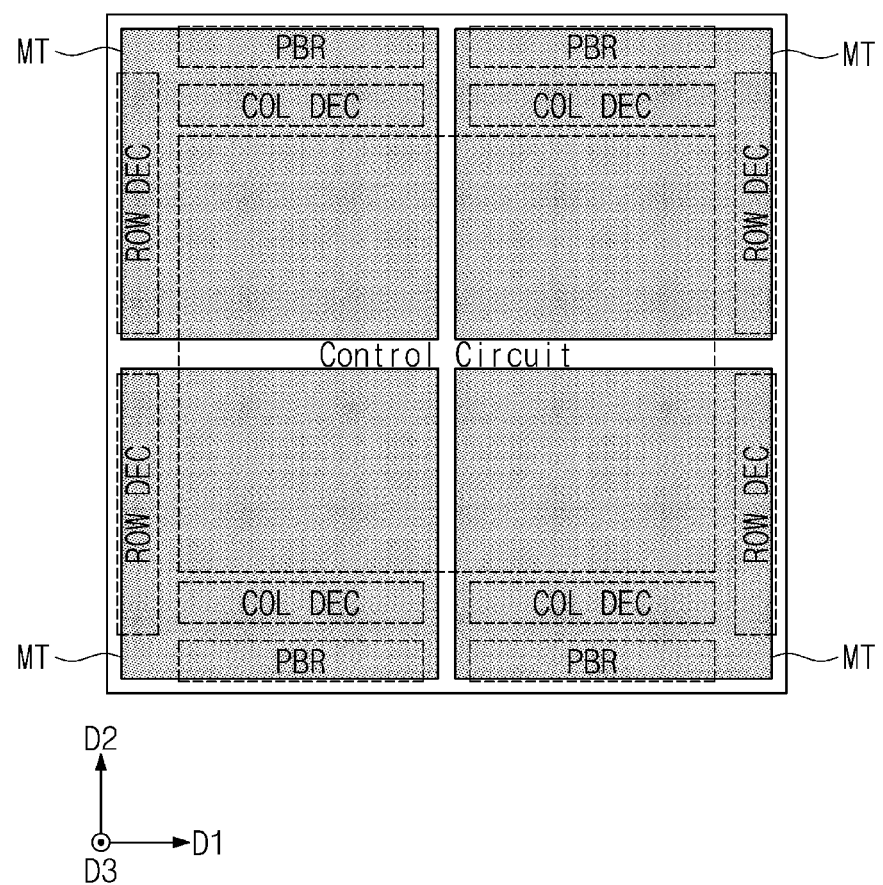
FIG. 3 is a schematic plan view of a three-dimensional semiconductor memory device according to an embodiment of the inventive concept.

FIG. 3 is a schematic plan view of a three-dimensional semiconductor memory device according to an embodiment of the inventive concept.

The peripheral circuit structure PS and the cell array structure CS described and shown with reference to FIGS. 2, 3, 4A, 4B and 4C (and alternatives described herein) may be disposed at each of the chip regions 10 of the semiconductor substrate 1.

At each of the chip regions 10, row and column decoders ROW DEC and COL DEC, a page buffer PBR, and control circuits CTRL, which constitute the peripheral circuit structure PS (e.g., see FIG. 2), may be disposed on the semiconductor substrate 1.

A plurality of mats MT constituting the cell array structure CS may be disposed in each chip region 10. The plurality of mats MT may be arranged in the first and second directions D1 and D2. In an embodiment, the plurality of mats MT may be provided on horizontal patterns 100a, 100b, 100a' and 100b', respectively, which are spaced apart from each other in the first and second directions D1 and D2.

The plurality of mats MT may be disposed to overlie the peripheral circuit structure PS including to overlie peripheral logic circuits of the peripheral circuit structure PS. According to an embodiment of the inventive concept, the peripheral logic circuits of the peripheral circuit structure PS (e.g., see FIG. 2) may be disposed below the mats MT, with reduced constraints on their arrangement.

Figure 4A:
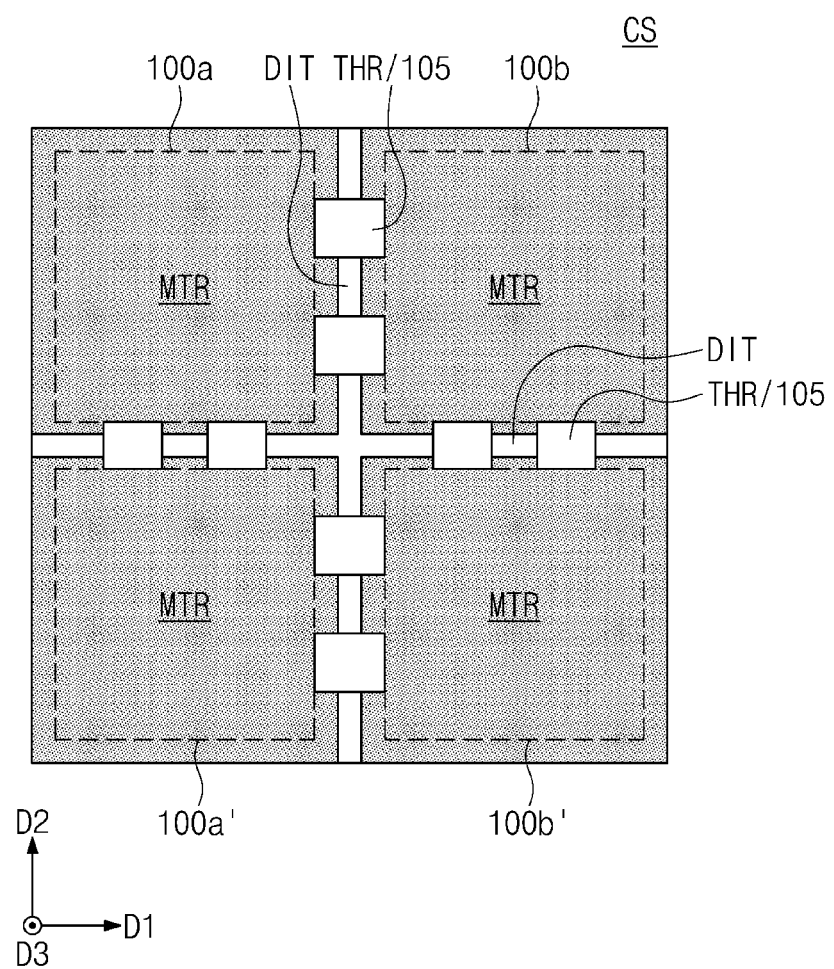
FIGS. 4A, 4B, and 4C are plan views schematically illustrating some examples of a cell array structure in a three-dimensional semiconductor memory device according to an embodiment of the inventive concept.
Figure 4B:
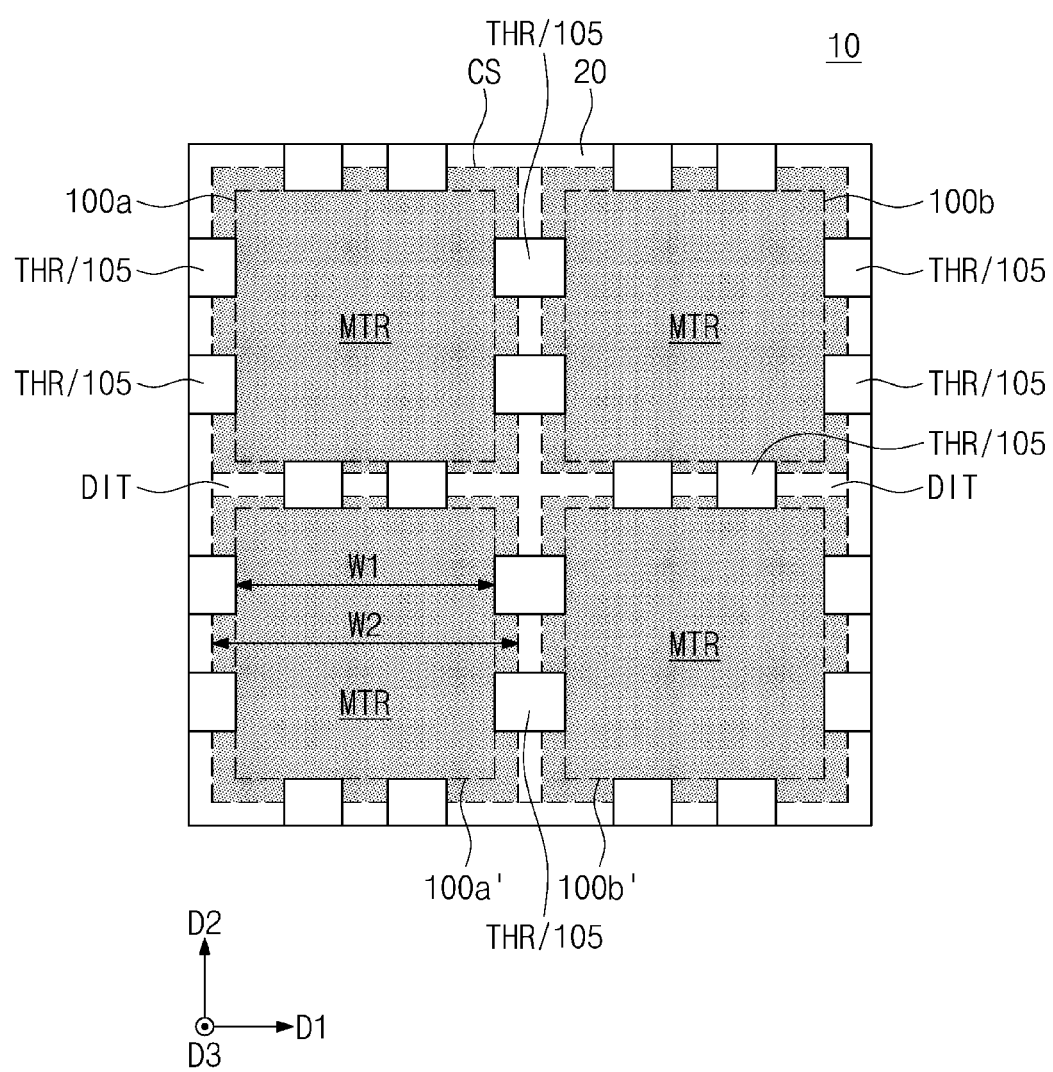
Figure 4C:
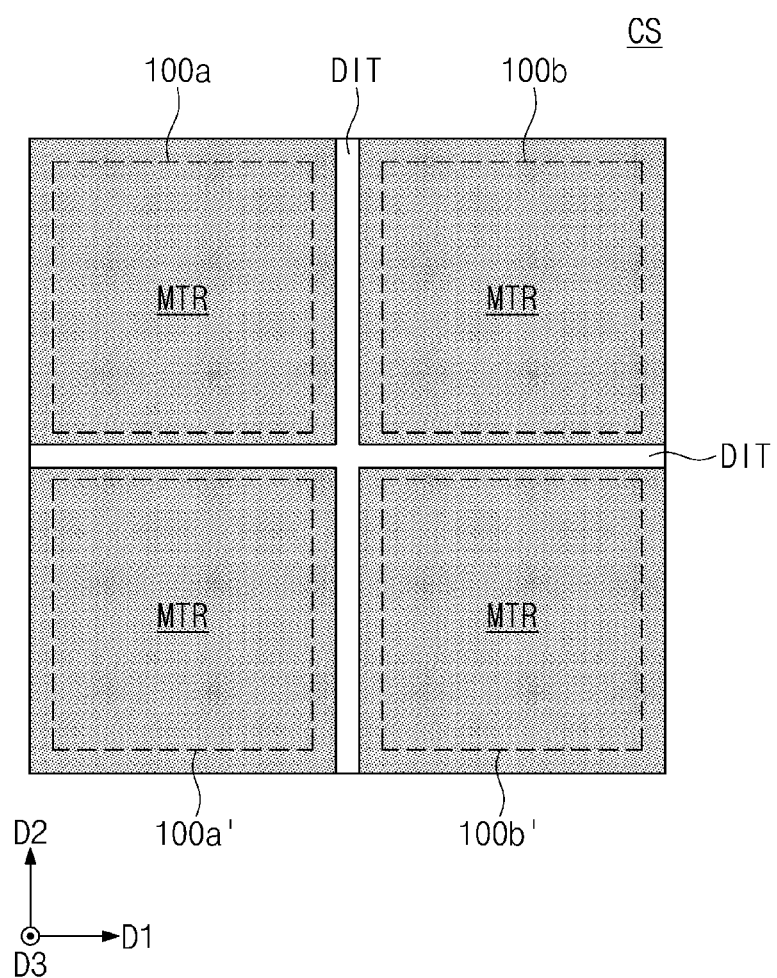

FIGS. 4A, 4B, and 4C are plan views schematically illustrating some examples of a cell array structure in a three-dimensional semiconductor memory device according to an embodiment of the inventive concept.

Referring to FIG. 4A, the cell array structure CS may include a plurality of mat regions MTR. The mat regions MTR may be spaced apart from each other in the first and second directions D1 and D2.

The horizontal patterns 100a, 100b, 100a' and 100b' may be provided in the mat regions MTR, respectively, and memory structures including a plurality of three-dimensionally arranged memory cells may be provided on the horizontal patterns 100a, 100b, 100a' and 100b', respectively.

The through hole regions THR (each having a plurality of through vias TVS formed therein) may be disposed between the mat regions MTR, which are adjacent to each other in the first direction D1, and between the mat regions MTR, which are adjacent to each other in the second direction D2. The through hole regions THR may be spaced apart from each other in the first and second directions D1 and D2. The through hole regions THR may correspond to and be defined by corresponding penetrating insulating patterns 105.

Separation structures DIT may be respectively disposed to extend between adjacent through hole regions THR. The horizontal patterns 100a, 100b, 100a' and 100b', which are adjacent to each other, may be physically separated from one another and electrically disconnected from each other by the penetrating insulating patterns 105 and the separation structures DIT.

Referring to FIGS. 4A and 4B, in each chip region 10, the cell array structure CS may include a plurality of the mat regions MTR. The mat regions MTR may be spaced apart from each other in the first and second directions D1 and D2.

The horizontal patterns 100a, 100b, 100a' and 100b' may be provided in the mat regions MTR, respectively, and memory structures including a plurality of three-dimensionally arranged memory cells may be provided on the horizontal patterns 100a, 100b, 100a' and 100b', respectively.

The through vias TVS may be disposed between the mat regions MTR, which are adjacent to each other in the first direction D1, and between the mat regions MTR, which are adjacent to each other in the second direction D2. The through vias TVS may be spaced apart from each other in the first and second directions D1 and D2.

The separation structures DIT may be respectively disposed between the through vias TVS, which are adjacent to each other.

The separation structures DIT and portions of one or more of the penetrating insulating patterns 105 may be disposed in the scribe line region 20 and may also be disposed in the chip region 10.

In an embodiment, each of the horizontal patterns 100a, 100b, 100a' and 100b' may be fully surrounded by corresponding ones of the penetrating insulating patterns 105 and the separation structures DIT, when viewed in a plan view. Accordingly, the horizontal patterns 100a, 100b, 100a' and 100b', which are adjacent to each other, may be electrically disconnected from each other by the penetrating insulating patterns 105 and the separation structures DIT.

In an embodiment, each of the horizontal patterns 100a, 100b, 100a' and 100b' may have a first width W1 between two opposite penetrating insulating patterns 105 on opposite sides of such horizontal pattern, and may have a second width W2, which is larger than the first width W1, between two opposite separation structures DIT (on these opposite sides of such horizontal pattern). FIG. 4B highlights an example of such different widths W1 and W2 as measured in the first direction D1 (and shows similar different widths—although not labeled—in the second direction D2).

According to an embodiment shown in FIG. 4C, the penetrating insulating patterns 105 described with reference to FIGS. 4A and 4B may be omitted. In detail, the horizontal patterns 100a, 100b, 100a' and 100b' may be separated from each other by the separation structures DIT. In some examples, each of the horizontal patterns 100a, 100b, 100a' and 100b' may be fully enclosed by the separation structures DIT, when viewed in a plan view.

The through vias TVS and the separation structures DIT according to an embodiment of the inventive concept will be described in more detail with reference to FIGS. 5A to 14.

Figure 5A:
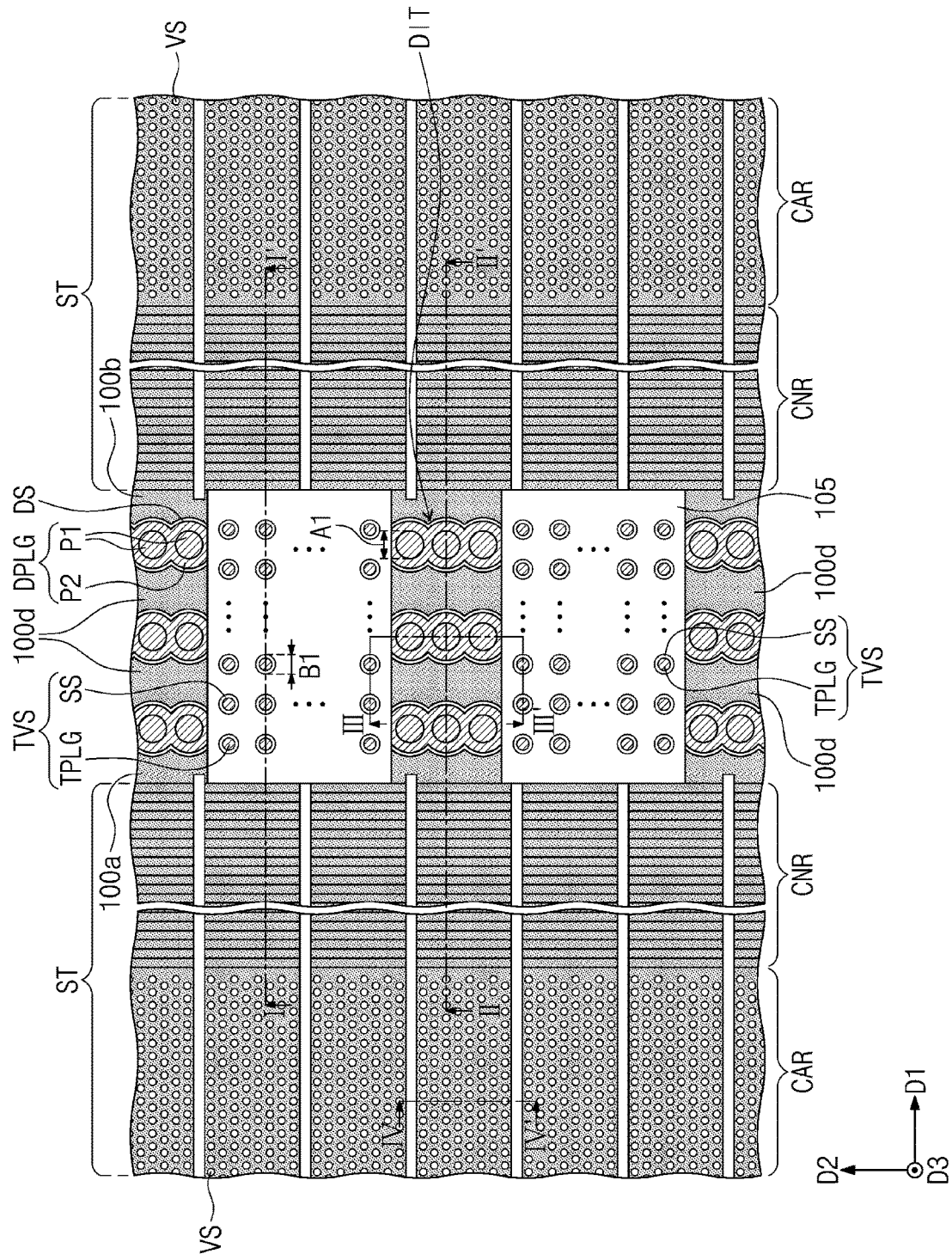
FIGS. 5A, 5B, and 5C are plan views illustrating a portion of a three-dimensional semiconductor memory device according to some embodiments of the inventive concept.
Figure 5B:
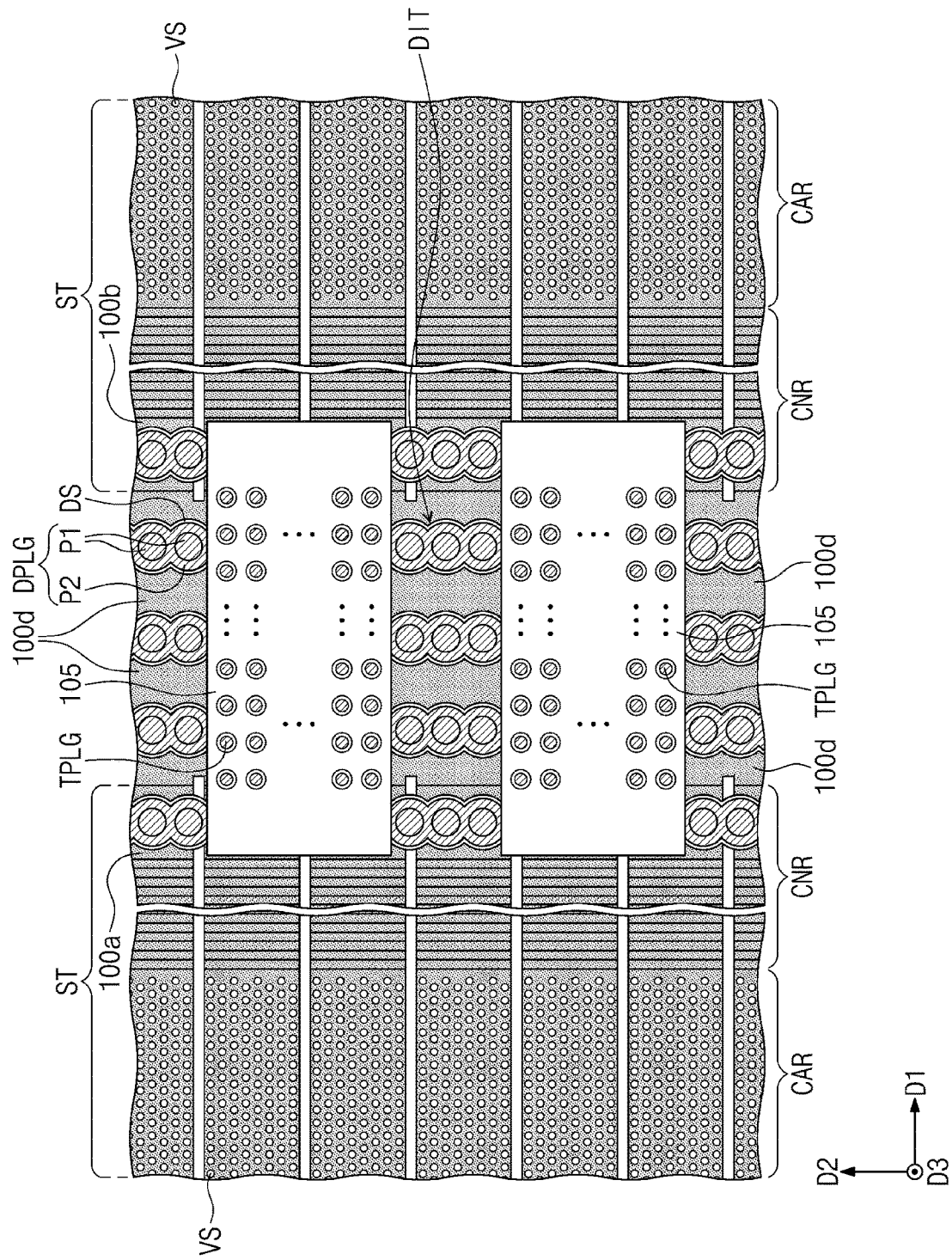
Figure 5C:
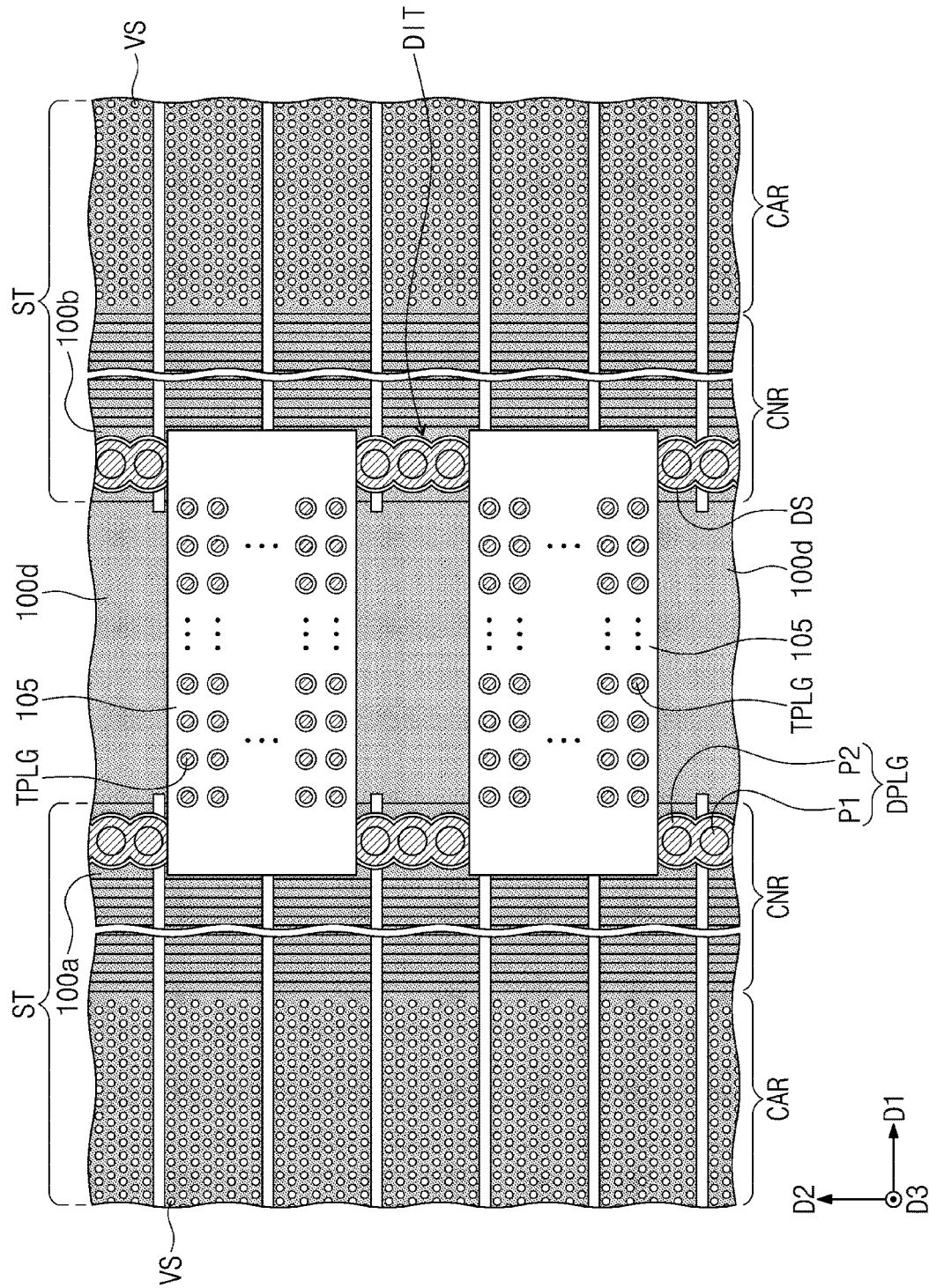

FIGS. 5A, 5B, and 5C are plan views illustrating a portion of a three-dimensional semiconductor memory device according to some embodiments of the inventive concept. FIGS. 6A, 6B, 6C, and 6D are sectional views, which are taken along lines I-I', II-II' III-III' and IV-IV', respectively, of FIG. 5A to illustrate a three-dimensional semiconductor memory device according to an embodiment of the inventive concept. It should be appreciated that the sectional views and related plan views of many of the figures of this application may not exactly correlate to one another to better communicate the various features of the embodiments. For example, the number of repetitive structures of a particular element shown in a plan view may be different from the number of these repetitive structures of that particular element shown in the corresponding sectional view. In addition, alternative structure to one sectional view illustrated via another sectional view may not have such alternative structure reflected in the corresponding plan view to sectional view illustrating such alternative structure.

Referring to FIGS. 5A, 6A, 6B, and 6C, the peripheral circuit structure PS including peripheral transistors PTR may be disposed on and/or within the semiconductor substrate 1, and the cell array structure CS may be disposed on the peripheral circuit structure PS.

In detail, the peripheral circuit structure PS may include the peripheral transistors PTR, which integrally formed with the semiconductor substrate 1 (e.g., on and/or within a top surface of the semiconductor substrate 1), and a lower insulating gapfill layer 50, which is provided to cover the peripheral transistors PTR.

The semiconductor substrate 1 may be a silicon wafer, a silicon-germanium wafer, a germanium wafer, or a single-crystalline epitaxial layer grown on a single-crystalline silicon wafer. The semiconductor substrate 1 may include active regions defined by a device isolation layer 11.

The peripheral logic circuits formed by interconnected peripheral transistors PTR may include the row and column decoders, the page buffers, and the control circuit, as described above. The peripheral transistors PTR may include NMOS and PMOS transistors, low and high voltage transistors, and be integrated on and/or within the semiconductor substrate 1. Peripheral circuit wires 33 may be electrically connected to the peripheral transistors PTR through peripheral contact plugs 31. For example, the peripheral contact plugs 31 and the peripheral circuit wires 33 may be coupled to corresponding ones of the NMOS and PMOS transistors that comprise the peripheral transistors PTR.

The lower insulating gapfill layer 50 may be provided to cover peripheral gate electrodes, the peripheral contact plugs 31, and the peripheral circuit wires 33. The lower insulating gapfill layer 50 may include a plurality of insulating layers, which are stacked. For example, the lower insulating gapfill layer 50 may include at least one of a silicon oxide layer, a silicon nitride layer, a silicon oxynitride layer, and/or low-k dielectric layers.

The cell array structure CS may be disposed on the lower insulating gapfill layer 50 and may include a plurality of the mat regions MTR, through hole regions THR, which are provided between adjacent ones of the mat regions MTR, and dummy regions DR, which are provided between adjacent ones of the mat regions MTR and between adjacent ones of the through hole regions THR. The mat regions MTR may be provided to be spaced apart from each other in the first and second directions D1 and D2, as previously described with reference to FIGS. 3, 4A, and 4B.

The cell array structure CS may include memory structures, which are respectively provided in the mat regions MTR, the through vias TVS, which are respectively provided in the through hole regions THR, and at least one separation structure DIT provided in each of the dummy regions DR.

Each of the memory structures may include the horizontal pattern 100a or 100b in each mat region MTR, a stack ST on the horizontal pattern 100a or 100b, and vertical structures VS penetrating the stack ST.

Each of the through vias TVS may be formed to extend through a penetrating insulating pattern 105, which is provided between the horizontal patterns 100a and 100b. Each of the through vias may include a through plug TPLG, which is provided to connect the peripheral circuit wires 33 to connection lines CL and a sidewall spacer SS. Groups of through vias TVS may be provided in corresponding through hole regions THR. With respect to a plan view, each through hole region THR may have boundaries corresponding to (here, defined by) a corresponding penetrating insulating pattern 105. When viewed in a plan view, at least one of the through hole regions THR may be provided between a pair of the stacks ST, which are spaced apart from each other. In an embodiment, the through hole regions THR may be disposed between a pair of the stacks ST, which are spaced apart from each other in the first direction D1. The through hole regions THR may be spaced apart from each other in the second direction D2.

The separation structure DIT may include a dummy plug DPLG and a dummy spacer DS, which is provided between the dummy plug DPLG and the horizontal pattern 100a or 100b.

In more detail, the horizontal patterns 100a and 100b may be disposed on the lower insulating gapfill layer 50 of the peripheral circuit structure PS. The horizontal patterns 100a and 100b may be provided in the mat regions MTR, respectively, and the stacks ST may be disposed on each horizontal pattern 100a or 100b.

The horizontal pattern 100a or 100b may be formed of or include at least one of semiconductor materials (e.g., silicon (Si), germanium (Ge), silicon germanium (SiGe), gallium arsenic (GaAs), indium gallium arsenic (InGaAs), or aluminum gallium arsenic (AlGaAs)). The horizontal pattern 100a or 100b may be formed to have one of polycrystalline, amorphous, and single-crystalline structures. As an example, the horizontal pattern 100a or 100b may be formed of a poly-silicon layer doped with n-type impurities. As another example, the horizontal pattern 100a or 100b may be formed of or include at least one of conductive materials. The horizontal pattern 100a or 100b may include a cell array region CAR and a connection region CNR.

The stacks ST may be formed in both the cell array region CAR to the connection region CNR. Each of the stacks ST may include insulating layers ILD and electrodes EL, which are alternately stacked in a third direction D3 (e.g., a vertical direction) perpendicular to the first and second directions D1 and D2. The electrodes EL of each stack ST may be stacked to form a stairstep structure in an edge region (i.e., the connection region CNR) of each mat region MTR.

The electrodes EL of each stack ST may have a decreasing length with increasing distance from the horizontal pattern 100a or 100b, when measured in the first direction D1. Each of the electrodes EL may have pad portions, which are located at opposite ends thereof, and the pad portion of each of the electrodes EL may be exposed by another electrode directly located thereon. The pad portions of the electrodes EL may be located at different positions, in horizontal and vertical directions. The electrodes EL may be formed of or include at least one of conductive materials (e.g., doped semiconductor materials, metal silicides, metallic materials, or metal nitrides). The insulating layers ILD may be formed of or include silicon oxide.

Figure 6A:
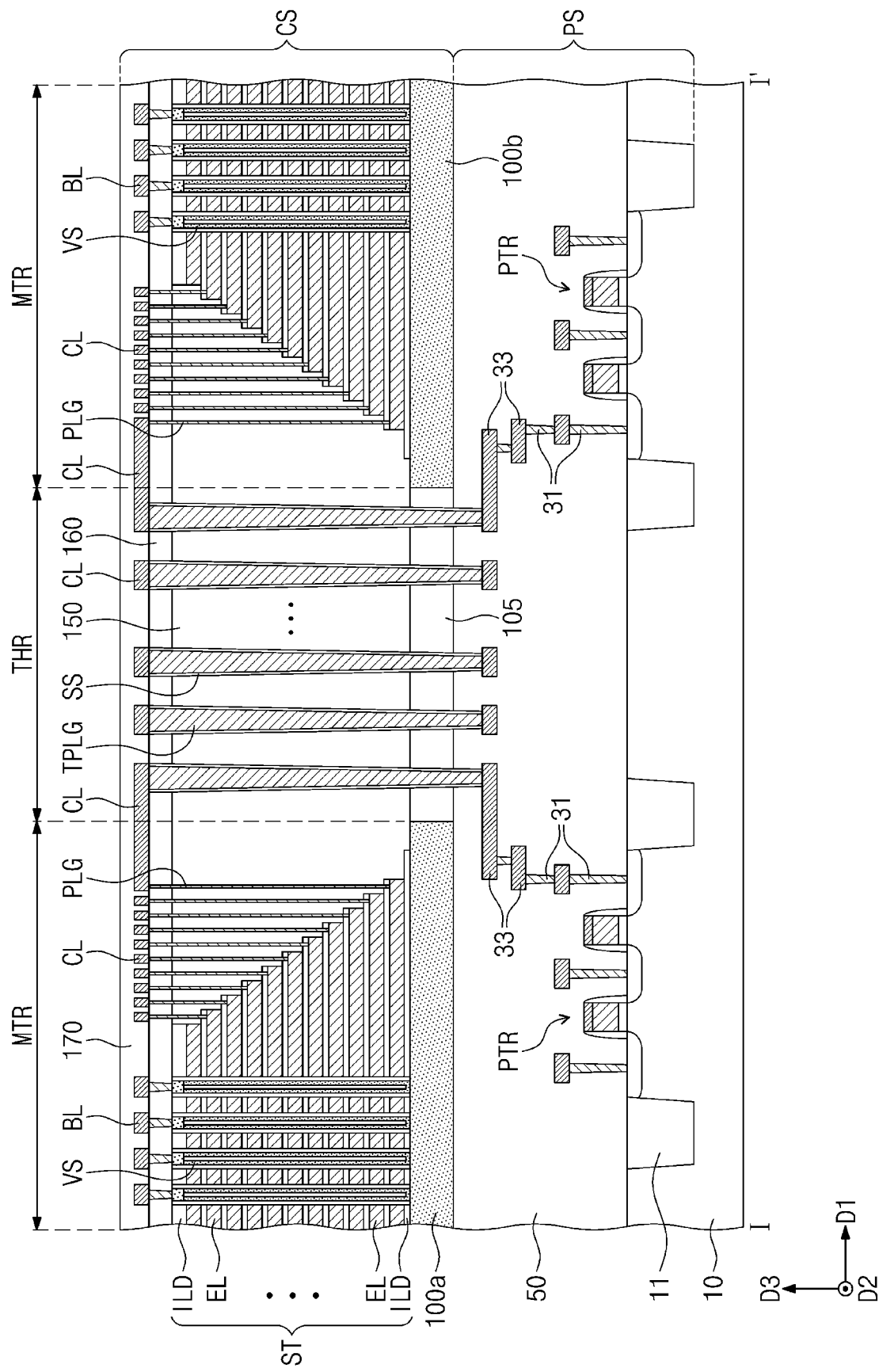
FIGS. 6A, 6B, 6C, and 6D are sectional views, which are taken along lines I-I', and IV-IV', respectively, of FIG. 5A to illustrate a three-dimensional semiconductor memory device according to an embodiment of the inventive concept.
Figure 6B:
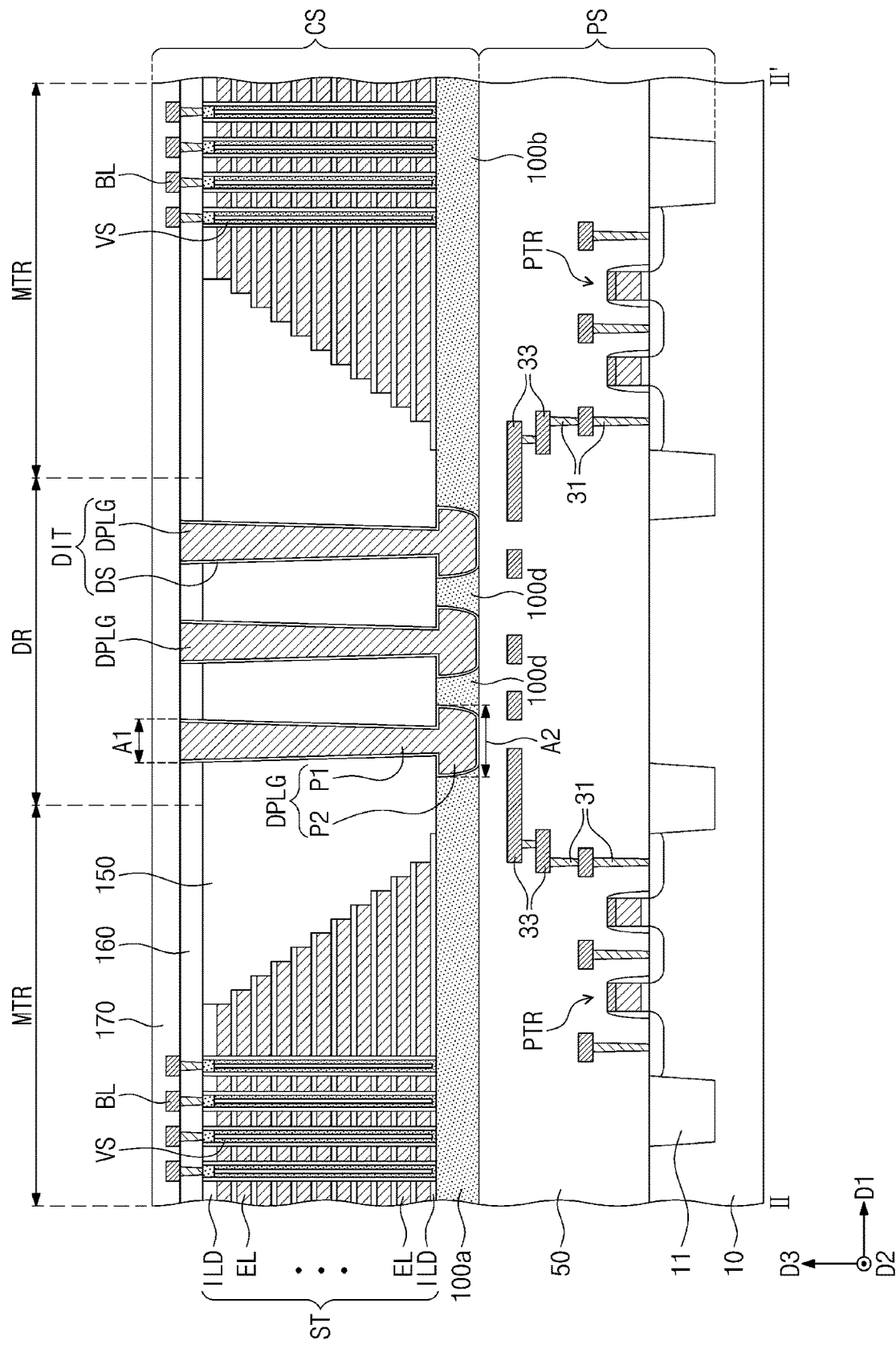
Figure 6C:
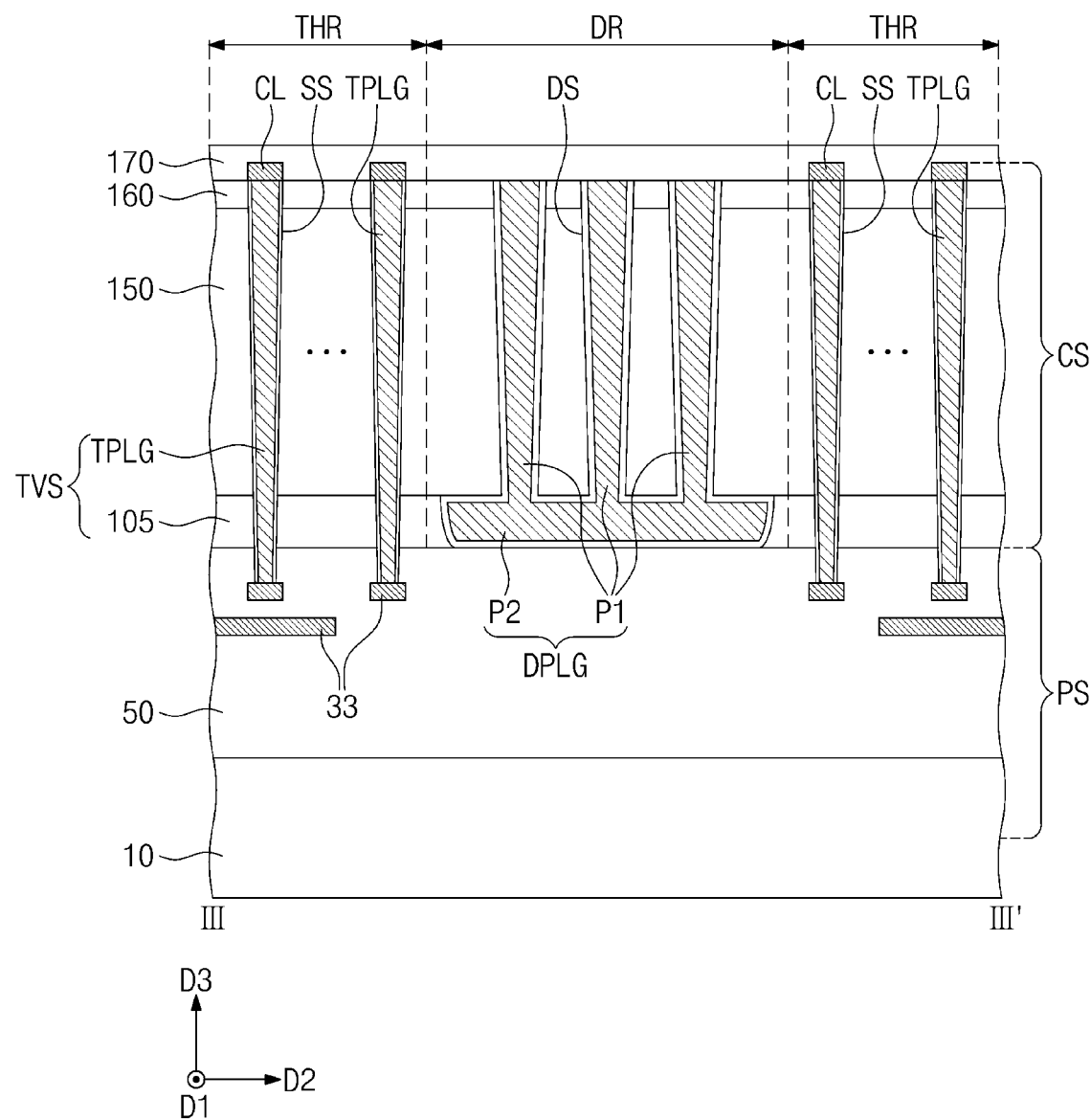
Figure 6D:
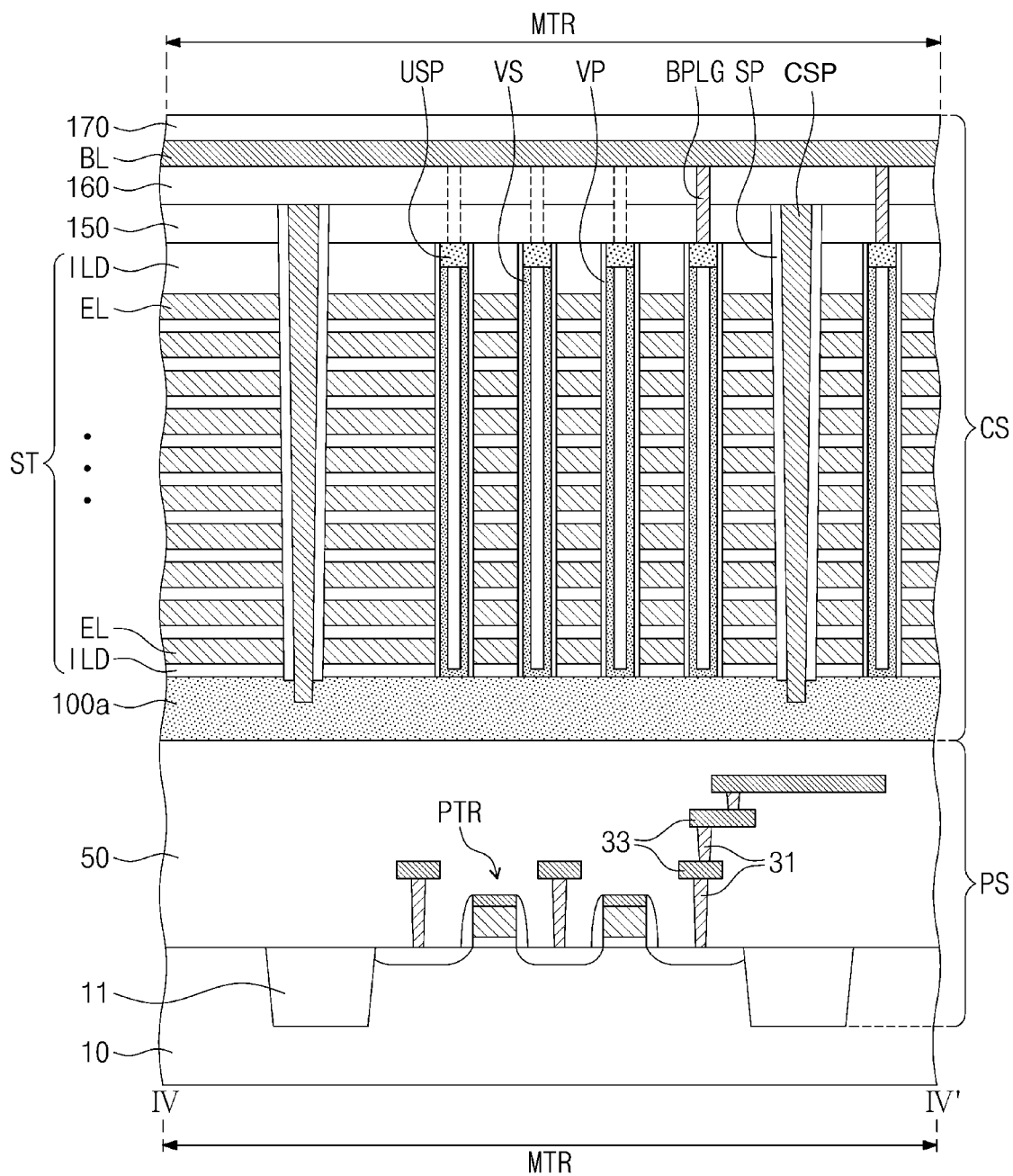

Referring to FIGS. 6A, 6B, and 6D, the vertical structures VS may be provided to penetrate the stack ST in each mat region MTR and may be connected to the horizontal pattern 100a or 100b. The vertical structures VS may be arranged in a specific direction or may be arranged in a zigzag shape, when viewed in a plan view.

The vertical structures VS may include a semiconductor material (e.g., silicon (Si), germanium (Ge), or mixtures thereof). In certain embodiments, the vertical structures VS may be formed of or include a doped semiconductor material or an intrinsic semiconductor material. The vertical structures VS including the semiconductor material may be used as channels of transistors constituting NAND cell strings (and thus, each one of the vertical structures VS may constitute a vertical channel of a corresponding vertically arranged NAND cell string).

Vertical insulating patterns VP may be disposed between the stack ST and the vertical structures VS. Each vertical insulating pattern VP may extend in the third direction D3 and surround a side surface of a corresponding vertical structure VS. In the embodiment shown in FIG. 6D, the vertical insulating pattern VP extends in the third direction D3 and surrounds a side surface of an upper semiconductor pattern USP. The vertical insulating pattern VP may be shaped like a hollow pipe or macaroni whose top and bottom are open.

The vertical insulating pattern VP may be formed of a single thin film or a plurality of thin films. In some embodiments, the vertical insulating pattern VP may be a part of a data storing layer. For example, the vertical insulating pattern VP may include a tunnel insulating layer, a charge storing layer, and a blocking insulating layer, which are used as a data storing layer of a NAND flash memory device. For example, the charge storing layer may be a trap insulating layer, a floating gate electrode, or an insulating layer including conductive nano dots. In more detail, the charge storing layer may be formed of and/or include at least one of a silicon nitride layer, a silicon oxynitride layer, a silicon-rich nitride layer, a nanocrystalline silicon layer, or a laminated trap layer. The tunnel insulating layer may be one of materials having a band gap larger than that of the charge storing layer, and the blocking insulating layer may be at least one of high-k dielectric materials, such as aluminum oxide and hafnium oxide. Alternatively, the vertical insulating pattern VP may include a thin film for a phase-change memory or for a variable resistance memory.

Referring to FIG. 6D, in each mat region MTR, a common source plug CSP may penetrate the stack ST in the third direction D3 and may be in contact with the horizontal pattern 100a or 100b. A sidewall insulating spacer SP may be interposed between the common source plug CSP and the stacks ST. During a reading or programming operation of a three-dimensional NAND flash memory device, a source voltage may be applied to the horizontal pattern 100a or 100b through the common source plug CSP.

In some embodiments, the three-dimensional semiconductor memory device may be a three-dimensional NAND flash memory device, whose NAND cell strings are integrated on the horizontal pattern 100a or 100b. In other words, the stack ST, the vertical structures VS, and the vertical insulating pattern VP including the data storing layer may form memory cells, which are three-dimensionally arranged on the horizontal pattern 100a or 100b. In the stack ST, the electrodes EL may be word lines (connected to be activated by a row decoder) and may form gate electrodes of the memory cell transistors of the cell strings of the NAND flash memory device.

In an embodiment, the penetrating insulating pattern 105 in the through hole region THR may be disposed between the horizontal patterns 100a and 100b. As an example, the penetrating insulating patterns 105 may be disposed between the horizontal patterns 100a and 100b, which are adjacent to each other in the first direction D1. The penetrating insulating patterns 105 may be in contact with the lower insulating gapfill layer 50 and may be in contact with side surfaces of the horizontal patterns 100a and 100b, which are adjacent to each other.

An upper insulating gapfill layer 150 may be disposed on the horizontal pattern 100a or 100b and the penetrating insulating pattern 105 to cover the end portions of the electrodes EL forming the stairstep structure. A first interlayer insulating layer 160 may be provided to cover top surfaces of the vertical structures VS.

Cell contact plugs PLG may be provided to penetrate the first interlayer insulating layer 160 and the upper insulating gapfill layer 150 and may be coupled to end portions of the electrodes EL, respectively.

Bit lines BL may be disposed on the first interlayer insulating layer 160 and may extend in the second direction D2 to cross the stacks ST. The bit lines BL may be electrically connected to the vertical structure VS through bit line contact plugs BPLG.

The through plugs TPLG may be provided to penetrate the first interlayer insulating layer 160, the upper insulating gapfill layer 150, the penetrating insulating pattern 105, and an upper portion of the lower insulating gapfill layer 50 and may be coupled to the peripheral circuit wires 33. Each of the through plugs TPLG may be surrounded by a sidewall spacer SS, which is formed of an insulating material.

The through plugs TPLG may be connected to the cell contact plugs PLG, respectively, through the connection lines CL on the first interlayer insulating layer 160. Thus, the through plugs TPLG may electrically connect the electrodes EL of the stacks ST to the peripheral circuit wires 33.

In some embodiments, at least two separation structures DIT may be provided between the horizontal patterns 100a and 100b, which are adjacent to each other in the first direction D1. The separation structures DIT may be disposed between adjacent groups of the through vias TVS (which are adjacent to each other in the second direction D2) and the separation structures DIT may be spaced apart from each other in the first direction D1.

The separation structures DIT may be in contact with the penetrating insulating patterns 105. Thus, in the dummy region DR, the separation structures DIT may separate the horizontal patterns 100a and 100b from each other. Dummy horizontal patterns 100d may be disposed between respective adjacent ones of the separation structures DIT. The dummy horizontal patterns 100d may be separated from the horizontal patterns 100a and 100b and may be disposed on the lower insulating gapfill layer 50. The dummy horizontal patterns 100d may be formed of the same material layer (e.g., patterned from horizontal semiconductor layer 100) as the horizontal patterns 100a and 100b.

Bottom surfaces of the separation structures DIT may be positioned at a level higher than bottom surfaces of the through plugs TPLG. The bottom surfaces of the separation structures DIT may be in contact with the lower insulating gapfill layer 50. The bottom surfaces of the separation structures DIT may be positioned at a level that is equal to or lower than a bottom surface of the horizontal pattern 100a or 100b. Top surfaces of the separation structures DIT may be positioned at the same level as top surfaces of the through plugs TPLG.

Each of the separation structures DIT may include a dummy plug DPLG and a dummy spacer DS surrounding the dummy plug DPLG. The dummy plug DPLG may include vertical portions P1, which are provided to penetrate the first interlayer insulating layer 160 and the upper insulating gapfill layer 150 in the third direction D3, and a horizontal portion P2, which is disposed between the horizontal patterns 100a and 100b to horizontally connect the vertical portions P1 to each other (as illustrated in FIG. 6C). In an embodiment, the dummy plug DPLG may be formed of or include the same conductive material as the through plugs TPLG (e.g., formed from material deposited during the same deposition process). In the exemplary separation structures DIT illustrated in FIGS. 6A to 6C, the vertical portions P1 of the dummy plug DPLG are spaced apart from each other in the second direction D2, and the horizontal portion P2 of the dummy plug DPLG extend in the second direction D2. However, it will be recognized that alternative orientation (e.g., rotated by 90 degrees) may be adopted for separation structures DIT that may be interposed between horizontal patterns that are adjacent to each other in the second direction D2 (e.g., 100a and 100a' in FIGS. 4A-4C). In each dummy plug DPLG, a diameter A1 of the vertical portions P1 may be larger than or substantially equal to a diameter B1 of the through plug TPLG. In each dummy plug DPLG, a width of a horizontal portion A2 in the first direction D1 may be larger than the width A1 of the vertical portions P1. As an example, the maximum width of the horizontal portion A2 may be at least 1.5 times larger, such as about 1.5 to 5 times larger than the maximum width A1 of the vertical portions P1.

In each dummy plug DPLG, a side surface of the horizontal portion P2 adjacent to the horizontal patterns 100a and 100b may be rounded or inclined. In each dummy plug DPLG, top surfaces of the vertical portions P1 may be positioned at the same level as the top surfaces of the through plugs TPLG. In each dummy plug DPLG, a bottom surface of the horizontal portion P2 may be positioned at a level higher than the bottom surfaces of the through plugs TPLG.

A surface of the dummy plug DPLG may be surrounded by the dummy spacer DS, which is made of an insulating material. The dummy spacer DS may extend from a region between the horizontal patterns 100a and 100b and a side surface of the dummy plug DPLG into another region between the penetrating insulating pattern 105 and the side surface of the dummy plug DPLG. A portion of the dummy spacer DS may be disposed between the bottom surface of the dummy plug DPLG and the lower insulating gapfill layer 50. The dummy spacer DS may be formed of or include the same insulating material as the sidewall spacer SS surrounding the through plug TPLG (e.g., formed from material deposited during the same deposition process).

Since several separation structures DIT are disposed apart from each other in the first direction D1, the horizontal patterns 100a and 100b may be completely separated from each other by others of the separation structures DIT. For example, in the event that one the separation structures DIT is not in contact with a penetrating insulating pattern 105, other ones of the separation structures DIT arranged adjacently in the first direction may be provided to contact adjacent penetrating insulating patterns 105 to assure the horizontal patterns 100a and 100b may be completely separated from each other.

In some embodiments, an example, in which three separation structures DIT are provided, is illustrated, but the number of the separation structures DIT is not limited to this example. In an embodiment, only one separation structure DIT may be provided to extend between adjacent through hole regions THR (e.g., to extend between and connect to adjacent penetrating insulating patterns 105).

A second interlayer insulating layer 170 may be provided on the first interlayer insulating layer 160 to cover the bit lines BL and the connection lines CL. The second interlayer insulating layer 170 may directly cover top surfaces of the separation structures DIT.

According to an embodiment shown in FIG. 5B, the penetrating insulating patterns 105 may be provided to penetrate a portion of the staircase structure of the stack ST. A plurality of the separation structures DIT may be provided between the adjacent penetrating insulating patterns 105 (which are adjacent to each other in the second direction D2 in FIG. 5B), and some of the separation structures DIT may penetrate the staircase structure of the stack ST.

According to an embodiment shown in FIG. 5C, the separation structure DIT may penetrate portions of the staircase structures of the stacks ST and may be connected to the penetrating insulating patterns 105 adjacent to each other in the second direction D2.

Hereinafter, for concise description, an element, which has the same features as the three-dimensional semiconductor memory device described with reference to FIGS. 5A and 6A to 6D, may be identified by the same reference number without repeating an overlapping description thereof.

Figure 7B:
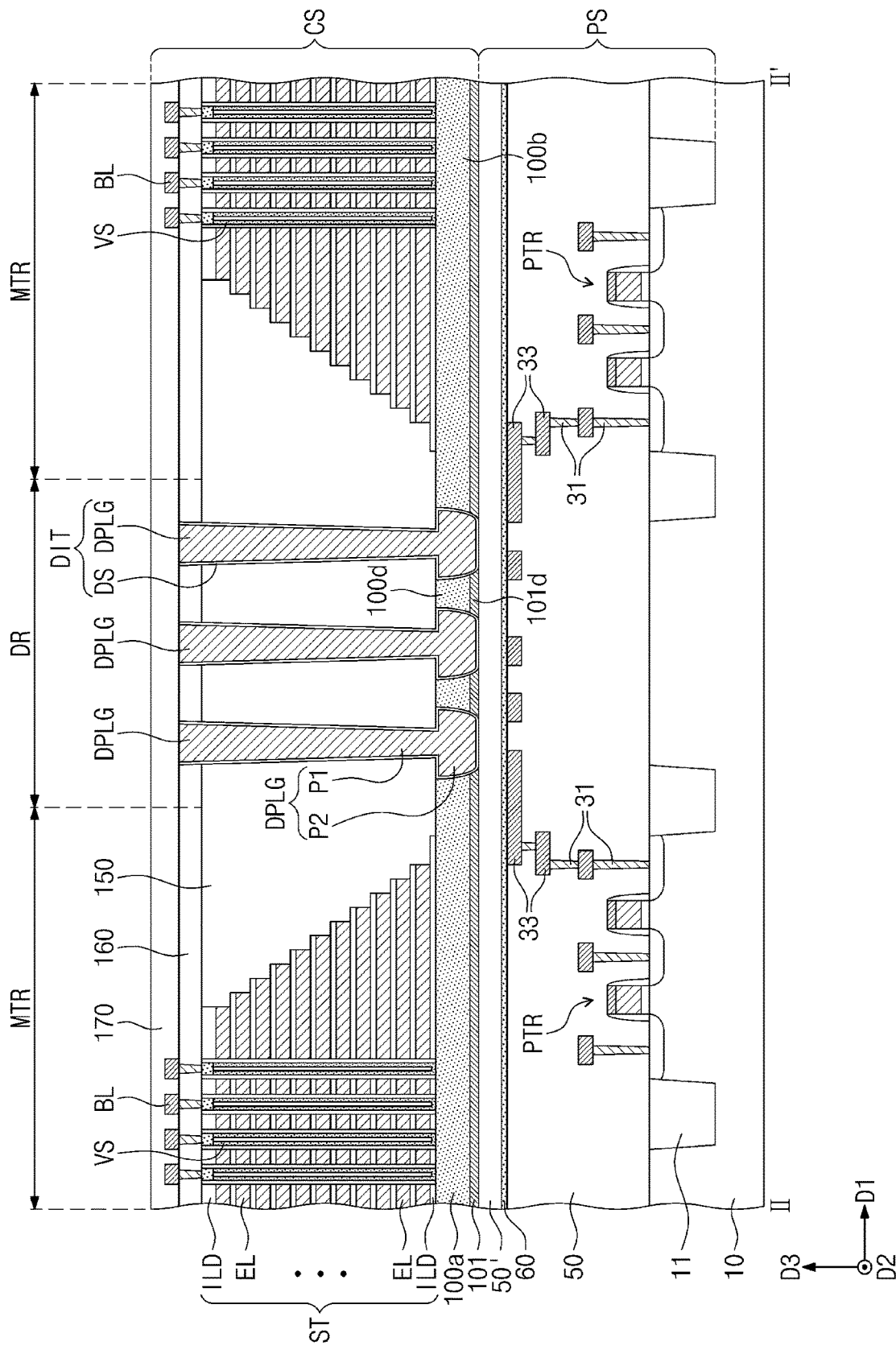

FIGS. 7A and 7B are sectional views, showing an alternative structure to the embodiments of FIGS. 6A and 6B, and correspond to sectional views are taken along lines I-I' and respectively, of FIG. 5A to illustrate a three-dimensional semiconductor memory device according to an embodiment of the inventive concept.

Referring to FIGS. 7A and 7B, the peripheral circuit structure PS may further include an etch stop layer 60 covering top surfaces of the peripheral circuit wires 33. The etch stop layer 60 may be formed between different portions of the lower insulating gap fill layer 50, 50'. The etch stop layer 60 may be formed of an insulating material, which has an etch selectivity with respect to the lower insulating gapfill layer 50. The through plugs TPLG may be provided to penetrate the lower insulating gapfill layer 50 and the etch stop layer 60 and may be in contact with the peripheral circuit wires 33.

Metal plate patterns 101 may be respectively disposed between the lower insulating gapfill layer 50 and the horizontal patterns 100a and 100b. The metal plate patterns 101 may be in contact with bottom surfaces of the horizontal patterns 100a and 100b. The metal plate patterns 101 may be overlapped with the horizontal patterns 100a and 100b and may be spaced apart from each other. The metal plate patterns 101 may be spaced apart from each other by the penetrating insulating patterns 105 and the separation structures DIT, in a manner similar to the horizontal patterns 100a and 100b as described herein.

The metal plate patterns 101 may be formed of or include at least one of metallic materials (e.g., tungsten, copper, aluminum, and so forth), conductive metal nitrides (e.g., titanium nitride, tantalum nitride, and so forth), transition metals (e.g., titanium, tantalum, and so forth), or metal silicide materials. In an embodiment, a predetermined voltage, which is generated by a voltage generator during an operation of a three-dimensional semiconductor memory device, may be applied to the metal plate pattern 101.

The separation structures DIT may penetrate the horizontal patterns 100a and 100b and the metal plate patterns 101 in the third direction D3. Dummy metal patterns 101d, which are spaced apart from the metal plate patterns 101, may be disposed between adjacent ones of the separation structures DIT. The dummy metal patterns 101d may be disposed between the dummy horizontal patterns 100d and the lower insulating gapfill layer 50.

Figure 8B:
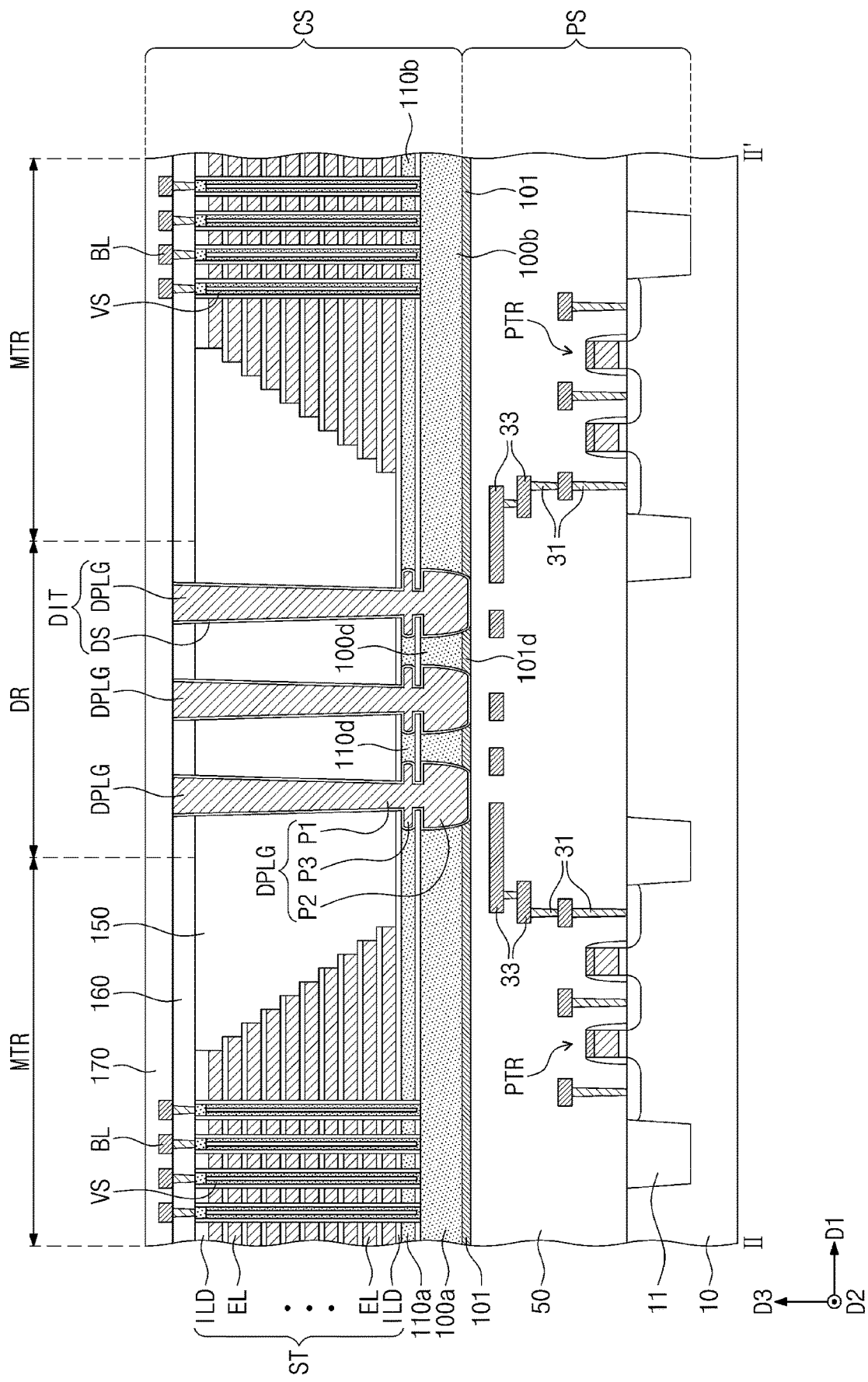
Figure 8C:
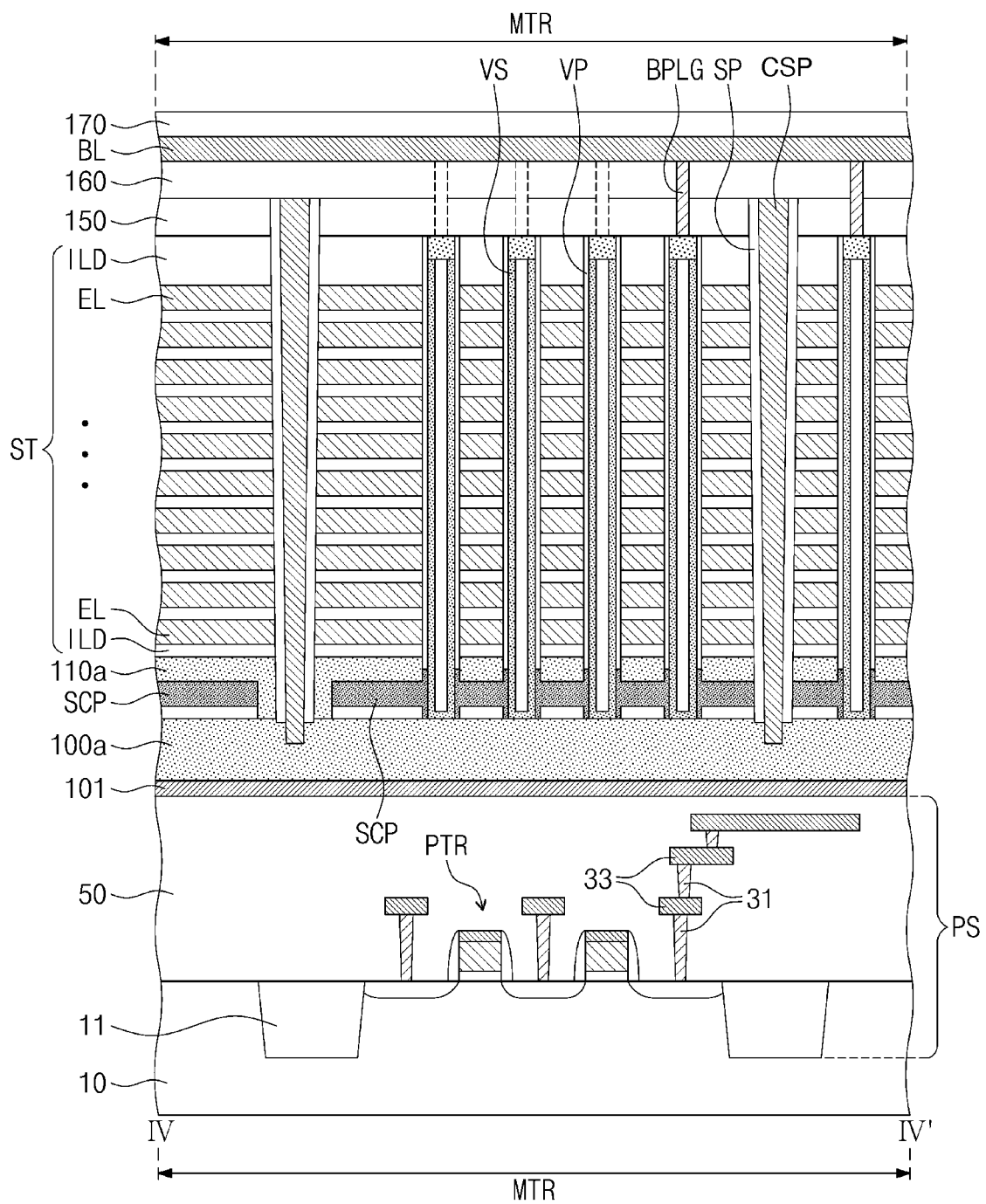

FIGS. 8A, 8B, and 8C are sectional views, showing an alternative structure to the embodiments of FIGS. 6A and 6B, and correspond to sectional views which are taken along lines I-I', II-II', and IV-IV', respectively, of FIG. 5A to illustrate a three-dimensional semiconductor memory device according to an embodiment of the inventive concept.

Referring to FIGS. 8A, 8B, and 8C, the stacks ST, which are spaced apart from each other, may be disposed on the lower insulating gapfill layer 50, and first horizontal patterns 100a/100b and second horizontal patterns 110a/110b may be sequentially stacked between each of the stacks ST and the lower insulating gapfill layer 50.

The first and second horizontal patterns 100a/100b and 110a/110b may be provided in each of the mat regions MTR and may be separated and spaced apart from each other. An insulating layer may be disposed between the first and second horizontal patterns 100a/100b and 110a/110b, and the first and second horizontal patterns 100a/100b and 110a/110b may be in contact with each other.

The first and second horizontal patterns 100a/100b and 110a/110b may be formed of a semiconductor material and may have one of polycrystalline, amorphous, and single-crystalline structures. As an example, the first and second horizontal patterns 100a/100b and 110a/110b may be formed of a poly-silicon layer doped with n-type impurities. Concentrations of n-type impurities in the first horizontal patterns 100a/100b may be different from concentrations of n-type impurities in the second horizontal patters 110a/110b.

The vertical structures VS may be provided to penetrate the stack ST and the second horizontal pattern 110a and 110b in each mat region MTR and may be connected to the first horizontal pattern 100a or 100b.

Referring to FIG. 8C, in each mat region MTR, a source conductive pattern SCP may be disposed between the first and second horizontal patterns 100a/100b and 110a/110b. The source conductive pattern SCP may extend along and be parallel to the bottom surface of the stack ST. The source conductive pattern SCP may be in contact with portions of the side surfaces of the vertical structures VS containing a semiconductor material. The source conductive pattern SCP may form a common source line that is operably connected to the cell strings (e.g., electrically connected to NAND cell strings) formed by the vertical structures VS.

A bottom surface of the source conductive pattern SCP may be in contact with the first horizontal pattern 100a or 100b, and a top surface of the source conductive pattern SCP may be in contact with the second horizontal pattern 110a and 110b. In an embodiment, an insulating layer (not shown) may be disposed between the source conductive pattern SCP and the first horizontal pattern 100a or 100b. The source conductive pattern SCP may be formed of a semiconductor layer doped with n-type dopants. Portions of the second horizontal pattern 110a and 110b may penetrate the source conductive pattern SCP.

The penetrating insulating pattern 105 may penetrate the first and second horizontal patterns 100a/100b and 110a/110b, which are adjacent to each other. The penetrating insulating pattern 105 may be in contact with the lower insulating gapfill layer 50 and may be in contact with the side surfaces of the first and second horizontal patterns 100a/100b and 110a/110b, which are adjacent to each other.

The separation structures DIT may be provided to penetrate the first and second horizontal patterns 100a/100b and 110a/110b in the dummy region DR. Each of the separation structures DIT may include the dummy plug DPLG and the dummy spacer DS surrounding the dummy plug DPLG. The dummy plug DPLG may include the vertical portions P1, which are provided to penetrate the first interlayer insulating layer 160 and the upper insulating gapfill layer 150 in the third direction D3, and first and second horizontal portions P2 and P3, which are disposed in the first and second horizontal patterns 100a/100b and 110a/110b to horizontally connect the vertical portions P1 to each other. The dummy spacer DS may conformally cover the vertical portions P1 and the first and second horizontal portions P2 and P3 of the dummy plug DPLG.

Figure 9A:
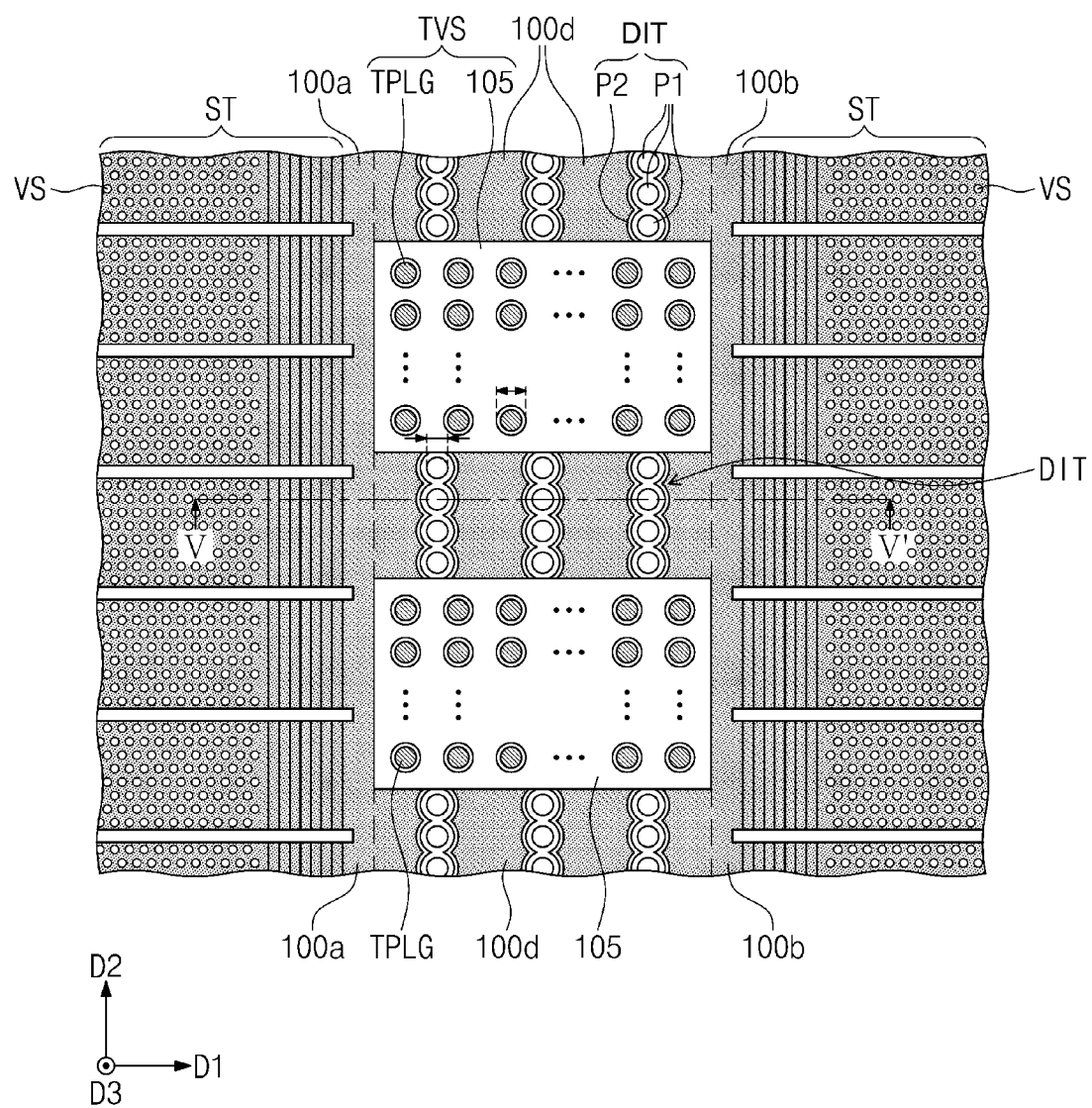
FIG. 9A is a plan view illustrating a portion of a three-dimensional semiconductor memory device according to an embodiment of the inventive concept.
Figure 9B:
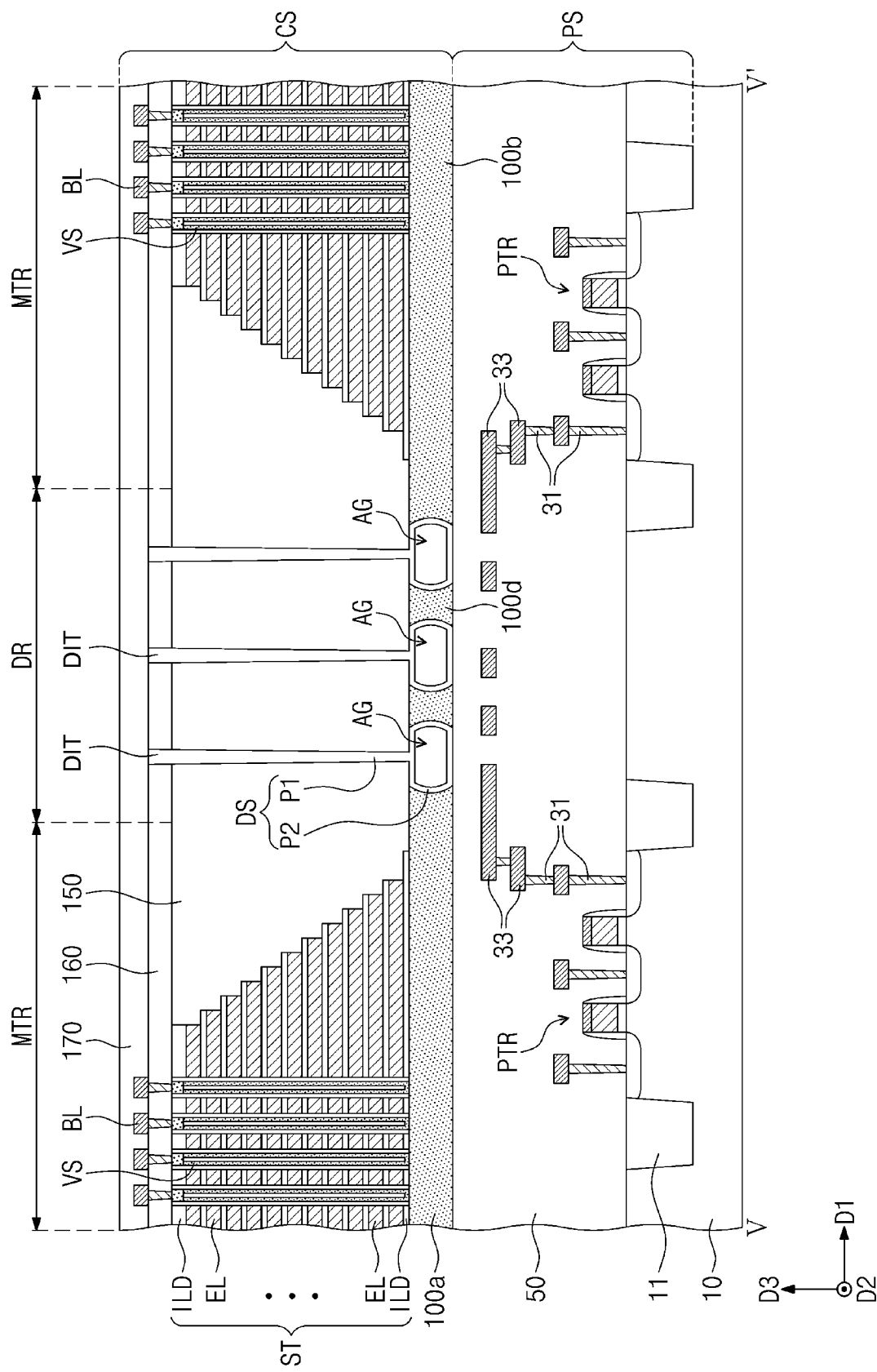
FIG. 9B is a sectional view, which is taken along a line V-V of FIG. 9A to illustrate a three-dimensional semiconductor memory device according to an embodiment of the inventive concept.

FIG. 9A is a plan view illustrating a portion of a three-dimensional semiconductor memory device according to an embodiment of the inventive concept. FIG. 9B is a sectional view, which is taken along a line V-V of FIG. 9A to illustrate a three-dimensional semiconductor memory device according to an embodiment of the inventive concept.

Referring to FIGS. 9A and 9B, the horizontal pattern 100a or 100b may be disposed in each mat region MTR of the cell array structure CS, and the through vias TVS may be disposed in the through hole region THR. In addition, the separation structures DIT may be disposed in each of the dummy regions DR.

Each separation structure DIT may be disposed to extend between and contact adjacent ones of the penetrating insulating patterns 105 (e.g., adjacent to each other in the second direction D2 in FIG. 9A). Plural separation structures DIT may be provided side by side between the horizontal patterns 100a and 100b (e.g., are adjacent to each other in the first direction D1 in FIG. 9A).

The separation structures DIT may be spaced apart from each other in the first direction D1 and the dummy horizontal pattern 100d may be disposed between adjacent ones of the separation structures DIT.

Each of the separation structures DIT may extend in the second direction D2 and may be connected to the penetrating insulating pattern 105. Each of the separation structures DIT may include the material of the dummy spacer DS described herein and may be in contact with the horizontal pattern 100a or 100b in the first direction D1 and with the penetrating insulating pattern 105 in the second direction D2. The separation structures DIT may include vertical portions P1, which extend in the third direction D3, and horizontal portions P2, which horizontally connects the vertical portions P1 to each other. In each separation structure DIT, a diameter A2 of the vertical portions P1 may be smaller than the diameter B1 of the through plug TPLG. Here, the vertical portions P1 and the horizontal portion P2 may be formed of an insulating material. Furthermore, each of the separation structures DIT may include an air gap AG in the horizontal portion P2.

Figure 10A:
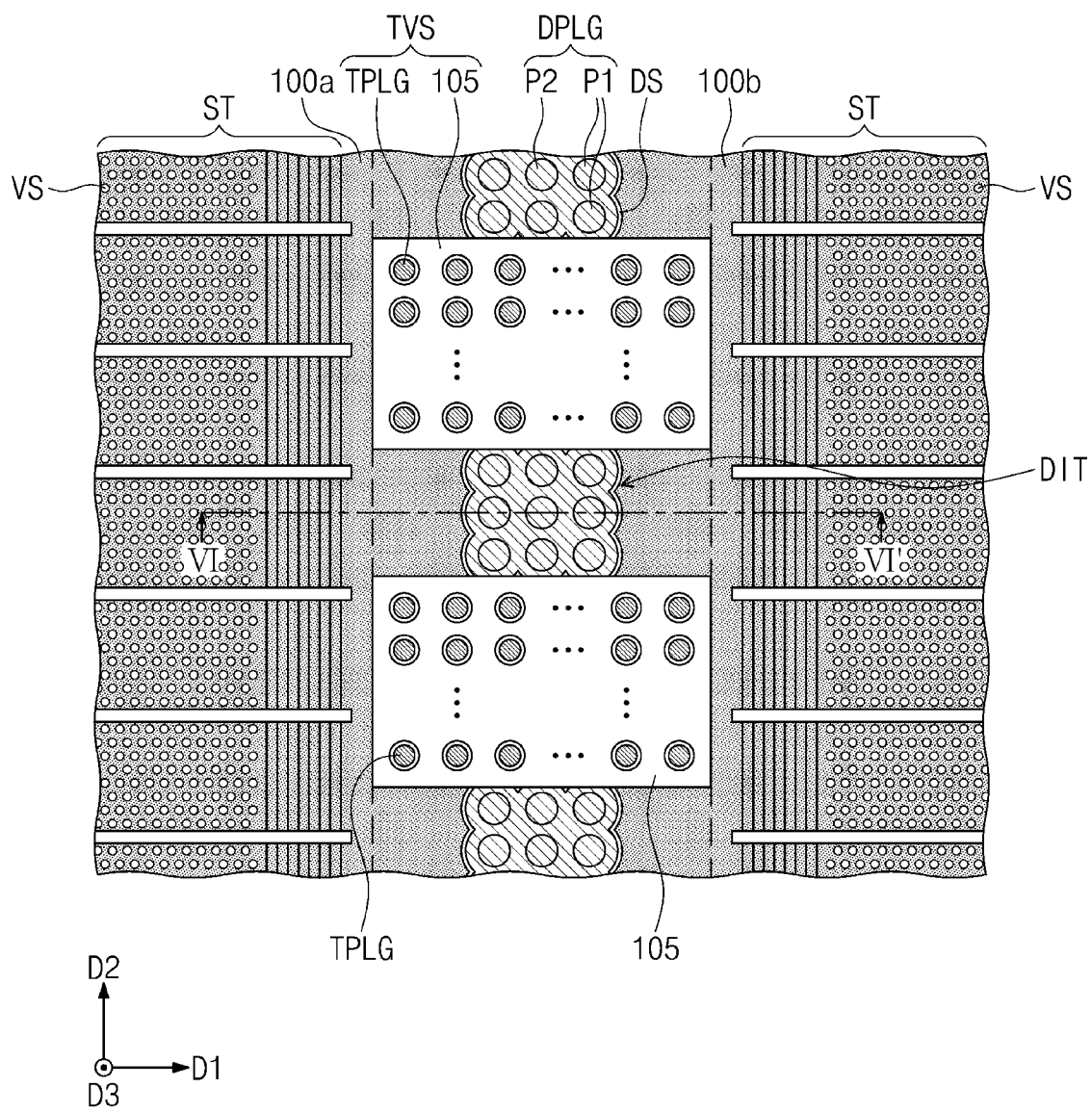
FIG. 10A is a plan view illustrating a portion of a three-dimensional semiconductor memory device according to an embodiment of the inventive concept.
Figure 10B:
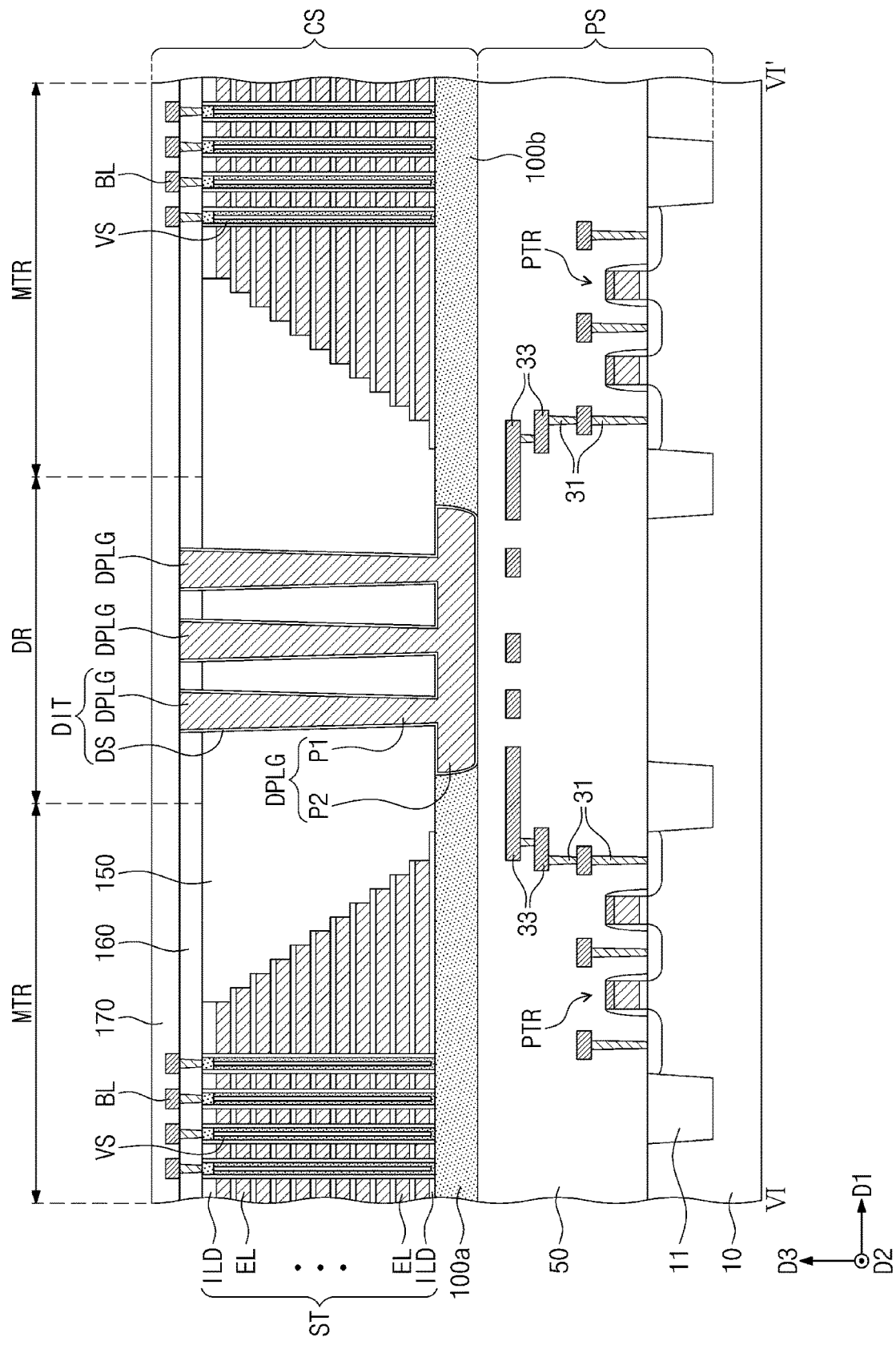
FIG. 10B is a sectional view, which is taken along a line VI-VI' of FIG. 10A to illustrate a three-dimensional semiconductor memory device according to an embodiment of the inventive concept.

FIG. 10A is a plan view illustrating a portion of a three-dimensional semiconductor memory device according to an embodiment of the inventive concept. FIG. 10B is a sectional view, which is taken along a line VI-VI' of FIG. 10A to illustrate a three-dimensional semiconductor memory device according to an embodiment of the inventive concept.

Referring to FIGS. 10A and 10B, a single separation structure DIT may be extend between and contact adjacent penetrating insulating patterns 105 (adjacent to each other in the second direction D2 in FIG. 10A) and may be located between the horizontal patterns 100a and 100b (adjacent to each other in the first direction D1 in FIG. 10A).

The separation structure DIT may include dummy plugs DPLG and the dummy spacers DS surrounding the dummy plugs DPLG. The dummy plugs DPLG may include the vertical portions P1, which are spaced apart from each other in the first and second directions D1 and D2, and share a single horizontal portion P2, which horizontally connects the vertical portions P1 in common.

Figure 10C:
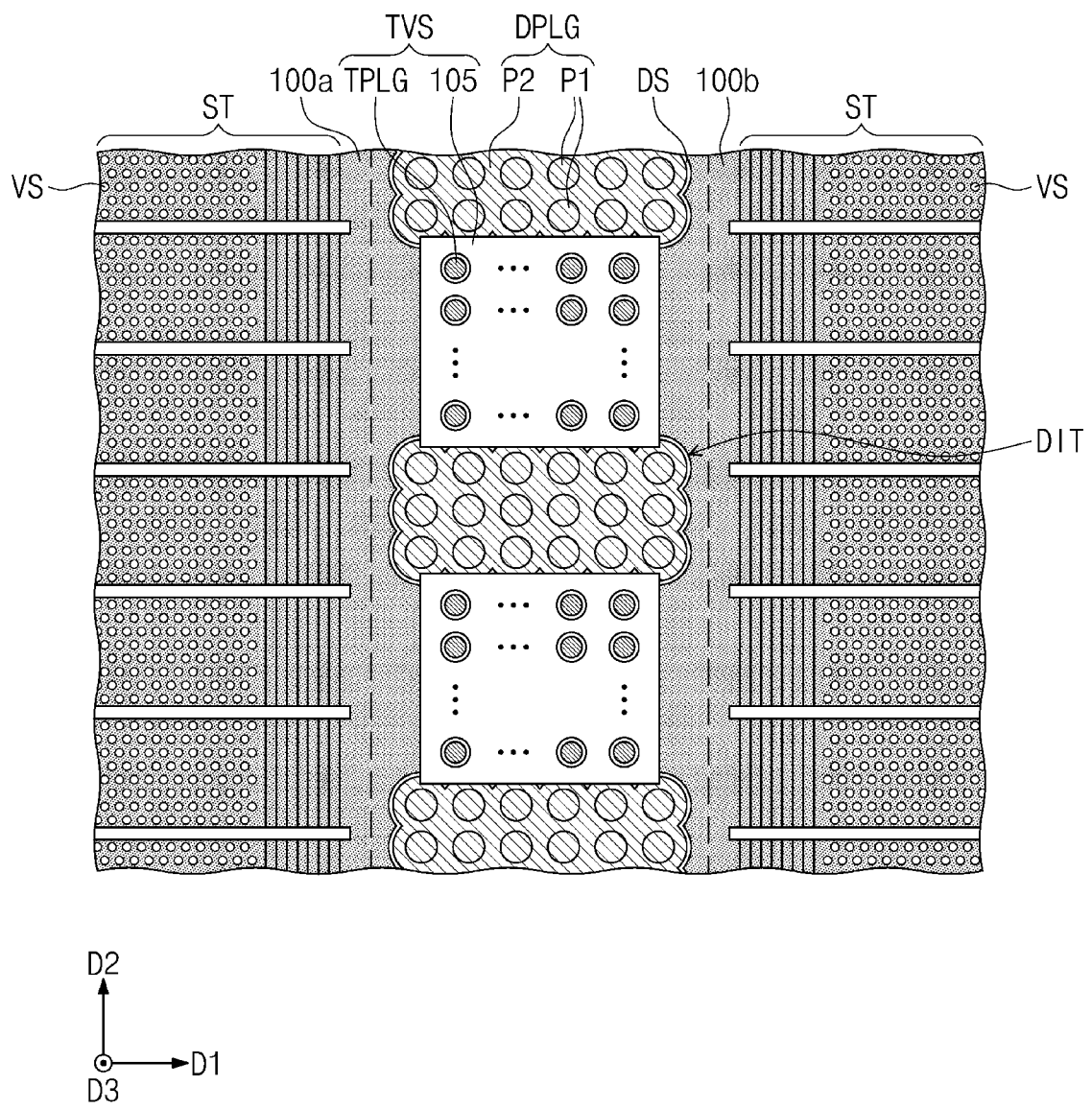
FIGS. 10C and 10D are plan views illustrating a portion of a three-dimensional semiconductor memory device according to some embodiments of the inventive concept.
Figure 10D:
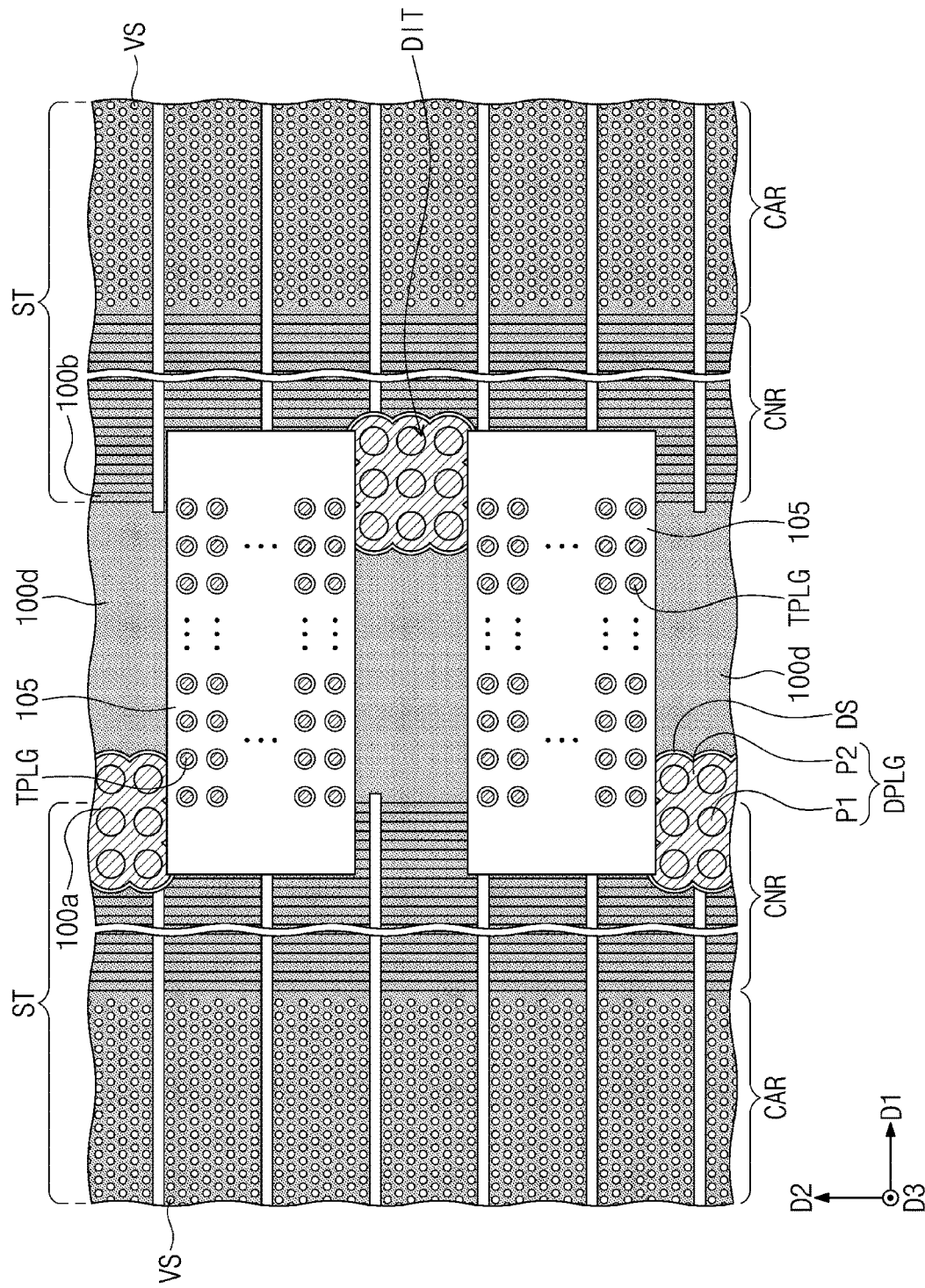

FIGS. 10C and 10D are plan views illustrating a portion of a three-dimensional semiconductor memory device according to some embodiments of the inventive concept. FIGS. 10C and 10D show alternative locations and configurations of the single separation structure DIT (disposed between adjacent groups of through vias TVS) and it will be appreciated that features of the sectional view of FIG. 10B is representative of such alternatives and repetitive description may be omitted.

Referring to FIG. 10C, the separation structure DIT may include a plurality of the vertical portions P1 and one horizontal portion P2, to which the vertical portions P1 are connected in common, and a width of the horizontal portion P2 in the first direction D1 may be larger than a width of the penetrating insulating patterns 105.

Referring to FIG. 10D, the separation structure DIT including the plurality of the vertical portions P1 and the one horizontal portion P2 may penetrate a portion of the staircase structure of the stack ST.

The separation structures DIT may be respectively disposed between the through vias TVS, and here, the separation structures DIT may be staggered along the second direction D2.

Figure 11A:
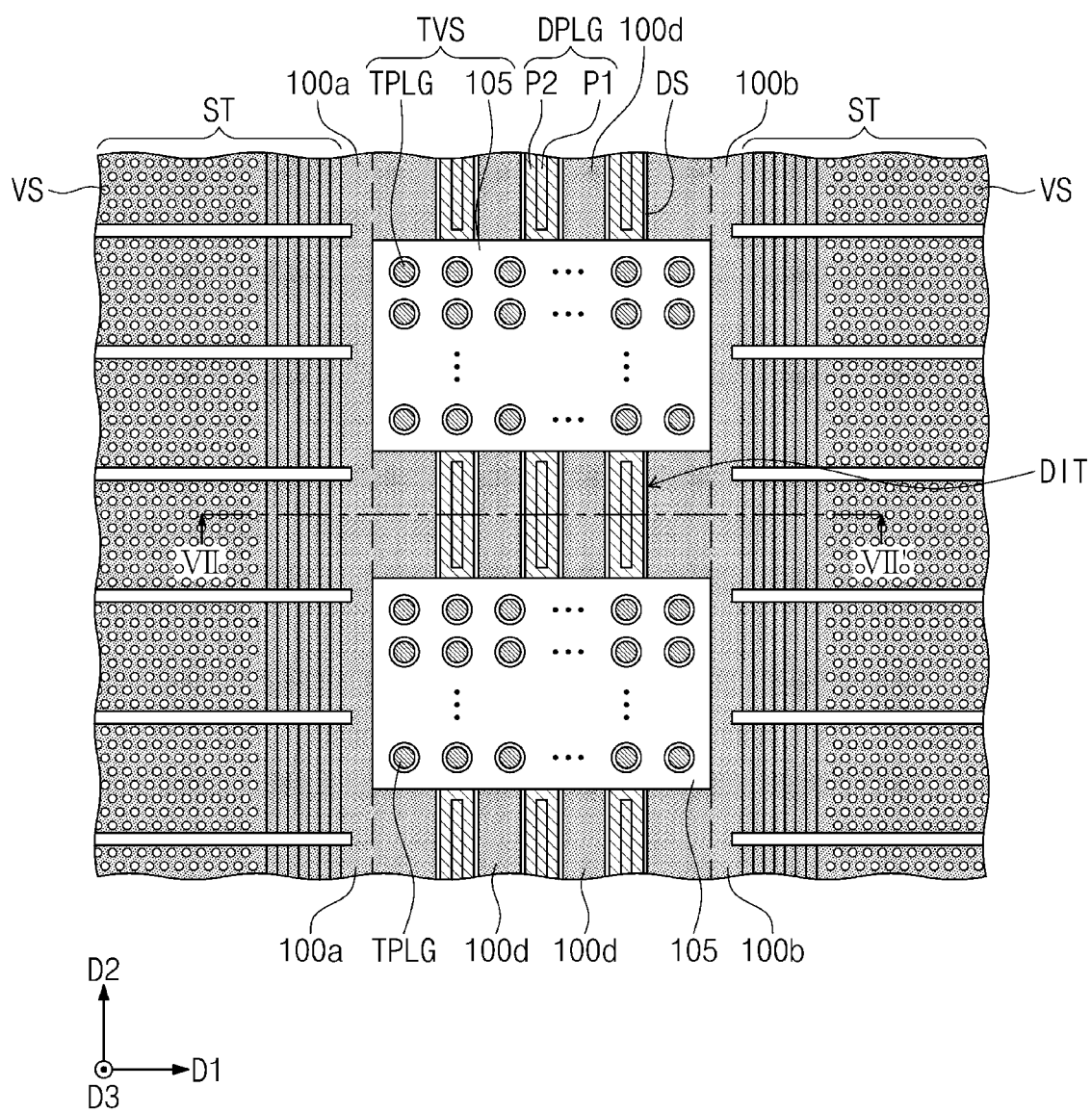
FIG. 11A is a plan view illustrating a portion of a three-dimensional semiconductor memory device according to an embodiment of the inventive concept.
Figure 11B:
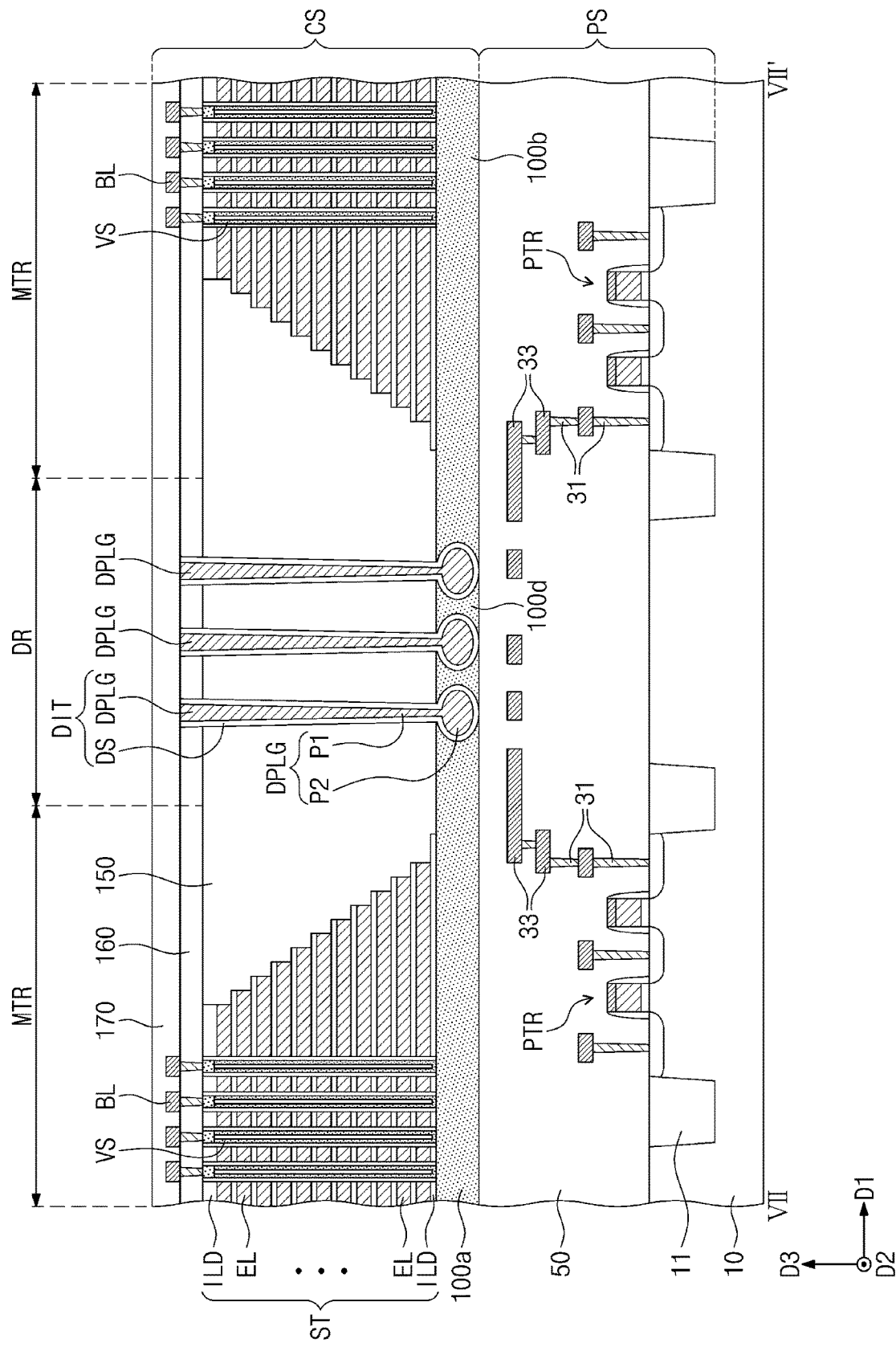
FIGS. 11B and 11C are sectional views, which are taken along a line VII-VII' of FIG. 11A to illustrate three-dimensional semiconductor memory devices according to some embodiments of the inventive concept.
Figure 11C:
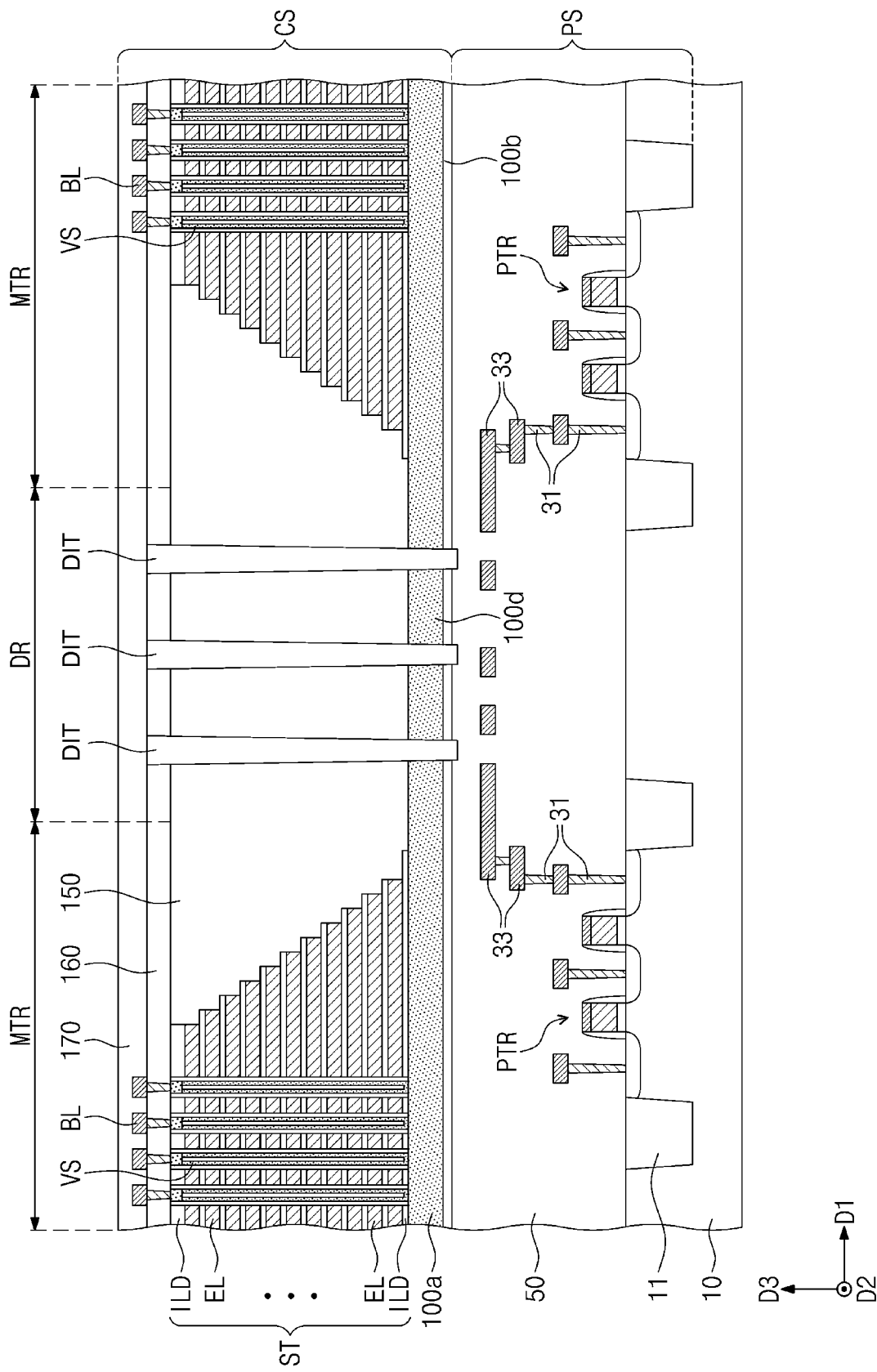

FIG. 11A is a plan view illustrating a portion of a three-dimensional semiconductor memory device according to an embodiment of the inventive concept. FIGS. 11B and 11C are sectional views, which are taken along a line VII-VII' of FIG. 11A to illustrate three-dimensional semiconductor memory devices according to some embodiments of the inventive concept.

Referring to FIGS. 11A and 11B, each of the separation structures DIT may include a dummy plug DPLG and a dummy spacer DS surrounding the dummy plug DPLG. The dummy plug DPLG may be formed of or include the same conductive material as the through plugs TPLG, and the dummy spacer DS may be formed of or include an insulating material. Here, the dummy plug DPLG may penetrate in the third direction D3 and may include the vertical portion P1, whose top surface is shape like a line extended in the second direction D2, and the horizontal portion P2, which protrudes from the vertical portion P1 in a horizontal direction. When measured in the first direction D1, a width of the horizontal portion P2 may be larger than a width of the vertical portion P1. The horizontal portion P2 may have a rounded side surface, and the dummy spacer DS may be disposed between the horizontal portion P2 and the horizontal pattern 100a or 100b.

FIG. 11C shows an alternative structure as compared to FIG. 11B. According to an embodiment shown in FIG. 11C, each of the separation structures DIT may be provided to continuously penetrate the first interlayer insulating layer 160, the upper insulating gapfill layer 150, and a horizontal semiconductor layer 100 and may be line-shaped patterns, which are extended in the second direction D2 and are connected to the through vias TVS adjacent thereto. Here, the separation structures DIT may include pillar-shaped patterns formed of an insulating material (i.e., without a conductive material, such as described with respect to FIG. 9B).

Figure 12A:
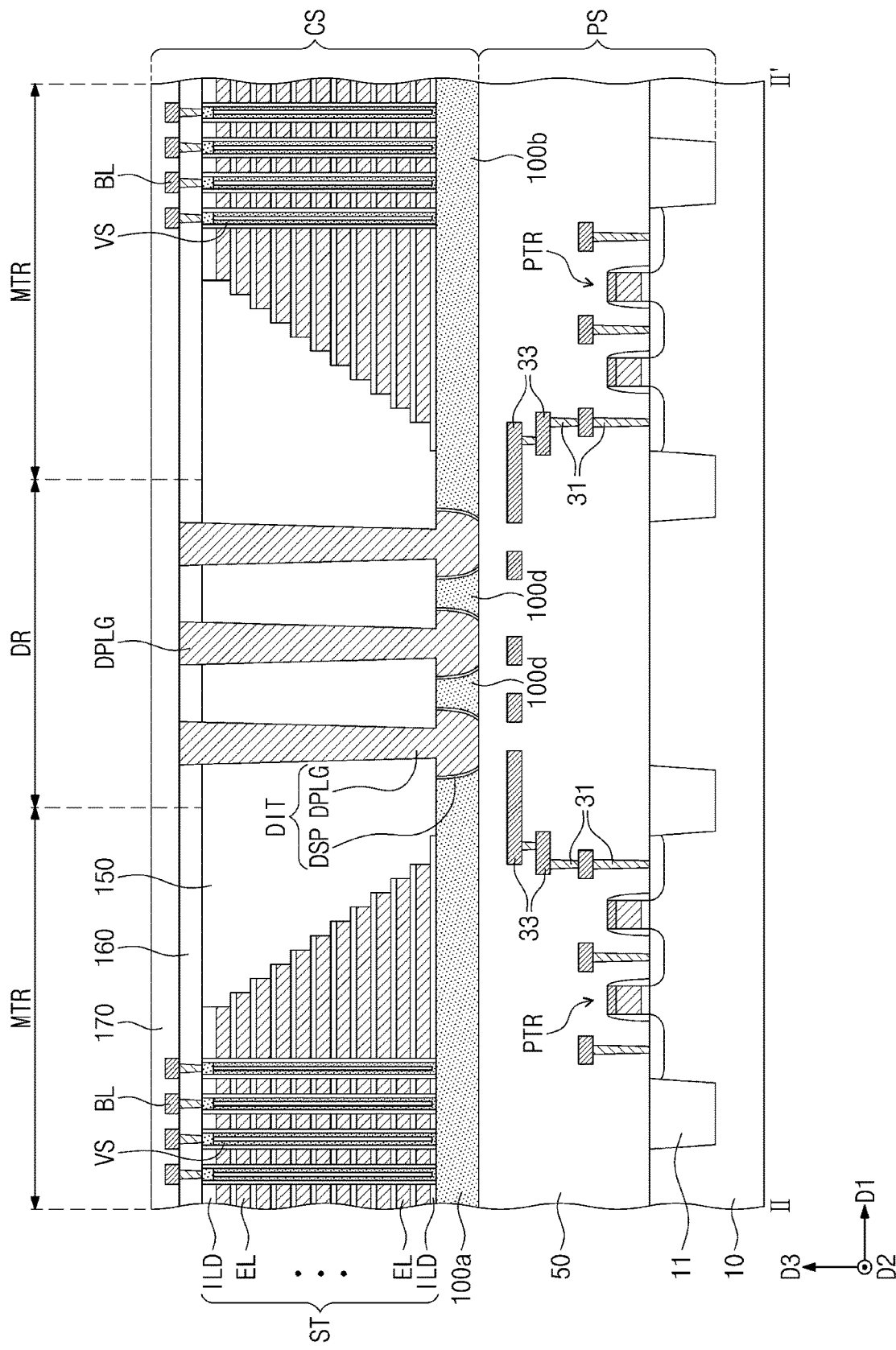
FIGS. 12A and 12B are sectional views, which are taken along lines II-II' and of FIG. 5A to illustrate a three-dimensional semiconductor memory device according to an embodiment of the inventive concept.
Figure 12B:
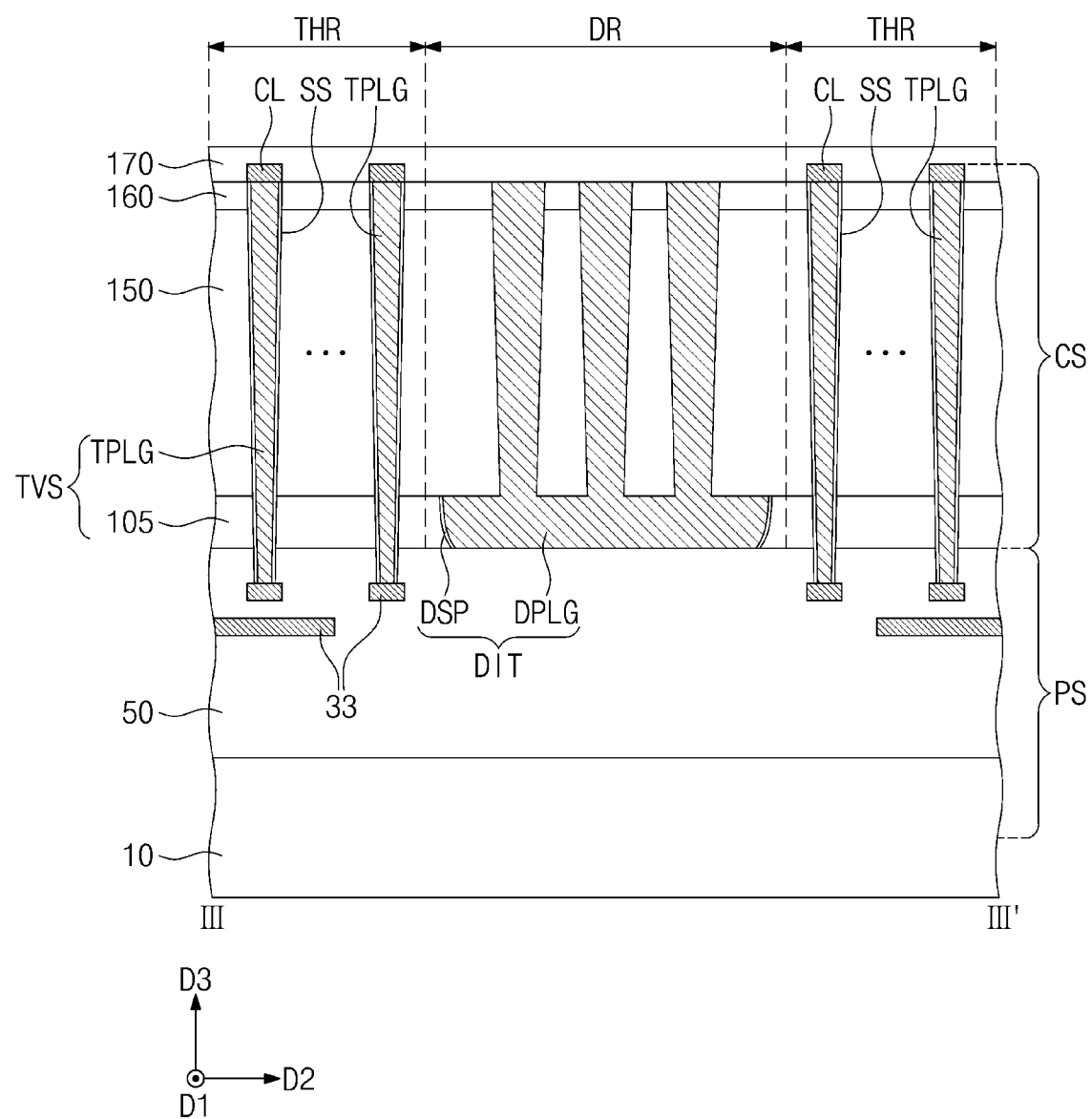

FIGS. 12A and 12B are sectional views, which are taken along lines II-II' and of FIG. 5A to illustrate a three-dimensional semiconductor memory device according to an embodiment of the inventive concept.

Referring to FIGS. 12A and 12B, the separation structure DIT may include the dummy plug DPLG and a dummy spacer pattern DSP, which is provided between the dummy plug DPLG and the horizontal pattern 100a or 100b. Here, the dummy spacer pattern DSP may be disposed between the horizontal portion P2 of the dummy plug DPLG and the side surface of the horizontal pattern 100a or 100b.

Figure 13A:
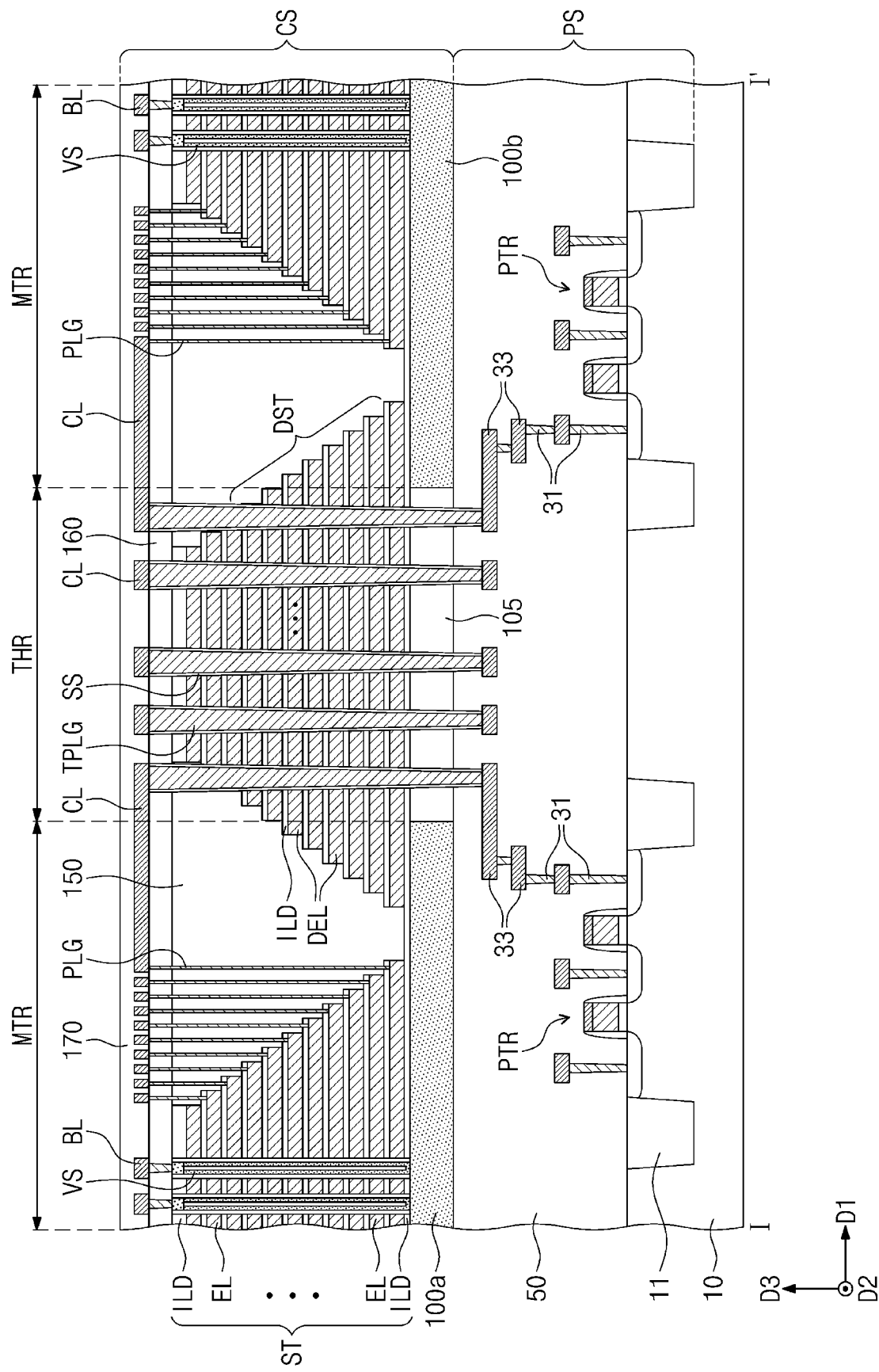
FIGS. 13A, 13B, and 13C are sectional views illustrating a three-dimensional semiconductor memory device according to an embodiment of the inventive concept.
Figure 13B:
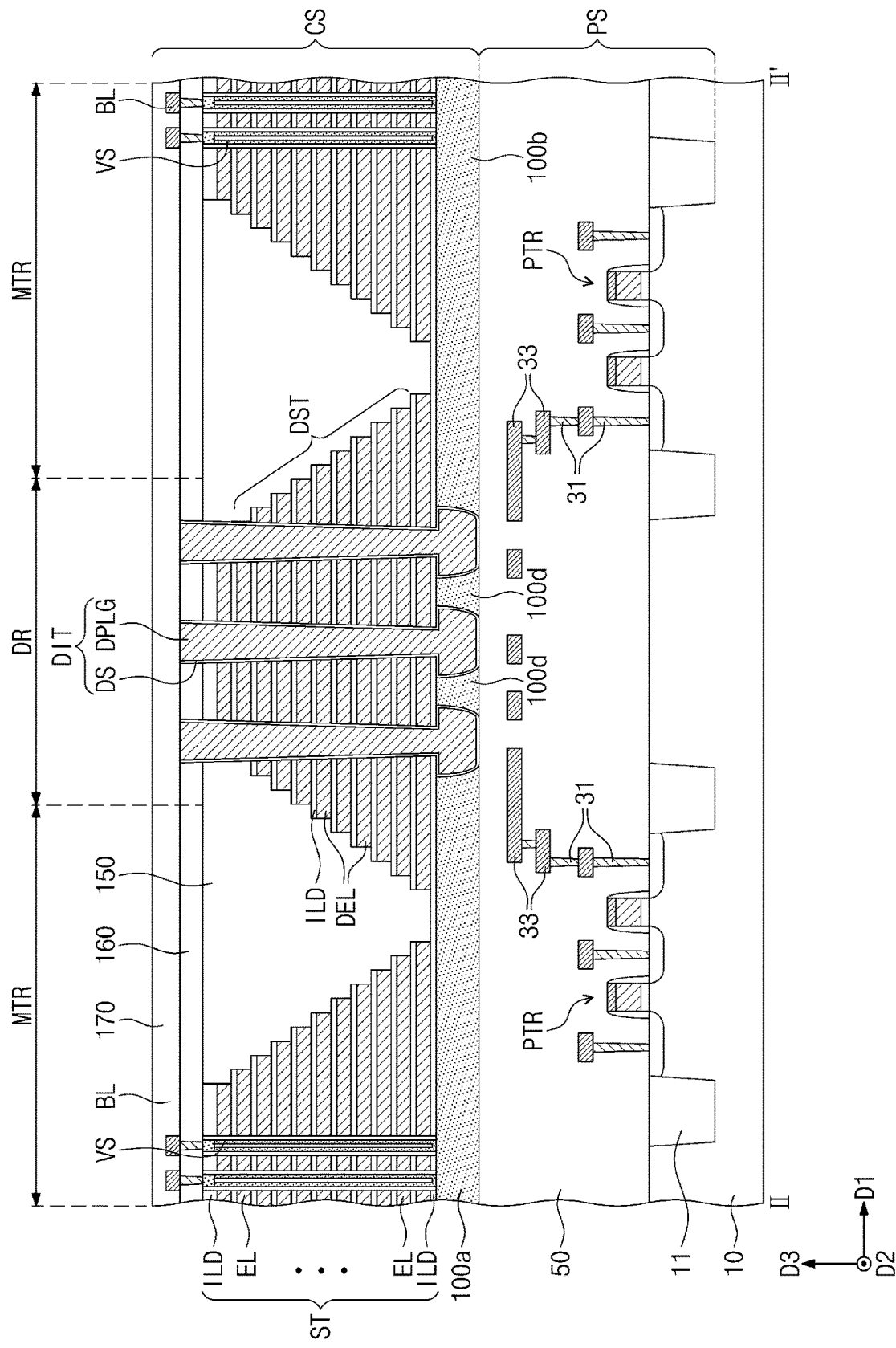
Figure 13C:
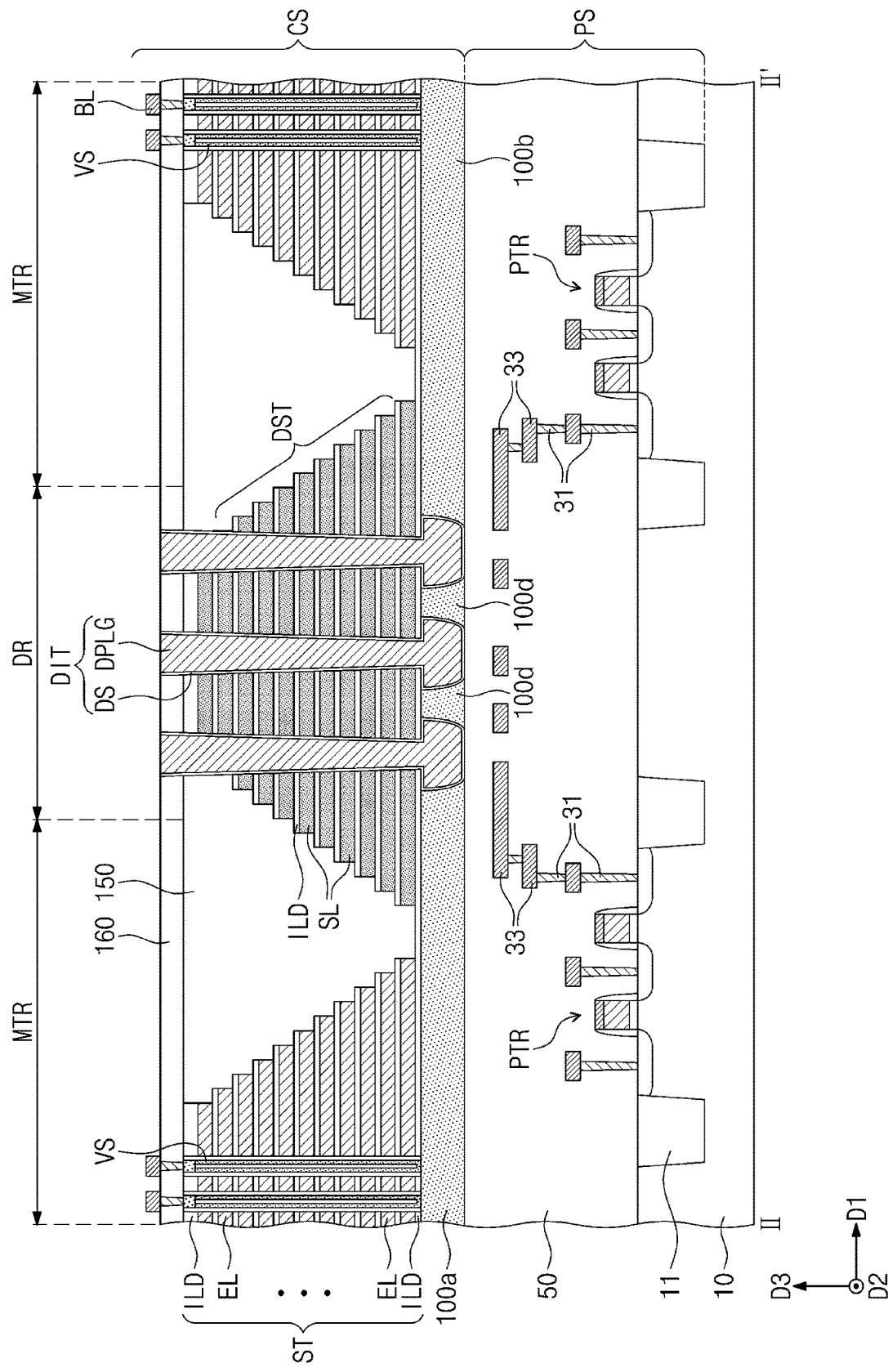

FIGS. 13A, 13B, and 13C are sectional views illustrating a three-dimensional semiconductor memory device according to an embodiment of the inventive concept.

Referring to FIGS. 13A and 13B, a dummy stack DST may be disposed between the mat regions MTR and on the horizontal semiconductor layer 100. The dummy stack DST may include dummy electrodes DEL and the insulating layers ILD, which are vertically and alternately stacked on the horizontal semiconductor layer 100, similar to the stack ST.

The dummy stack DST may be disposed in the through hole region THR and on the penetrating insulating pattern 105. The through plugs TPLG may penetrate the dummy stack DST and the penetrating insulating pattern 105. The sidewall spacers SS may be disposed between the through plugs TPLG and the dummy stack DST. The separation structures DIT may penetrate the dummy stack DST in the dummy region DR. Each of the separation structures DIT may include a dummy plug DPLG and a dummy spacer DS surrounding the dummy plug DPLG. The vertical portions P1 of the dummy plug DPLG may penetrate the dummy stack DST, and the horizontal portion P2 may be disposed between the dummy stack DST and the lower insulating gapfill layer 50.

Referring to FIG. 13C, the dummy stack DST may include sacrificial layers SL and the insulating layers ILD, which are vertically and alternately stacked on the horizontal semiconductor layer 100. The sacrificial layers SL may be formed at the same level as the electrodes EL of the stack ST. The sacrificial layers SL may be patterned from a larger layer of sacrificial material that from sacrificial layers (not shown) that are used in the process of forming the electrodes EL (e.g., for which the electrodes EL are substituted).

FIG. 14 is a plan view schematically illustrating a three-dimensional semiconductor memory device according to an embodiment of the inventive concept.

Referring to FIG. 14, the stack ST may include a cell array region, in which the vertical structures VS are provided, and a connection region, which has a stairstep structure.

First, second and third through hole regions THR1, THR2 and THR3 may be provided, each including a corresponding penetrating insulating patterns 105 that penetrates the horizontal semiconductor layer 100 (as described herein) and includes a plurality of through vias TVS (individual through vias not illustrated in FIG. 14). Through vias TVS1 may penetrate a region between the vertical structures VS and the stairstep structure of the stack ST. Second through vias TVS2 may penetrate a portion of the staircase structure of the stack ST. Furthermore, third through vias TVS3 may be provided between the vertical structures VS penetrating the stack ST. In other words, the third through vias TVS3 may be provided in a portion of the cell array region, in which the memory cells are provided. The first, second, and third through vias TVS1, TVS2, and TVS3 may include through plugs TPLG, which connect the cell array structure CS to the peripheral circuit structure PS, as described above. The separation structure DIT may be disposed between adjacent ones of the stacks ST to separate adjacent ones of the horizontal patterns 100a and 100b from each other. The separation structure DIT may be configured to have the same structure as any one of those separation structures DIT described herein, such as with reference to FIGS. 5A to 13C.

Figure 15:
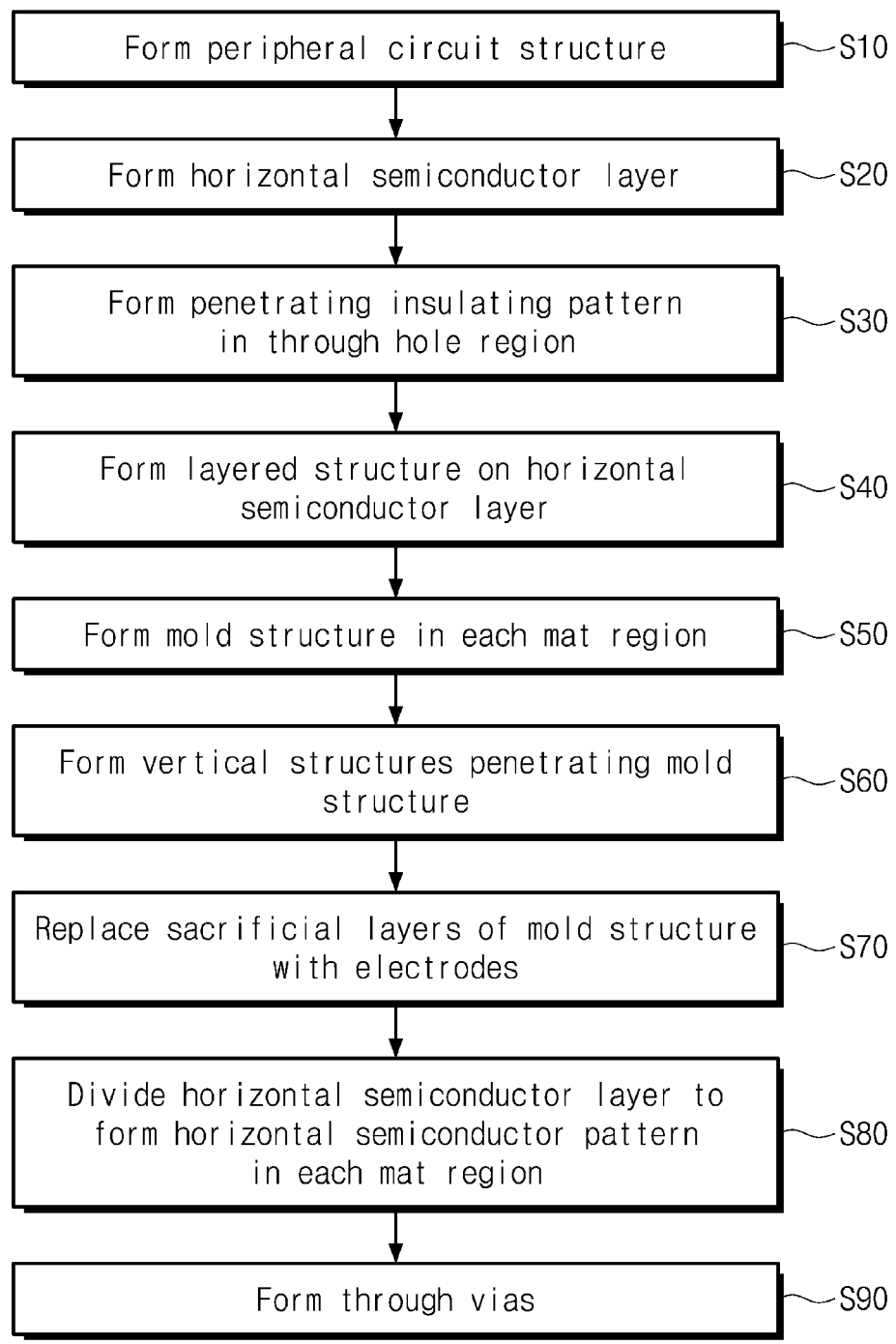
FIG. 15 is a flow chart illustrating a method of fabricating a three-dimensional semiconductor memory device, according to an embodiment of the inventive concept.
Figure 17A:
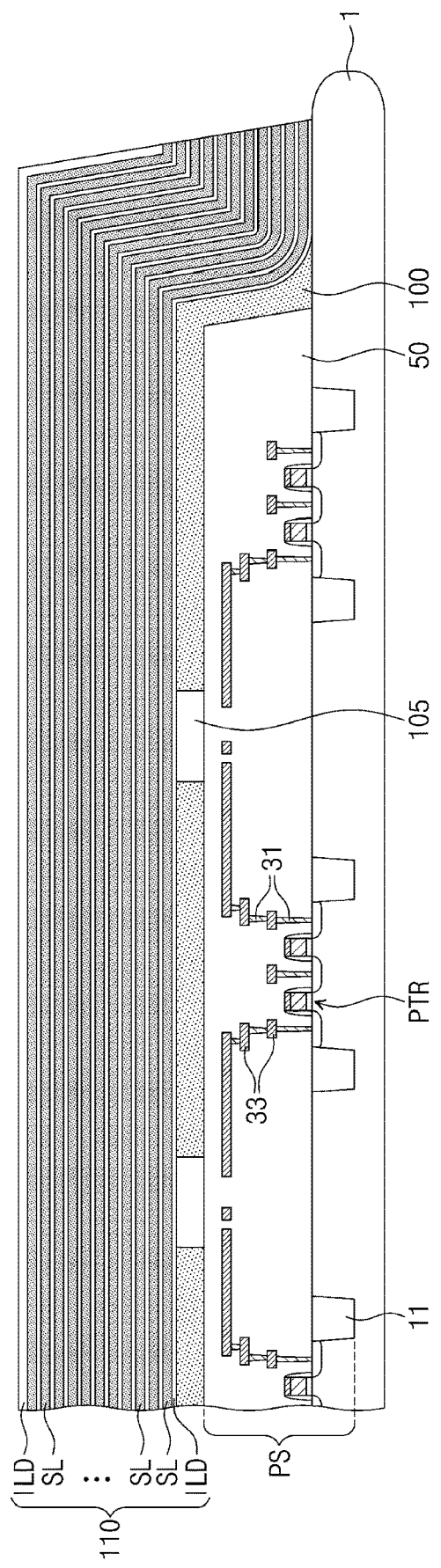
Figure 17B:
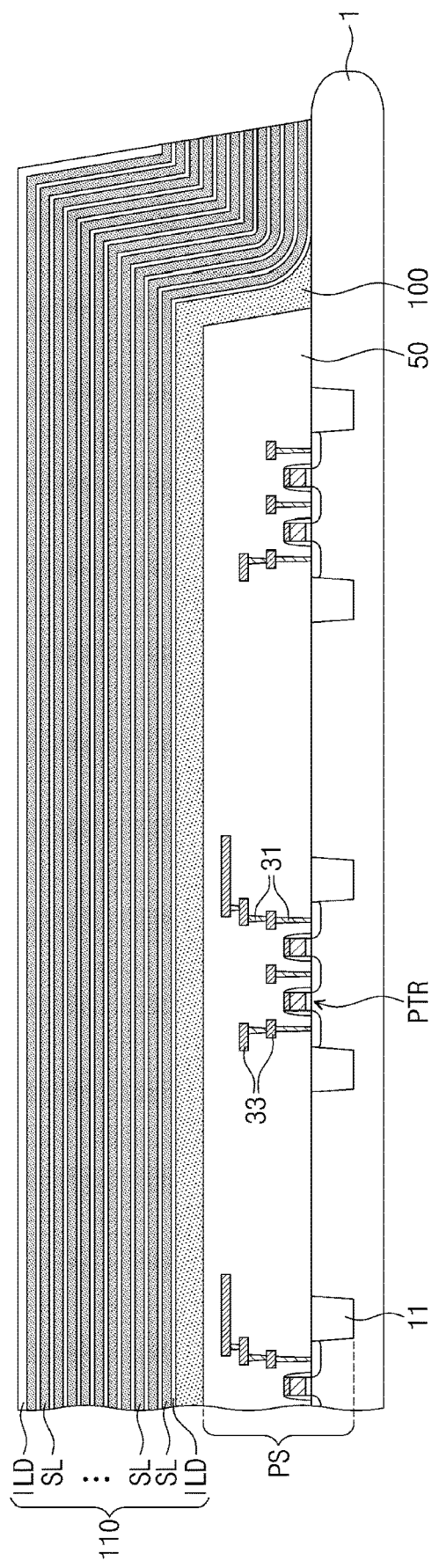
Figure 18A:
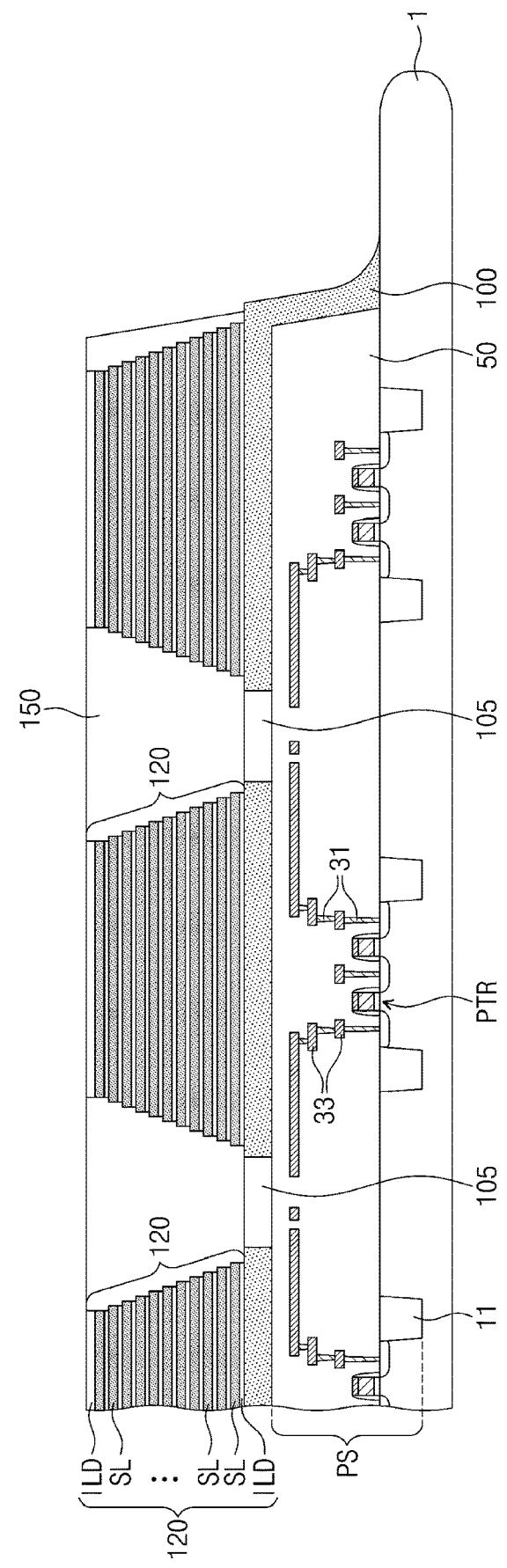
Figure 18B:
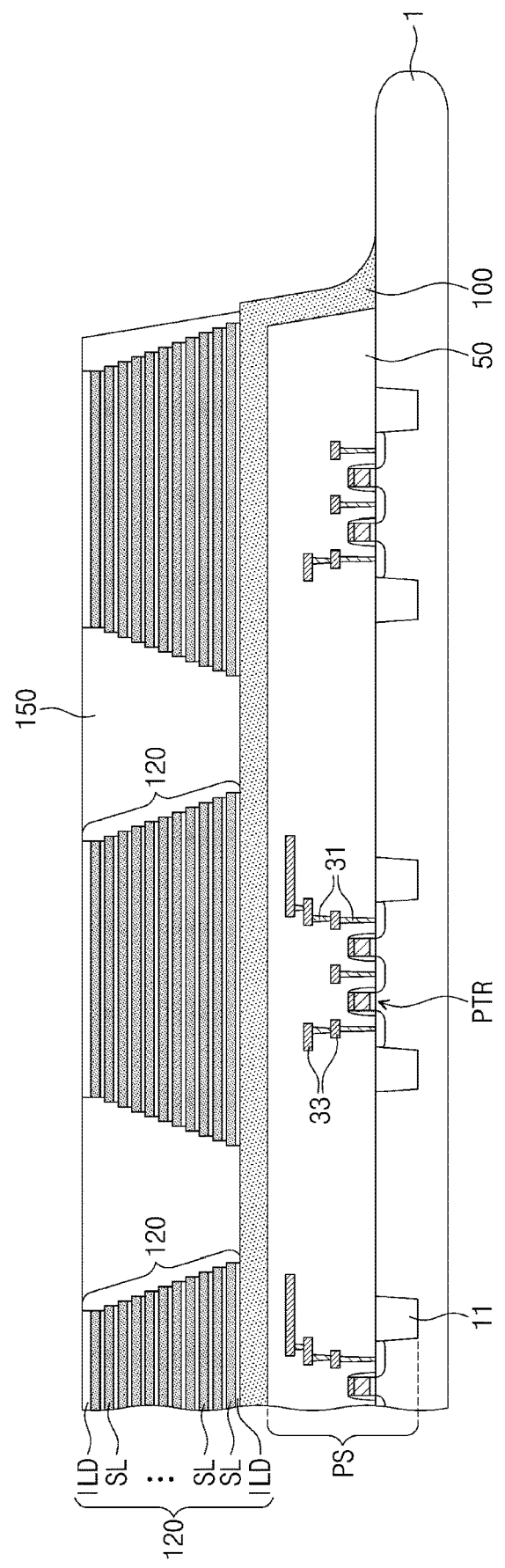

FIG. 15 is a flow chart illustrating a method of fabricating a three-dimensional semiconductor memory device, according to an embodiment of the inventive concept. FIGS. 16A to 23A and 16B to 23B are diagrams illustrating a method of fabricating a three-dimensional semiconductor memory device, according to an embodiment of the inventive concept. FIGS. 16A to 23A illustrate vertical sections of a portion, on which through vias are formed, and FIGS. 16B to 23B illustrate vertical sections of a portion, on which separation structures are formed.

Referring to FIGS. 4A, 15, 16A, and 16B, the peripheral circuit structure PS may be formed on the semiconductor substrate 1 (in S10).

The semiconductor substrate 1 may include chip regions and a scribe line region, as previously described with reference to FIG. 1. The semiconductor substrate 1 may be a crystalline silicon (or other crystalline semiconductor) wafer.

The formation of the peripheral circuit structure PS may include forming the peripheral transistors PTR within and/or on the semiconductor substrate 1, forming the peripheral interconnection structures 31 and 33 to provide electrical connections to and between peripheral transistors PTR, and forming the lower insulating gapfill layer 50 (e.g., comprising several interlayer dielectric layers of the peripheral circuit structure PS to insulate various ones of the peripheral interconnection structures 31 and 33 from one another). Peripheral logic circuits may be formed by the interconnection of several peripheral transistors PTR, such as by peripheral interconnection structures 31 and 33. In addition, the peripheral interconnection structures 31 and 33 may connect peripheral logic circuits to a corresponding one or more of the through vias TVS as shown in FIG. 6A. It will be appreciated that the peripheral interconnection structures 31 and 33 and the peripheral transistors PTR illustrated in the figures is simplified for explanation purposes, and that many more peripheral transistors PTR and more complex electrical interconnections between the same will typically be implemented.

The row and column decoders, the page buffers, and the control circuits, which constitute the peripheral logic circuits formed by interconnected peripheral transistors PTR, may be formed at each chip region of the semiconductor substrate 1. As an example, the formation of the peripheral logic circuits may include forming the device isolation layer(s) 11 in trenches formed in the semiconductor substrate 1 (the device isolation layer(s) 11 defining active regions in the semiconductor substrate 1). Each peripheral transistor may be formed by sequentially forming a peripheral gate insulating layer and a peripheral gate electrode on the semiconductor substrate 1, and injecting impurities into portions of the semiconductor substrate 1 at both sides of the peripheral gate electrode to form corresponding source/drain regions of the peripheral transistor PTR within the semiconductor substrate 1. Gate spacers may be formed on side surfaces of the peripheral gate electrode.

The formation of the peripheral interconnection structures 31 and 33 may include forming the peripheral contact plugs 31 to penetrate portions of the lower insulating gapfill layer 50 and forming the peripheral circuit wires 33 connected to the peripheral contact plugs 31.

After the formation of the peripheral transistors PTR and peripheral interconnection structure, additional layers of the lower insulating gapfill layer 50 may be formed to cover the entire top surface of the semiconductor substrate 1. The lower insulating gapfill layer 50 may have a planarized top surface and may be patterned to expose a top surface of an edge portion of the semiconductor substrate 1.

The lower insulating gapfill layer 50 may include a single insulating layer or a plurality of stacked insulating layers which may include, for example, one or more silicon oxide layers, one or more silicon nitride layers, one or more silicon oxynitride layers and/or one or more low-k dielectric layers.

After the formation of the peripheral circuit structure PS, the horizontal semiconductor layer 100 may be formed to cover the peripheral circuit structure PS (in S20).

In detail, the horizontal semiconductor layer 100 may be formed on the lower insulating gapfill layer 50. The horizontal semiconductor layer 100 may be formed of a semiconductor material and may have a single- or poly-crystalline structure. Portions of the horizontal semiconductor layer 100 may be made conductive by doping the horizontal semiconductor layer 100 with charge carrier dopants. By selective doping of the horizontal semiconductor layer 100, wiring may be formed therein to interconnect various elements of the cell array structure CS. In some examples, selective doping of the horizontal semiconductor layer 100 may form source/drain regions of transistors formed on and/or in the horizontal semiconductor layer 100.

The horizontal semiconductor layer 100 may be formed on the top surface of the semiconductor substrate 1 using a deposition process. The horizontal semiconductor layer 100 may be epitaxially grown on the top surface of the semiconductor substrate 1. In an embodiment, the horizontal semiconductor layer 100 may be formed to extend in the first and second directions D1 and D2 crossing each other, when viewed in a plan view, and may cover a plurality of the chip regions 10 (e.g., see FIG. 1) of the semiconductor substrate 1. In each chip region 10 (e.g., see FIG. 1), the horizontal semiconductor layer 100 may include a plurality of the mat regions MTR and the through hole regions THR therebetween.

As an example, the horizontal semiconductor layer 100 may be formed by depositing a poly-silicon layer on the semiconductor substrate 1. In an embodiment, the poly-silicon layer may be doped with impurities of a first conductivity type, during its deposition process. Alternatively, the horizontal semiconductor layer 100 may be formed by depositing an undoped poly-silicon layer and then doping the undoped poly-silicon layer with impurities of a first conductivity type.

In an embodiment, since the horizontal semiconductor layer 100 is formed by a blanket deposition process, the horizontal semiconductor layer 100 may be formed to cover top and side surfaces of the lower insulating gapfill layer 50 and the top surface of the edge portion of the semiconductor substrate 1. Thus, the horizontal semiconductor layer 100 may be in contact with the semiconductor substrate 1, in the edge portion of the semiconductor substrate 1. The top surface of the horizontal semiconductor layer 100 (at least the top surface of the horizontal semiconductor layer 100 formed within the chip regions 10) may be substantially planar (such as by performing a planarization process, e.g., CMP, after blanket deposition or epitaxial growth of the horizontal semiconductor layer 100 material).

Next, the penetrating insulating patterns 105 may be formed to penetrate portions of the horizontal semiconductor layer 100 (in S30).

In detail, after the formation of the horizontal semiconductor layer 100, portions of the horizontal semiconductor layer 100 between the mat regions MTR may be etched to form openings exposing the lower insulating gapfill layer 50. The openings may be formed between the mat regions MTR. Thereafter, an insulating material may be deposited in the openings formed in the horizontal semiconductor layer 100 to form the penetrating insulating patterns 105. Thus, the penetrating insulating patterns 105 may be formed to penetrate portions of the horizontal semiconductor layer 100, between the mat regions MTR.

Referring to FIGS. 4A, 15, 17A, and 17B, a layered structure 110 may be formed to cover a top surface of the horizontal semiconductor layer 100 (in S40).

The layered structure 110 may include the sacrificial layers SL and the insulating layers ILD, which are alternately and repeatedly stacked. In the layered structure 110, the sacrificial layers SL may have substantially the same thickness. The sacrificial layers SL and the insulating layers ILD may be formed by a thermal chemical vapor deposition (thermal CVD) process, plasma-enhanced CVD process, or an atomic layer deposition (ALD) process. Since the layered structure 110 is formed by the deposition process, the layered structure 110 may extend from a top surface of the horizontal semiconductor layer 100 to a top surface of the semiconductor substrate 1.

In the layered structure 110, the sacrificial layers SL may be formed of a material, which can be selectively etched and removed without the significant etching of the insulating layers ILD. In an embodiment, the sacrificial layers SL and the insulating layers ILD may have high etch selectivity in a wet etching process, in which a chemical solution is used, or may have low etch selectivity in a dry etching process, in which an etching gas is used. As an example, the sacrificial layers SL and the insulating layers ILD may be formed of insulating materials, which have an etch selectivity with respect to each other. For example, the sacrificial layers SL may be formed of a silicon nitride layer, and the insulating layers ILD may be formed of a silicon oxide layer.

Referring to FIGS. 4A, 15, 18A, and 18B, a patterning process may be performed on the layered structure 110 to form a mold structure 120 in each mat region MTR (in S50).

The mold structures 120 may be formed by performing a trimming process on the layered structure 110. Here, the trimming process may include steps of forming a mask pattern (not shown) on a layered structure, etching a portion of the layered structure, reducing a horizontal area of the mask pattern, and removing the mask pattern, and here, the steps of etching a portion of the layered structure and reducing the horizontal area of the mask pattern may be repeated several times, before the step of removing the mask pattern. As a result of the trimming process, each of the mold structures 120 may have a stairstep structure in an edge portion of each of the mat regions MTR. Meanwhile, the outermost portion of the mold structure 120 near the edge portion of the semiconductor substrate 1 may extend to cover the side surface of the peripheral circuit structure PS and to be in contact with the edge portion of the semiconductor substrate 1.

The upper insulating gapfill layer 150 may be formed on the horizontal semiconductor layer 100, on which the mold structures 120 are formed. The formation of the upper insulating gapfill layer 150 may include depositing a thick insulating layer to cover the mold structures 120 and performing a planarization process on the insulating layer. The upper insulating gapfill layer 150 may be formed of an insulating material, which has an etch selectivity with respect to the sacrificial layers SL.

Referring to FIGS. 4A, 19A, 19B, 20A, and 20B, a plurality of vertical structures may be formed to penetrate each mold structure (in S60).

Figure 19A:
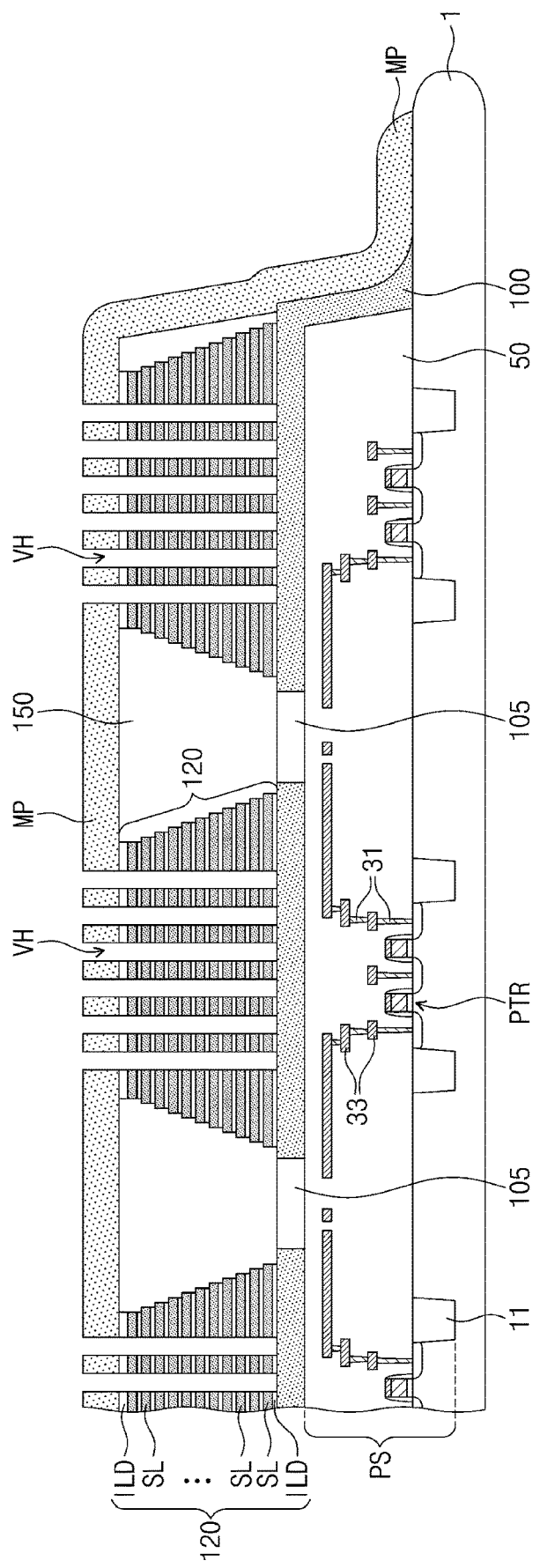
Figure 19B:
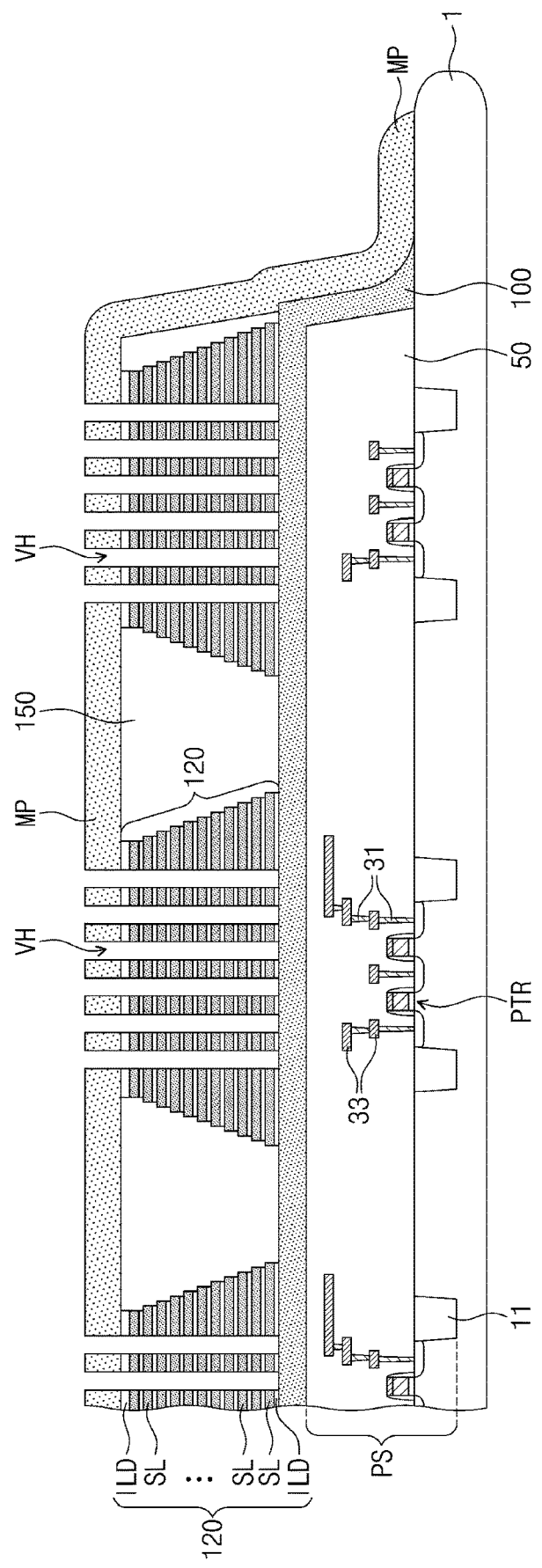

In detail, referring to FIGS. 19A and 19B, after the formation of the upper insulating gapfill layer 150, a hard mask layer MP may be formed to have openings, which expose portions of each mold structure 120. The hard mask layer MP may be formed of or include at least one of silicon-containing materials (e.g., silicon oxide, silicon nitride, silicon oxynitride, or poly silicon), carbon-containing materials (e.g., amorphous carbon layer (ACL) or spin-on hardmask (SOH)), metallic materials (e.g., tungsten), or organic materials.

In some embodiments, the hard mask layer MP may be formed to cover the top surface of the semiconductor substrate 1 and may be in contact with the horizontal semiconductor layer 100 and the top surface of the edge portion of the semiconductor substrate 1, in the edge portion of the semiconductor substrate 1.

Next, the portions of the mold structures 120, which are exposed through the openings of the hard mask layer MP, may be anisotropically etched to form vertical holes VH, which expose the horizontal semiconductor layer 100, in each of the mold structures 120. The vertical holes VH may be arranged in a specific direction (e.g., linearly) or may be arranged in a zigzag formation, when viewed in a plan view. Here, the anisotropic etching process on the mold structures 120 may be, for example, a plasma etching process, a reactive ion etching (ME) process, an inductively coupled plasma reactive ion etching (ICP-RIE) process, or an ion beam etching (IBE) process.

In an embodiment, when the anisotropic etching process is performed using high-power plasma, positive charges, which are induced by ions and/or radicals in the plasma, may be accumulated or charged on a surface of the horizontal semiconductor layer 100 exposed through the vertical holes VH.

Furthermore, according to an embodiment of the inventive concept, the semiconductor substrate 1 may be placed on a supporter (not shown) of a semiconductor fabrication system, during the fabrication of the three-dimensional semiconductor device, and a ground voltage from the supporter may be applied to the semiconductor substrate 1, during the anisotropic etching process to form the vertical holes VH.

Since, during the anisotropic etching process using the plasma, portions of the horizontal semiconductor layer 100 in the mat regions MTR are connected to each other and are continuous with the top surface of the edge portion of the semiconductor substrate 1, the positive charges, which are accumulated in the horizontal semiconductor layer 100 during the formation of the vertical holes VH, may be discharged through the semiconductor substrate 1. For example, the horizontal semiconductor layer 100 formed in each of the mat regions MTR are each connected to each other by other portions of the horizontal semiconductor layer 100. For example, each of the portions of the horizontal semiconductor layer 100 formed in each of the mat regions MTR in some or all of the chip regions 10 may have an electrical path to the same discharge location (e.g., at a top surface of the edge portion of the semiconductor substrate 1).

Since, during the formation of the vertical holes VH, the ground voltage is applied to the horizontal semiconductor layer 100, which is a single continuous layer throughout the semiconductor substrate 1, it may be possible to prevent an arcing phenomenon from occurring in the horizontal semiconductor layer 100 by the positive charges accumulated in the horizontal semiconductor layer 100.

Furthermore, in the case where the hard mask layer MP includes an amorphous carbon layer (ACL), negative charges may be accumulated or charged in the amorphous carbon layer during the anisotropic etching process using plasma. In this case, since the hard mask layer MP is in contact with the semiconductor substrate 1 and the horizontal semiconductor layer 100 in the edge portion of the semiconductor substrate 1, the negative charges in the hard mask layer MP may be discharged through the semiconductor substrate 1. Portions of the hard mask layer MP in each mat regions MTR in each of the chip regions 10 For example, the hard mask layer MP formed in each of the mat regions MTR are each connected to each other by other portions of the hard mask layer MP. For example, each of the portions of the hard mask layer MP formed in each of the mat regions MTR in some or all of the chip regions 10 may have an electrical path to the same discharge location (e.g., at a top surface of the edge portion of the semiconductor substrate 1).

Figure 20A:
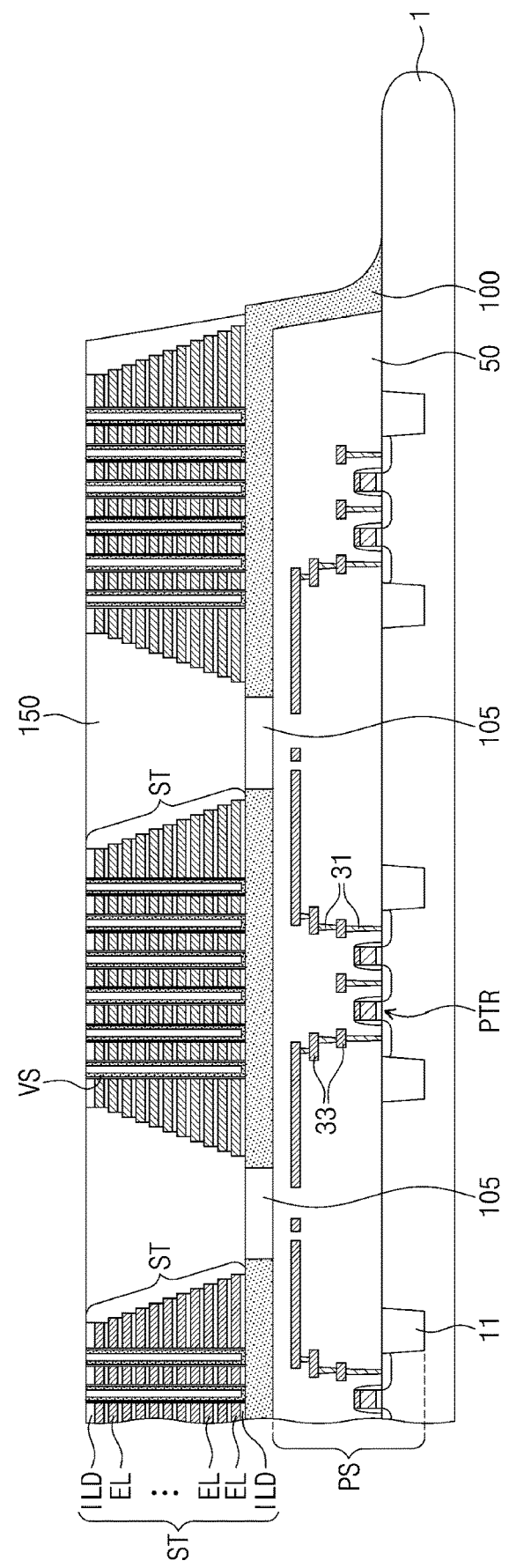
Figure 20B:
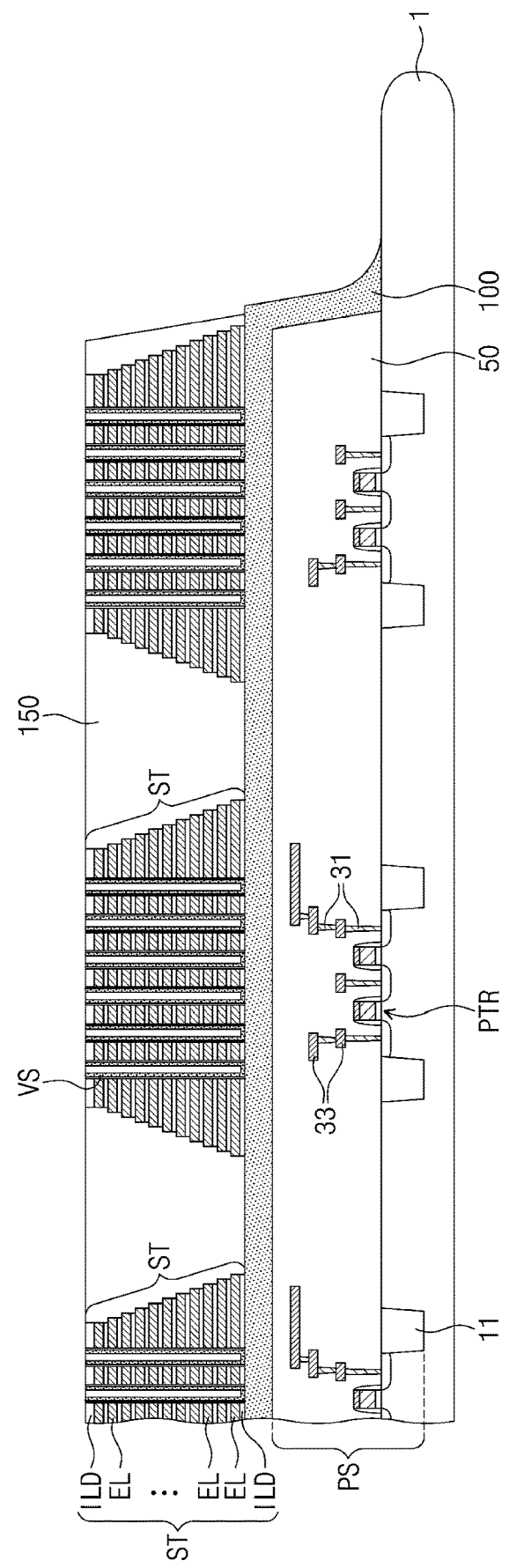

Next, referring to FIGS. 20A and 20B, the vertical structures VS may be formed in the vertical holes VH. The vertical structures VS may be formed of or include at least one of semiconductor or conductive materials, as described above.

The formation of the vertical structures VS may include forming a semiconductor spacer to expose the horizontal semiconductor layer 100 and cover the side surfaces of the openings and forming a semiconductor body portion connected to the horizontal semiconductor layer 100. The vertical structures VS may include a semiconductor material (e.g., silicon (Si), germanium (Ge), or mixtures thereof) and may be a doped semiconductor material or an intrinsic semiconductor material. The vertical structures VS may be connected to the horizontal semiconductor layer 100. Furthermore, a conductive pad may be provided on the vertical structure VS (such as, e.g., upper semiconductor pattern USP of FIG. 6D). The conductive pad may be an impurity region doped with impurities or may be formed of a conductive material.

Furthermore, before forming the vertical structures VS in the vertical holes VH, the vertical insulating patterns VP may be formed in the vertical holes VH. The vertical insulating pattern VP may be formed of a single thin film or a plurality of thin films. In some embodiments, the vertical insulating pattern VP may be a part of a data storing layer.

Next, referring to FIGS. 4A, 20A, and 20B, after the formation of the vertical structures VS, the sacrificial layers SL of the mold structures 120 may be replaced with the electrodes EL (in S70). Accordingly, the stacks ST may be formed on the horizontal semiconductor layer 100, and here, each of the stacks ST may include the electrodes EL, which are vertically stacked. In some examples, portions of the sacrificial layer SL of the mold structures 120 may be left unetched and remain after removal of other portions of the sacrificial layers SL (e.g., to form dummy stacks DST described with respect to FIGS. 13A to 13C).

In more detail, after the formation of the vertical structures VS, the mold structures 120 may be patterned to form trenches, which are spaced apart from the vertical structures VS and have a line shape. As a result of the formation of the trenches, side surfaces of the insulating and sacrificial layers ILD and SL of the mold structures 120 may be exposed.

Next, the sacrificial layers SL exposed through the trenches may be removed to form gate regions between the insulating layers ILD. The gate regions may be formed by isotropically etching the sacrificial layers SL using an etch recipe, which is selected to have an etch selectivity with respect to the insulating layers ILD, the vertical structures VS, and the horizontal semiconductor layer 100. For example, in the case where the sacrificial layers SL are silicon nitride layers and the insulating layers ILD are silicon oxide layers, the etching step may be performed through an isotropic etching process, in which etching solution including phosphoric acid is used.

Next, the electrodes EL may be formed in the gate regions. The electrodes EL may be formed to partially or completely fill the gate regions. Each of the electrodes EL may include a barrier metal layer and a metal layer, which are sequentially deposited. As a result of the formation of the electrodes EL, the stack ST may be formed on each of the mat regions MTR of the horizontal semiconductor layer 100, and the stack ST may have a stairstep structure on an edge portion of each of the mat regions MTR.

Referring to FIGS. 4A, 21A, 21B, 22A, and 22B, the horizontal patterns 100a and 100b, which are spaced apart from each other, may be formed on each of the mat regions MTR (in S80).

Figure 21A:
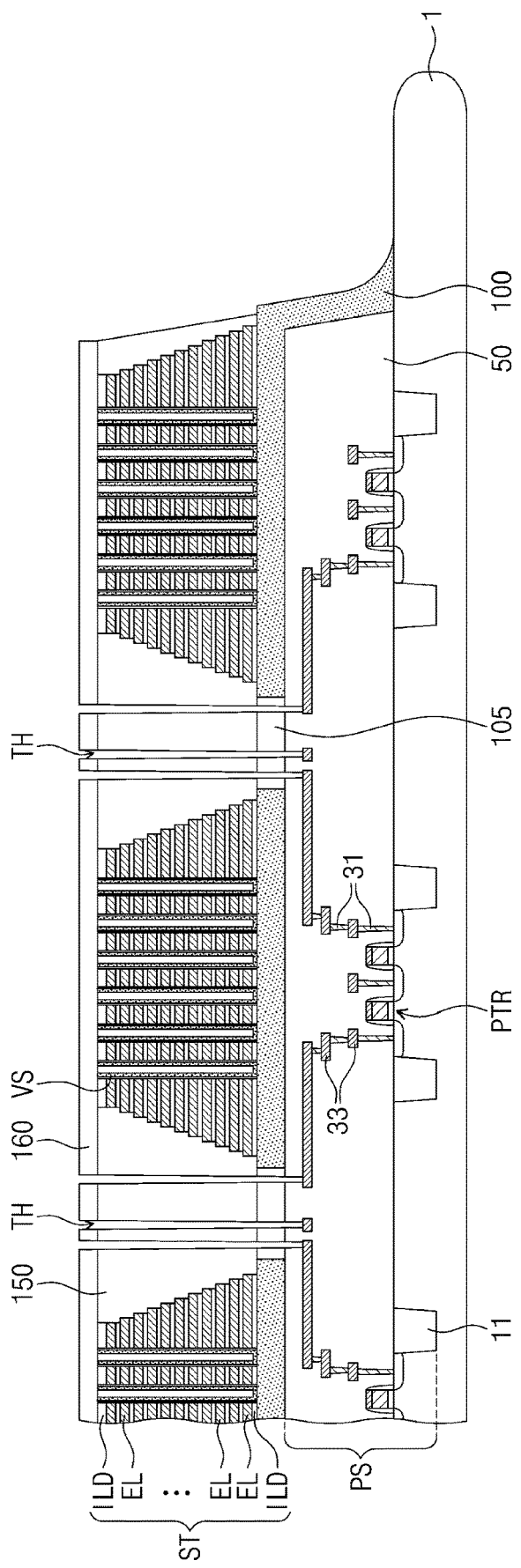
Figure 21B:
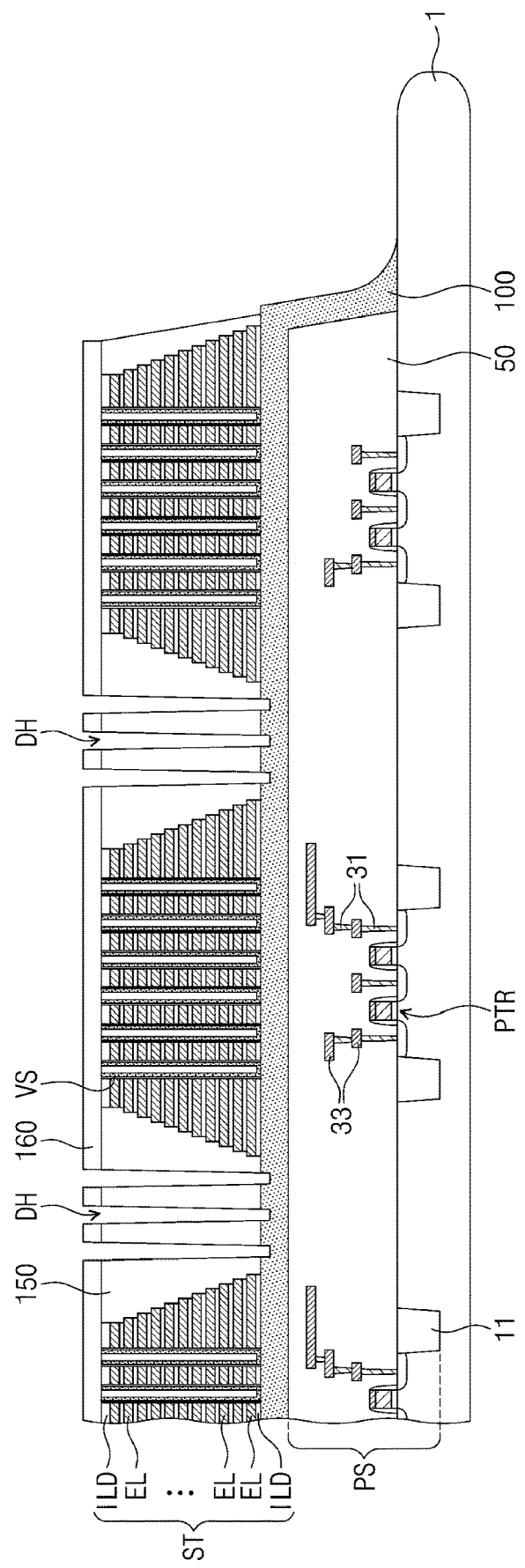

In detail, referring to FIGS. 21A and 21B, the first interlayer insulating layer 160 may be formed to cover the stacks ST and the upper insulating gapfill layer 150. Penetration holes TH may be formed between adjacent ones of the stacks ST to penetrate the first interlayer insulating layer 160, the upper insulating gapfill layer 150 and the penetrating insulating pattern 105 and to expose the peripheral circuit wires 33.

During the formation of the penetration holes TH, dummy holes DH may be formed in the dummy region DR, which is provided between adjacent ones of the mat regions MTR and between adjacent ones of the through hole regions THR. Widths of the dummy holes DH may be smaller than or equal to widths of the penetration holes TH. The dummy holes DH may be formed to be spaced apart from each other in the first and second directions D1 and D2.

The penetration holes TH and the dummy holes DH may be formed by anisotropically etching the first interlayer insulating layer 160, the upper insulating gapfill layer 150, the penetrating insulating pattern 105, and the lower insulating gapfill layer 50. The penetration holes TH may be formed concurrently with the dummy holes DH using the same etching mask. When the penetration holes TH are formed concurrently with the dummy holes DH, a portion of the horizontal semiconductor layer 100 may be left on the dummy region DR, and in this case, the horizontal semiconductor layer 100 on the dummy region DR may serve as an etch stop layer. Thus, the dummy holes DH may expose the horizontal semiconductor layer 100.

Figure 22B:
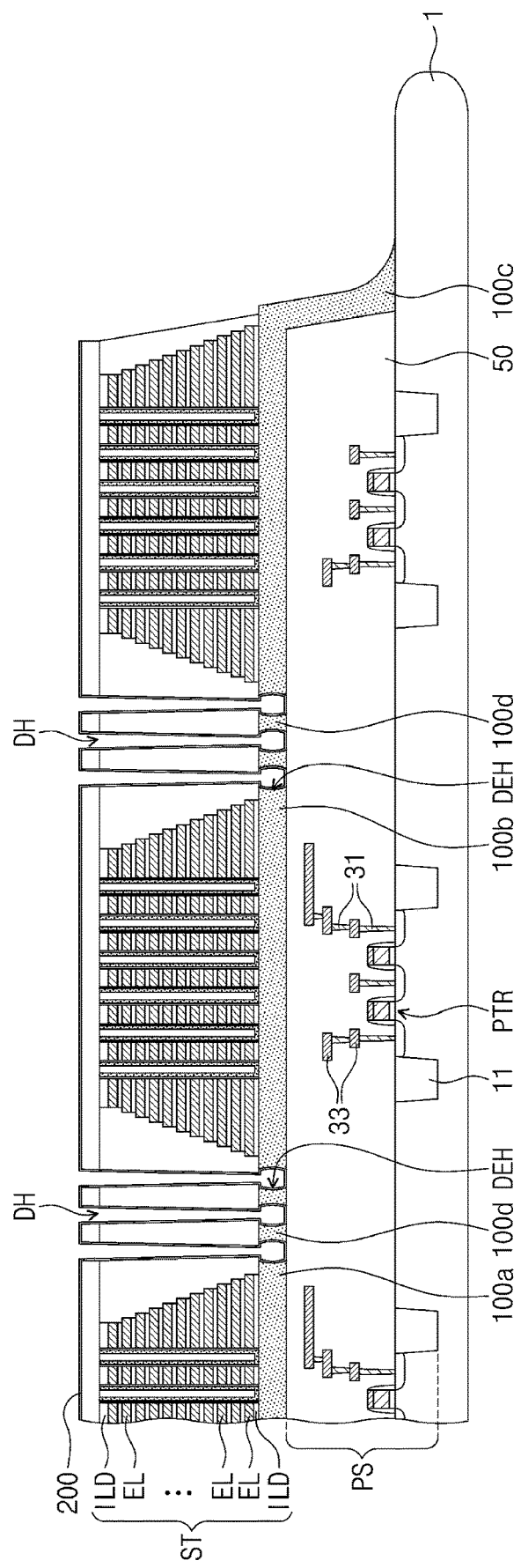

Referring to FIGS. 22A and 22B, after the formation of the penetration holes TH and the dummy holes DH, an isotropic etching process may be performed on portions of the horizontal semiconductor layer 100 that is exposed through the dummy holes DH. Accordingly, lower portions of the dummy holes DH may be expanded to form expanded dummy holes DEH in the dummy region DR. Each expanded dummy hole DEH extend between and expose neighboring ones of the penetrating insulating patterns 105 (e.g., extending between and exposing penetrating insulating patterns 105 that are adjacent to each other in the second direction D2—e.g., corresponding to DITs illustrated in FIG. 5A). A distance between the dummy holes DH in the first direction D1 may be larger than a distance between the dummy holes DH in the second direction D2. In this example, the expanded dummy hole DEH may connect neighboring dummy holes DH arranged in the second direction D2 but may not connect neighboring dummy holes arranged in the first direction D1 (e.g., corresponding to the DITs shown in FIG. 5A). In other examples, the expanded dummy hole DEH may connect both neighboring dummy holes DH arranged in the first direction D1 and neighboring dummy holes DH arranged in the second direction D2 (e.g., corresponding to the DITs shown in FIG. 10A).

The process of etching the horizontal semiconductor layer 100 may be performed using a chemical-physical etching method (e.g., reactive ion etching (RIE)), a wet etching method using an etchant, a chemical pyrolysis etching method (e.g., gas-phase etching (GPE)), and combinations of these methods.

The expanded dummy holes DEH may be formed by isotropically etching the horizontal semiconductor layer 100 until the penetrating insulating pattern 105 is exposed in the dummy region DR. Accordingly, the horizontal semiconductor layer 100 may be divided into plurality of the horizontal patterns 100a and 100b. For example, the horizontal pattern 100a or 100b may be formed on each mat region MTR. When the expanded dummy holes DEH are formed, portions of the horizontal semiconductor layer 100 may be left between adjacent ones of the expanded dummy holes DEH to form the dummy horizontal patterns 100d.

Next, a spacer layer 200 may be formed on inner surfaces of the penetration holes TH and the expanded dummy holes DEH. The spacer layer 200 may conformally cover side and bottom surfaces of the penetration holes TH and the expanded dummy holes DEH. The spacer layer 200 may cover top surfaces of the peripheral circuit wires 33 exposed by the penetration holes TH and surfaces of the horizontal patterns 100a and 100b exposed by the expanded dummy holes DEH.

Figure 23A:
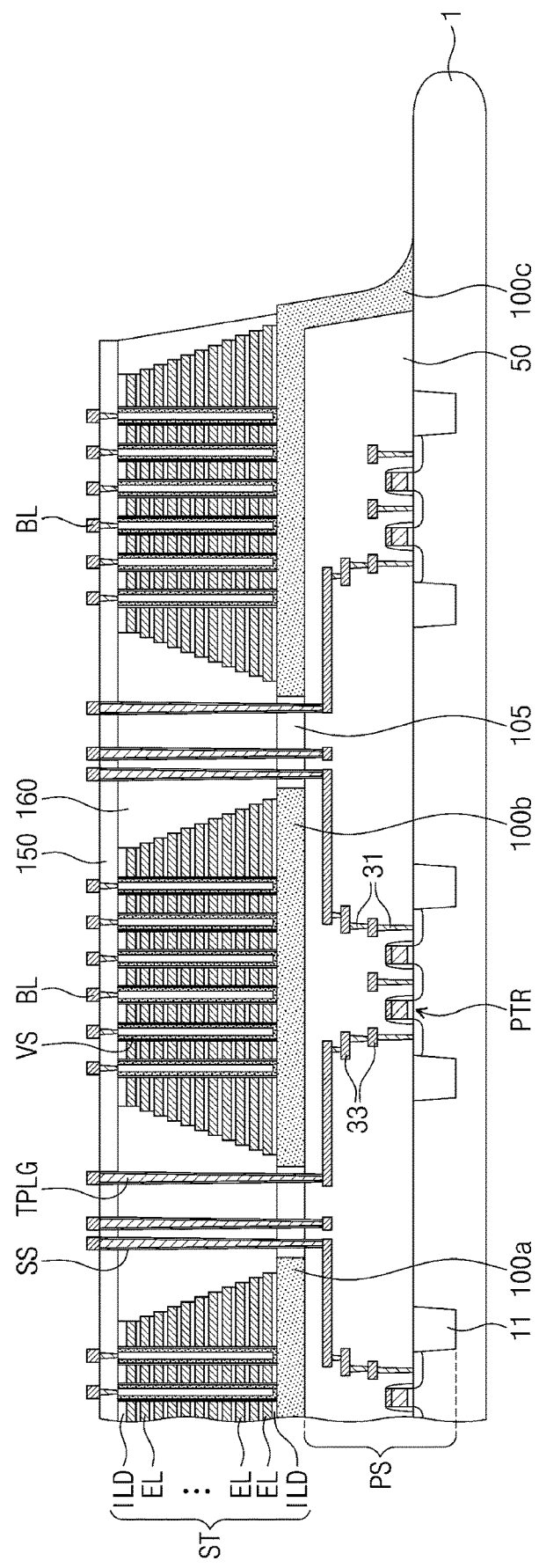
Figure 23B:
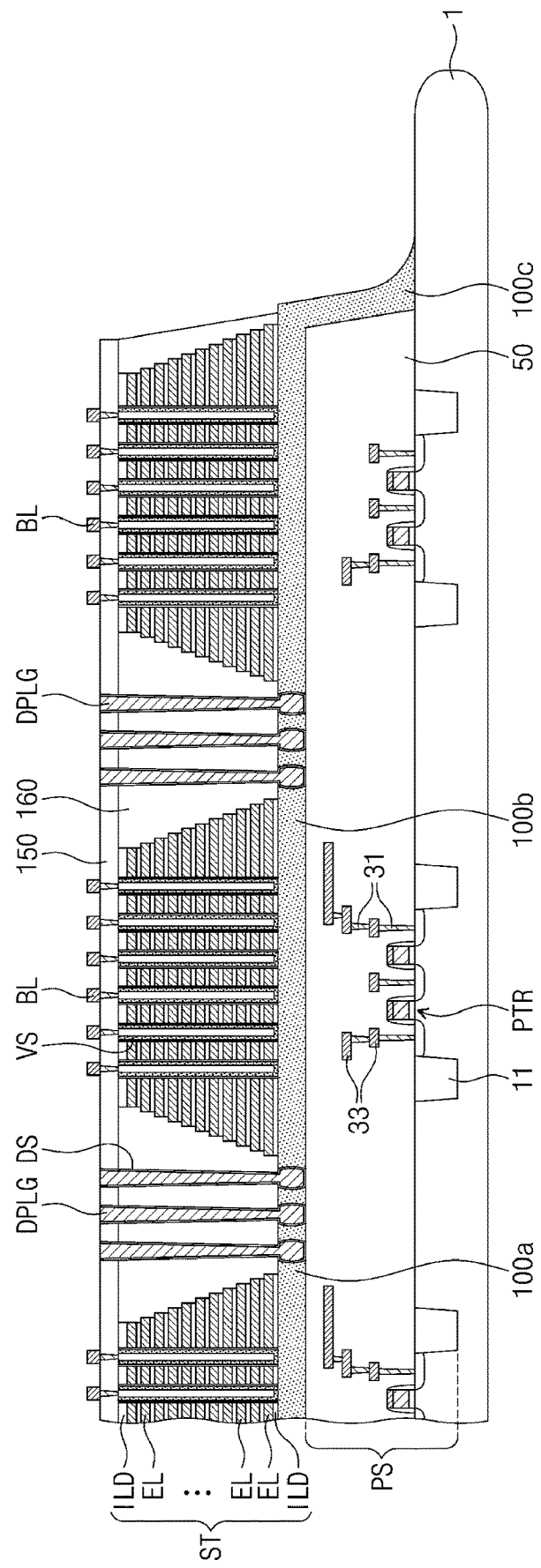

Next, referring to FIGS. 4A, 23A, and 23B, an anisotropic etching process may be performed on the spacer layer 200 to form the sidewall spacers SS, which cover the side surfaces of the penetration holes TH and expose the peripheral circuit wires 33.

When the sidewall spacers SS are formed, the dummy spacers DS may be formed in the expanded dummy holes DEH. The sidewall spacer SS may be formed concurrently with the dummy spacers DS (e.g., patterned from the same spacer layer 200). In some examples, the dummy spacer DS may be formed by etching the spacer layer 200 at the bottom of the expanded dummy hole DEH to expose a portion of the lower insulating gapfill layer 50 at the bottom of the expanded dummy hole DEH (not shown in FIG. 23B).

Next, referring to FIGS. 4A and 23A, the through vias TVS may be formed between adjacent ones of the mat regions MTR in the through hole region THR (in S90).

In detail, a conductive material may be formed to fill the penetration holes TH, in which the sidewall spacers SS are formed, and the dummy holes DH and the expanded dummy holes DEH, in which the dummy spacers DS are formed. Thus, the through plugs TPLG may be formed in the penetration holes TH, in which the sidewall spacers SS are formed, and the dummy plugs DPLG may be formed in the dummy holes DH and the expanded dummy holes DEH. The through plugs TPLG may be connected to the peripheral circuit wires 33, and the dummy plugs DPLG may be surrounded by the dummy spacer DS. The dummy plugs DPLG may be left unconnected to peripheral logic circuits (an unconnected to any wiring in the peripheral circuit structure PS). In some examples, the dummy plugs DPLG may be electrically floating. In other examples, the dummy plugs DPLG may be connected to a voltage source (e.g., a reference voltage source such as ground or a bias voltage source, such as Vbb or Vcc).

Next, the bit lines BL and the connection lines CL described above may be formed on the first interlayer insulating layer 160. Thereafter, the semiconductor substrate 1 may be cut along the scribe line region 20 (e.g., see FIG. 1) using a cutting or sawing machine, and thus, the three-dimensional semiconductor devices formed on the semiconductor substrate 1 may be divided into a plurality of semiconductor chips (e.g., each semiconductor chip corresponding to a semiconductor device cut from a chip region 10).

According to an embodiment of the inventive concept, a horizontal semiconductor layer including a plurality of mat regions is formed of a single layer during fabrication processes, in which a high frequency power is used, and can be grounded. Thus, in the processes of fabricating three-dimensional semiconductor memory devices using high frequency power, it may be possible to prevent an arcing phenomenon, which is caused by positive charges accumulated in the horizontal semiconductor layer.

The single horizontal semiconductor layer may be divided into a plurality of horizontal patterns, which correspond to the mat regions, after the high frequency power processes. In other words, the horizontal patterns may be provided in the mat regions, respectively. Furthermore, the horizontal patterns may be electrically and physically separated from each other (e.g., to form separated mat regions MTR) by penetrating insulating patterns and a separation structure. Accordingly, operations of a three-dimensional semiconductor device (such as one including NAND flash memory cells) may be independently performed (e.g., independent and concurrent memory accesses to mats MT at each of the mat regions MTR) at each of the separated horizontal patterns.

While example embodiments of the inventive concepts have been particularly shown and described, it will be understood by one of ordinary skill in the art that variations in form and detail may be made therein without departing from the spirit and scope of the invention.

What is claimed is:

1. A three-dimensional semiconductor memory device, comprising:
    horizontal patterns disposed on a peripheral circuit structure and spaced apart from each other in a first direction parallel to a top surface of a substrate;
    memory structures provided on the horizontal patterns, respectively, each of the memory structures comprising memory cells, which are three-dimensionally arranged;
    penetrating insulating patterns, each being provided between adjacent ones of the horizontal patterns and being spaced apart from each other in a second direction crossing the first direction, each penetrating insulating pattern abutting side surfaces of the adjacent horizontal patterns;
    through plugs extending through a corresponding penetrating insulating pattern to electrically connect the memory structures to the peripheral circuit structure; and
    first and second separation structures disposed between the horizontal patterns, spaced apart from each other in the first direction and extending between the penetrating insulating patterns in the second direction and connected to adjacent ones of the penetrating insulating patterns,
    wherein the horizontal patterns are portions of a first material layer,
    wherein each of the penetrating insulating patterns penetrates the first material layer and have opposite borders that extend between side surfaces of the horizontal patterns and that are defined, at least in part, by the first material layer, and
    wherein the three-dimensional semiconductor memory device comprises a dummy horizontal pattern, which is disposed between the penetrating insulating patterns and between the first and second separation structures.

2. The device of claim 1, wherein, when measured in the first direction, a width of each of the first and second separation structures is larger than widths of the through plugs.

3. The device of claim 1, wherein each of the first and second separation structures comprises:
    a dummy plug disposed between the horizontal patterns, the dummy plug comprising a horizontal portion extending in the second direction and a vertical portion extending from the horizontal portion in a third direction perpendicular to the first and second directions; and
    a dummy spacer interposed between the dummy plug and the horizontal patterns.

4. The device of claim 3, wherein the dummy spacer is formed of a material different from the dummy plug.

5. The device of claim 3, wherein the dummy plug is electrically floating.

6. A three-dimensional semiconductor memory device, comprising:
    a peripheral circuit structure on a substrate;
    horizontal semiconductor patterns disposed on the peripheral circuit structure, the horizontal semiconductor patterns spaced apart from each other in a first direction parallel to a top surface of the substrate;

penetrating insulating patterns provided adjacent to corresponding ones of the horizontal semiconductor patterns, the penetrating insulating patterns spaced apart from each other in a second direction crossing the first direction between the horizontal semiconductor patterns, each of the penetrating insulating patterns connected to the horizontal semiconductor patterns in the first direction; and separation structures vertically extending higher than top surfaces of the horizontal semiconductor patterns, the separation structures disposed between the penetrating insulating patterns and between the horizontal semiconductor patterns, each of the separation structures are spaced apart from each other in the first direction and connected to corresponding penetrating insulating patterns in the second direction, wherein, when viewed in a plan view, each of the horizontal semiconductor patterns is isolated by corresponding ones of the penetrating insulating patterns and the separation structures such that the horizontal semiconductor patterns are separated from each other, and wherein each penetrating insulating pattern is in contact with a side surface of at least one corresponding one of the horizontal semiconductor patterns.

7. The device of claim 6, wherein each of the horizontal semiconductor patterns has a first width in a first horizontal direction extending between a pair of the penetrating insulating patterns on opposite sides of the horizontal semiconductor pattern and has a second width, which is larger than the first width, in the first horizontal direction extending between a pair of the separation structures on the opposite sides of the corresponding horizontal semiconductor pattern.

8. The device of claim 6,
wherein the device further comprises through plugs, which penetrate corresponding ones of the penetrating insulating patterns to connect to the peripheral circuit structure, and
wherein at least some of the separation structures comprise an insulator, which is in contact with a corresponding pair of adjacent ones of the penetrating insulating patterns and a corresponding horizontal semiconductor pattern.

9. The device of claim 6, further comprising metal plate patterns in contact with bottom surfaces of corresponding ones of the horizontal semiconductor patterns,
wherein at least some of the penetrating insulating patterns are in contact with a side surface of a corresponding horizontal semiconductor pattern and a side surface of a corresponding metal plate pattern.

10. The device of claim 9, wherein at least some of the separation structures comprises a dummy spacer, which is in contact with corresponding adjacent ones of the penetrating insulating patterns, a side surface of a corresponding horizontal semiconductor pattern, and a side surface of a corresponding metal plate pattern.

11. The device of claim 6,
wherein the horizontal semiconductor patterns each comprises first and second horizontal semiconductor sub-patterns, which are sequentially stacked on the peripheral circuit structure,
wherein each penetrating insulating pattern is in contact with side surfaces of corresponding first and second horizontal semiconductor sub-patterns, and
wherein the device further comprises through plugs, which penetrate corresponding ones of the penetrating insulating patterns to connect to the peripheral circuit structure.

12. The device of claim 11, wherein each separation structure comprises vertical portions that extend in a direction perpendicular to a top surface of the horizontal semiconductor patterns, and a horizontal portion extending horizontally to connect the vertical portions of the corresponding separation structure.

13. The device of claim 6, further comprising:
a stack of electrodes on each of the horizontal semiconductor patterns, each stack having a staircase structure in-on an edge region of the corresponding horizontal semiconductor pattern on which it is stacked; and
vertical structures penetrating the stacks,
wherein the penetrating insulating patterns and the separation structures are disposed between the staircase structures of corresponding adjacent ones of the stacks.

14. A three-dimensional semiconductor memory device, comprising:
a peripheral circuit structure comprising a substrate and peripheral logic circuits formed with the substrate;
horizontal patterns disposed on the peripheral circuit structure and spaced apart from each other in a first direction;
memory structures provided on the horizontal patterns, respectively, each of the memory structures comprising memory cells, which are three-dimensionally arranged;
a separation structure disposed between adjacent ones of the horizontal patterns;
first and second penetrating insulating patterns provided between and contacting side surfaces of adjacent ones of the horizontal patterns; and
through plugs, which penetrate the first and second penetrating insulating patterns to operatively connect the memory structures to the peripheral circuit structure,
wherein the separation structure comprises:
a dummy plug disposed between the horizontal patterns; and
a dummy spacer interposed between the dummy plug and the horizontal patterns,
wherein the dummy plug comprises a horizontal portion extending in a second direction and a vertical portion extending from the horizontal portion in a third direction perpendicular to the first and second directions,
wherein a width of the horizontal portion in the first direction is at least 1.5 larger than a width of the vertical portion in the first direction,
wherein the separation structure extends between and contacts the first and second penetrating insulating patterns, and
wherein a bottom surface of the separation structure is positioned at a level higher than bottom surfaces of the through plugs.

15. The device of claim 14, wherein a top surface of the separation structure and the top surfaces of the through plugs are positioned at the same level.

16. The device of claim 14, wherein each of the memory structures comprises:
a stack including electrodes, which are vertically stacked on a corresponding horizontal pattern, and having a staircase structure is-on an edge region of the corresponding the horizontal pattern; and
vertical structures penetrating the stack,
wherein the separation structure is disposed between the staircase structures of adjacent ones of the stacks.

17. The device of claim 14, wherein each of the memory structures comprises:
a stack including electrodes, which are vertically stacked on a corresponding horizontal pattern, and having a staircase structure is-on an edge region of the corresponding the horizontal pattern;
vertical structures penetrating the stack; and
a planarized insulating layer provided on the corresponding horizontal pattern to cover the staircase structure of the stack,
wherein the dummy plug penetrates the planarized insulating layer.

18. The device of claim 14,
wherein the dummy plug and the through plugs are made from the same conductive material.

\* \* \* \* \*